(12) United States Patent
Hatakeyama et al.

(10) Patent No.: US 9,250,523 B2
(45) Date of Patent: *Feb. 2, 2016

(54) RESIST COMPOSITION AND PATTERNING PROCESS

(71) Applicant: SHIN-ETSU CHEMICAL CO., LTD., Tokyo (JP)

(72) Inventors: Jun Hatakeyama, Joetsu (JP); Kenji Funatsu, Joetsu (JP); Kazuhiro Katayama, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/012,441

(22) Filed: Aug. 28, 2013

(65) Prior Publication Data

US 2014/0065544 A1 Mar. 6, 2014

(30) Foreign Application Priority Data

Sep. 5, 2012 (JP) .................. 2012-194741

(51) Int. Cl.
| | | |
|---|---|---|
| G03F 7/039 | (2006.01) | |
| G03F 7/004 | (2006.01) | |
| G03F 7/20 | (2006.01) | |
| G03F 7/30 | (2006.01) | |
| G03F 7/11 | (2006.01) | |

(52) U.S. Cl.
CPC ............ G03F 7/0397 (2013.01); G03F 7/0045 (2013.01); G03F 7/0046 (2013.01); G03F 7/0392 (2013.01); G03F 7/11 (2013.01); G03F 7/20 (2013.01); G03F 7/2041 (2013.01); G03F 7/30 (2013.01)

(58) Field of Classification Search
None
See application file for complete search history.

(56) References Cited

U.S. PATENT DOCUMENTS

| | | | |
|---|---|---|---|
| 6,448,420 B1 | 9/2002 | Kinsho et al. | |
| 6,746,817 B2 | 6/2004 | Takeda et al. | |
| 7,537,880 B2 | 5/2009 | Harada et al. | |
| 7,598,016 B2 | 10/2009 | Kobayashi et al. | |
| 2006/0147836 A1* | 7/2006 | Hatakeyama et al. | 430/270.1 |
| 2008/0090172 A1 | 4/2008 | Hatakeyama et al. | |
| 2008/0102407 A1* | 5/2008 | Ohsawa et al. | 430/286.1 |
| 2012/0202150 A1* | 8/2012 | Sakakibara et al. | 430/270.1 |

FOREIGN PATENT DOCUMENTS

| | | |
|---|---|---|
| EP | 0 473 547 A1 | 3/1992 |
| JP | 4-230645 A | 8/1992 |
| JP | 3429592 B2 | 7/2003 |
| JP | 2005-084365 A | 3/2005 |
| JP | 2006-045311 A | 2/2006 |
| JP | 2006-169302 A | 6/2006 |
| JP | 2006-178317 A | 7/2006 |
| JP | 3865048 B2 | 1/2007 |
| JP | 2008-239918 A | 10/2008 |
| JP | 4771974 B2 | 9/2011 |
| JP | 4900603 B2 | 3/2012 |

* cited by examiner

*Primary Examiner* — Sin Lee
(74) *Attorney, Agent, or Firm* — Westerman, Hattori, Daniels & Adrian, LLP

(57) ABSTRACT

A polymer capable of increasing alkali solubility under the action of acid, as a base resin is blended with a copolymer comprising recurring units derived from acenaphthylene, indene, benzofuran or benzothiophene and fluorine-containing recurring units, as a polymeric additive to formulate a resist composition. The photoresist film formed using the resist composition is effective for minimizing outgassing therefrom during the EUV lithography. The resist film has a hydrophilic surface and is effective for suppressing formation of blob defects after development.

9 Claims, No Drawings

RESIST COMPOSITION AND PATTERNING PROCESS

CROSS-REFERENCE TO RELATED APPLICATION

This non-provisional application claims priority under 35 U.S.C. §119(a) on Patent Application No. 2012-194741 filed in Japan on Sep. 5, 2012, the entire contents of which are hereby incorporated by reference.

TECHNICAL FIELD

This invention relates to a resist composition, especially chemically amplified positive resist composition, comprising a polymer comprising recurring units having an acid labile group in blend with a copolymer comprising recurring units derived from a monomer selected from acenaphthylene, indene, benzofuran, and benzothiophene and recurring units having fluorine, and a patterning process using the same.

BACKGROUND ART

To meet the demand for higher integration density and operating speed of LSIs, the effort to reduce the pattern rule is in rapid progress. The wide-spreading flash memory market and the demand for increased storage capacities drive forward the miniaturization technology. As the advanced miniaturization technology, manufacturing of microelectronic devices at the 65-nm node by the ArF lithography has been implemented in a mass scale. Manufacturing of 45-nm node devices by the next generation ArF immersion lithography is approaching to the verge of high-volume application. The candidates for the next generation 32-nm node include ultra-high NA lens immersion lithography using a liquid having a higher refractive index than water in combination with a high refractive index lens and a high refractive index resist film, extreme ultraviolet (EUV) lithography of 13.5 nm wavelength, and double patterning version of the ArF lithography, on which active research efforts have been made.

With respect to high-energy radiation of very short wavelength such as electron beam (EB) or x-ray, hydrocarbons and similar light elements used in resist materials have little absorption. Then polyhydroxystyrene base resist materials are under consideration. Resist materials for EB lithography are practically used in the mask image writing application. Recently, the mask manufacturing technology becomes of greater interest. Reduction projection exposure systems or steppers have been used since the time when the exposure light was g-line. While their demagnification factor was ⅕, a factor of ¼ is now used as a result of chip size enlargement and projection lens diameter increase. It becomes of concern that a dimensional error of a mask has an impact on the dimensional variation of a pattern on wafer. It is pointed out that as the pattern feature is reduced, the value of a dimensional variation on the wafer becomes greater than the value of a dimensional error of the mask. This is evaluated by a mask error enhancement factor (MEEF) which is a dimensional variation on wafer divided by a dimensional error of mask. Patterns on the order of 45 nm often show an MEEF in excess of 4. In a situation including a demagnification factor of ¼ and a MEEF of 4, the mask manufacture needs an accuracy substantially equivalent to that for equi-magnification masks.

The exposure system for mask manufacturing made a transition from the laser beam exposure system to the EB exposure system to increase the accuracy of line width. Since a further size reduction becomes possible by increasing the accelerating voltage of the electron gun in the EB exposure system, the accelerating voltage increased from 10 keV to 30 keV and reached 50 keV in the current mainstream system, with a voltage of 100 keV being under investigation.

As the accelerating voltage increases, a lowering of sensitivity of resist film becomes of concern. As the accelerating voltage increases, the influence of forward scattering in a resist film becomes so reduced that the contrast of electron image writing energy is improved to ameliorate resolution and dimensional control whereas electrons can pass straightforward through the resist film so that the resist film becomes less sensitive. Since the mask exposure tool is designed for exposure by direct continuous writing, a lowering of sensitivity of resist film leads to an undesirably reduced throughput. Due to a need for higher sensitivity, chemically amplified resist compositions are contemplated.

Thinning of resist film is in progress to facilitate reduction of pattern feature in the EB lithography for mask manufacturing and to prevent the pattern from collapsing due to a higher aspect ratio during development. In the case of photolithography, a thinning of resist film greatly contributes to resolution improvement. This is because introduction of chemical mechanical polishing (CMP) or the like has driven forward device planarization. In the case of mask manufacture, substrates are flat, and the thickness of processable substrates (e.g., Cr, MoSi or $SiO_2$) is predetermined by a percent light shield or phase shift control. The dry etch resistance of resist film must be improved before the film can be reduced in thickness.

It is generally believed that there is a correlation between the carbon density and the dry etch resistance of resist film. For EB writing which is not affected by absorption, resist materials based on novolac resins having better etch resistance have been developed. Indene copolymers described in Patent Document 1 and acenaphthylene copolymers described in Patent Document 2 are expected to have improved etch resistance due to a high carbon density and a robust main chain structure based on cycloolefin structure.

Also, with respect to the soft x-ray (EUV) lithography at wavelength 5-20 nm, the reduced absorption of carbon atoms was reported. Increasing the carbon density is effective not only for improving dry etch resistance, but also for increasing the transmittance in the soft x-ray wavelength region.

As the feature size is reduced, image blurs due to acid diffusion become a problem. To insure resolution for fine patterns with a size of 45 nm et seq., not only an improvement in dissolution contrast is requisite, but control of acid diffusion is also important, as known from previous reports. Since chemically amplified resist compositions are designed such that sensitivity and contrast are enhanced by acid diffusion, an attempt to minimize acid diffusion by reducing the temperature and/or time of post-exposure baking (PEB) fails, resulting in drastic reductions of sensitivity and contrast. Since the distance of acid diffusion is closely related to the type of acid labile group, it would be desirable to have an acid labile group which permits deprotection reaction to proceed at a very short distance of acid diffusion.

A tradeoff among sensitivity, edge roughness and resolution is reported. Increasing sensitivity leads to reductions of edge roughness and resolution. Controlling acid diffusion improves resolution at the sacrifice of edge roughness and sensitivity. Addition of an acid generator capable of generating a bulky acid is effective for suppressing acid diffusion, but leads to reductions of edge roughness and sensitivity as pointed out above. It is then proposed to copolymerize a polymer with an acid generator in the form of an onium salt having polymerizable olefin. Patent Documents 3 to 5 disclose sulfonium salts having polymerizable olefin capable of generating a sulfonic acid and similar iodonium salts. A photoresist using a base polymer having a polymerizable acid generator copolymerized therein exhibits reduced edge roughness due to controlled acid diffusion and uniform dispersion of acid generator within the polymer, succeeding in improving both resolution and edge roughness at the same time.

One problem in the EUV lithography is that outgassing components from a resist film during exposure adsorb to the surface of a reflecting mirror and mask in the exposure tool to reduce their reflectivity. It is proposed to form a protective film atop the resist film for the purpose of reducing the outgassing. Then, a coater cup is necessary for coating of the protective film. At the early stage of the immersion lithography, a protective film was applied in order to prevent the acid generator from being leached out of the resist film into water. However, the provision of a protective film brings about a drop of throughput and a rise of material cost. Because of these problems, the protective film is gradually going out of use. Under the circumstances, it would be desirable to have a resist material for the EUV lithography which can eliminate or reduce outgassing without the aid of protective film.

Patent Documents 6 and 7 disclose resist materials wherein a copolymer of a styrene derivative and a recurring unit having fluorine or a copolymer of vinylnaphthalene and a recurring unit having fluorine is added to a base polymer. When these resist materials are spin coated, the polymer having styrene units or vinylnaphthalene units segregates in a surface layer of the coating, achieving both water-repellent and anti-reflection effects. The patent documents also refer to the suppression of outgassing in the EUV lithography. However, the styrene and vinylnaphthalene units achieve insufficient suppression of outgassing. There exists a desire to have a resist surface modifying material capable of effectively shutting off outgassing.

CITATION LIST

Patent Document 1: JP 3865048
Patent Document 2: JP-A 2006-169302
Patent Document 3: JP-A H04-230645
Patent Document 4: JP-A 2005-084365
Patent Document 5: JP-A 2006-045311
Patent Document 6: JP 4771974
Patent Document 7: JP 4900603

DISCLOSURE OF INVENTION

An object of the present invention is to provide a resist composition which can minimize outgassing from a resist film and prevent formation of blob defects during the EUV lithography; and a pattern forming process using the same.

The inventors have found that a satisfactory resist composition is obtainable by adding a copolymer comprising recurring units derived from a monomer selected from acenaphthylene, indene, benzofuran, and benzothiophene, and recurring units having at least one fluorine atom to a polymer capable of increasing alkali solubility under the action of acid.

According to the invention, a fluorochemical surfactant of polymer type comprising recurring units derived from acenaphthylene or analogue is added to a polymer or base resin to formulate a resist material. When the resist material is coated, a layer of the recurring units derived from acenaphthylene or analogue is formed on the surface of the resist film. This surface layer has a high film density enough to prevent outgassing components from escaping from within the resist film. In addition, since the fluorochemical surfactant of polymer type comprising recurring units derived from acenaphthylene or analogue dissolves in an alkaline developer, it renders the resist surface after exposure and development more hydrophilic and is thus effective for suppressing formation of blob and bridge defects. By virtue of these advantages, the resist material is best suited as a mask blank resist material having long-term stability after coating and stability against exposure in vacuum and an EUV resist material featuring minimal outgassing in vacuum. A pattern forming process using the resist material is also provided.

In one aspect, the invention provides a resist composition comprising
a polymer capable of increasing alkali solubility under the action of acid, as a base resin and
a copolymer comprising recurring units derived from at least one monomer selected from the group consisting of acenaphthylene, indene, benzofuran, and benzothiophene, and recurring units having at least one fluorine atom, as a polymeric additive.

In a preferred embodiment, the copolymer comprising recurring units derived from at least one monomer selected from the group consisting of acenaphthylene, indene, benzofuran, and benzothiophene, and recurring units having at least one fluorine atom has the general formula (1).

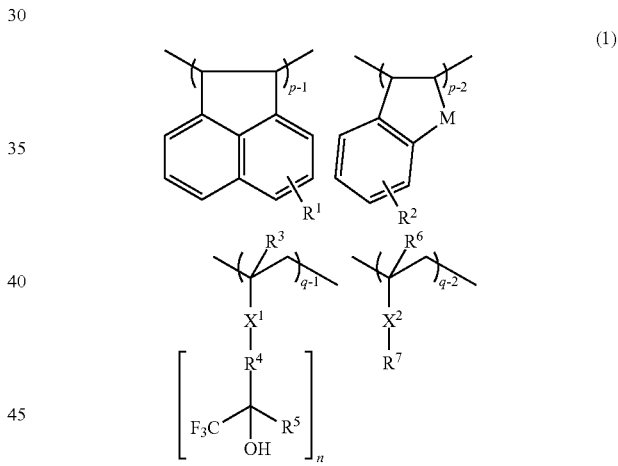

Herein $R^1$ and $R^2$ each are hydrogen, or $C_1$-$C_4$ straight or branched alkyl, alkoxy, acyloxy, hydroxyl, carboxyl, alkoxycarbonyl, or —OC(=O)R, wherein R is a $C_1$-$C_6$ straight or branched alkyl or fluoroalkyl group. $R^3$ and $R^6$ each are hydrogen or methyl. $X^2$ is a single bond, —O—, —C(=O)—O—$R^8$— or —C(=O)—NH—$R^8$—, wherein $R^8$ is a single bond or a $C_1$-$C_4$ straight or branched alkylene group which may contain an ester or ether moiety. The subscript n is 1 or 2. In case of n=1, $X^1$ is a single bond, —O—, —C(=O)—O—$R^8$— or —C(=O)—NH—$R^8$—, wherein $R^8$ is a single bond or a $C_1$-$C_4$ straight or branched alkylene group which may be substituted with fluorine and which may contain an ester or ether moiety. In case of n=2, $X^1$ is —C(=O)—O—$R^9$= or —C(=O)—NH—$R^9$=, wherein $R^9$ is a trivalent group obtained by eliminating one hydrogen from a $C_1$-$C_{10}$ straight, branched or cyclic alkylene group, which may be substituted with fluorine and which may contain an ester or ether moiety. $R^4$ is a $C_1$-$C_{12}$ straight, branched or cyclic alkylene group, phenylene group, or a combination of alkylene with phenylene, which may be substituted with fluorine and which may contain an ester or ether moiety. $R^5$ is hydrogen, fluorine, methyl, trifluoromethyl or difluoromethyl, or $R^5$ may bond with $R^4$ to form a ring which may have an ether, fluorinated alkylene or trifluoromethyl moiety. $R^7$ is a $C_1$-$C_{20}$ straight, branched or cyclic alkyl group which is substituted with at least one fluorine atom and which may contain an ether, ester or sulfonamide moiety. M is a methylene group, oxygen atom or sulfur atom. Subscripts p-1, p-2, q-1 and q-2 are numbers in the range: 0 (p-1)<1.0, 0≤(p-2)<1.0, 0<(p-1)+(p-2)<1.0, 0≤(q-1)<1.0, 0≤(q-2)<1.0, 0<(q-1)+(q-2)<1.0, and 0.5≤(p-1)+(p-2)+(q-1)+(q-2)≤1.0.

Typically, the resist composition is a chemically amplified positive resist composition.

In a preferred embodiment, the polymer serving as a base resin comprises recurring units having an acid labile group and recurring units having a hydroxyl group and/or lactone ring as an adhesive group In a more preferred embodiment, the polymer serving as a base resin comprises recurring units of at least one type selected from recurring units (a1) and (a2) having a carboxyl and/or phenolic hydroxyl group whose hydrogen atom is substituted by an acid labile group, as represented by the general formula (2), and recurring units having a phenolic hydroxyl group and/or lactone ring as an adhesive group and has a weight average molecular weight of 1,000 to 500,000.

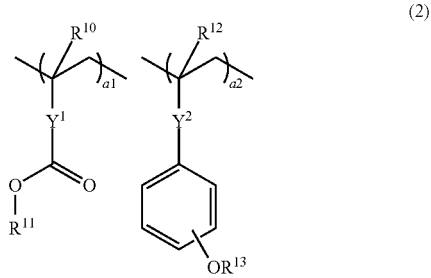

(2)

Herein $R^{10}$ and $R^{12}$ are each independently hydrogen or methyl, $R^{11}$ and $R^{13}$ each are an acid labile group, $Y^1$ is a single bond, a $C_1$-$C_{12}$ linking group having at least one of ester, lactone ring, phenylene and naphthylene, a phenylene group or a naphthylene group, $Y^2$ is a single bond, ester group or amide group, subscripts a1 and a2 are numbers in the range: 0≤a1≤0.9, 0≤a2≤0.9, and 0<a1+a2<1.0.

In a further preferred embodiment, the polymer comprising recurring units of at least one type selected from recurring units (a1) and (a2) having a carboxyl and/or phenolic hydroxyl group whose hydrogen atom is substituted by an acid labile group, represented by the general formula (2), has further copolymerized therein recurring units of at least one type selected from sulfonium salt units (b1) to (b3), as represented by the general formula (3).

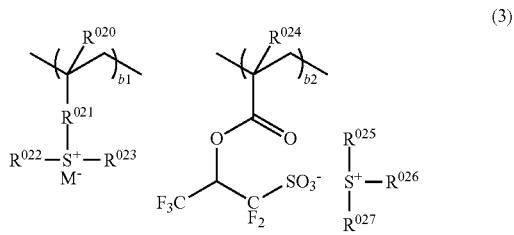

(3)

-continued

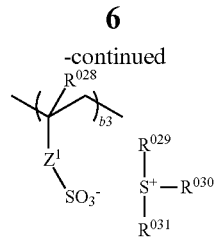

Herein $R^{020}$, $R^{024}$, and $R^{028}$ each are hydrogen or methyl, $R^{021}$ is a single bond, phenylene, —O—$R^{033}$—, or —C(=O)—Y—$R^{033}$—, Y is oxygen or NH, $R^{033}$ is a straight, branched or cyclic $C_1$-$C_6$ alkylene group, alkenylene group or phenylene group, which may contain a carbonyl (—CO—), ester (—COO—), ether (—O—), or hydroxyl moiety, $R^{022}$, $R^{023}$, $R^{025}$, $R^{026}$, $R^{027}$, $R^{029}$, $R^{030}$, and $R^{031}$ are each independently a straight, branched or cyclic $C_1$-$C_{12}$ alkyl group which may contain a carbonyl, ester or ether moiety, a $C_6$-$C_{12}$ aryl group, a $C_7$-$C_{20}$ aralkyl group, or a thiophenyl group, $Z^1$ is a single bond, methylene, ethylene, phenylene, fluorinated phenylene, —O—$R^{032}$—, or —C(=O)—$Z^2$—$R^{032}$—, $Z^2$ is oxygen or NH, $R^{032}$ is a straight, branched or cyclic $C_1$-$C_6$ alkylene group, alkenylene group or phenylene group, which may contain a carbonyl, ester, ether or hydroxyl moiety, $M^-$ is a non-nucleophilic counter ion, subscripts b1, b2 and b3 are numbers in the range: 0≤b1≤0.3, 0≤b2≤0.3, 0≤b3≤0.3, and 0<b1+b2+b3≤0.3.

The resist composition may further comprise at least one of an organic solvent, basic compound, dissolution regulator, and surfactant.

In another aspect, the invention provides a pattern forming process comprising the steps of applying the resist composition defined above onto a substrate to form a coating, baking, exposing the coating to high-energy radiation, and developing the exposed coating in a developer.

The high-energy radiation is typically KrF excimer laser of wavelength 248 nm, ArF excimer laser of wavelength 193 nm, electron beam or soft x-ray of wavelength 3 to 15 nm.

Advantageous Effects of Invention

The photoresist film formed using the resist composition of the invention is effective for minimizing the emission of outgassing components from the resist film during the EUV lithography. Since the resist film has a hydrophilic surface, it is effective for suppressing formation of blob defects after development.

DESCRIPTION OF EMBODIMENTS

The singular forms "a," "an" and "the" include plural references unless the context clearly dictates otherwise. "Optional" or "optionally" means that the subsequently described event or circumstances may or may not occur, and that description includes instances where the event or circumstance occurs and instances where it does not.

As used herein, the terminology "(meth)acrylic acid" or "(meth)acrylate" refers collectively to acrylic and methacrylic acid or acrylate and methacrylate. The terminology "$C_x$-$C_y$," as applied to a particular unit, such as, for example, a chemical compound or a chemical substituent group, means having a carbon atom content of from "x" carbon atoms to "y" carbon atoms per such unit.

The abbreviations have the following meaning.
EB: electron beam
EUV: extreme ultraviolet PAG: photoacid generator
PEB: post-exposure bake
LER: line edge roughness
LWR: line width roughness
Mw: weight average molecular weight
Mn: number average molecular weight
Mw/Mn: dispersity or average molecular weight distribution
GPC: gel permeation chromatography Making efforts to overcome the outstanding problems, the inventors have found that a resist composition obtained by blending an ordinary base polymer which turns alkali soluble under the action of acid with a copolymer comprising recurring units derived from a monomer selected from among acenaphthylene, indene, benzofuran, and benzothiophene and recurring units having at least one fluorine atom is effective for suppressing the emission of outgassing components from the resist film during exposure in vacuum by the EUV lithography. Because of their robustness and high density, acenaphthylene and indene derivatives are effective for shutting off outgassing from the photoresist film. Since the copolymer has fluorine-containing recurring units copolymerized therein, it will segregate on the surface of the resist film after spin coating.

Polymeric Additive

One embodiment of the invention is a resist composition comprising a polymer capable of increasing alkali solubility under the action of acid, serving as a base resin, and a copolymer comprising recurring units derived from at least one monomer selected from among acenaphthylene, indene, benzofuran, and benzothiophene, and recurring units having at least one fluorine atom, serving as a polymeric additive. Typically, the copolymer has the general formula (1).

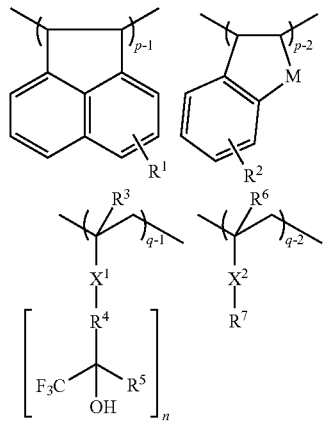

(1)

Herein $R^1$ and $R^2$ each are hydrogen, or $C_1$-$C_4$ straight or branched alkyl, alkoxy, acyloxy, hydroxyl, carboxyl, alkoxycarbonyl, or —OC(=O)R, wherein R is a $C_1$-$C_6$ straight or branched alkyl or fluoroalkyl group. $R^3$ and $R^6$ each are hydrogen or methyl. $X^2$ is a single bond, —O—, —C(=O)—O—$R^8$— or —C(=O)—NH—$R^8$—, wherein $R^8$ is a single bond or a $C_1$-$C_4$ straight or branched alkylene group which may contain an ester or ether moiety. The subscript n is 1 or 2. In case of n=1, $X^1$ is a single bond, —O—, —C(=O)—O—$R^8$— or —C(=O)—NH—$R^8$—, wherein $R^8$ is a single bond or a $C_1$-$C_4$ straight or branched alkylene group which may be substituted with fluorine and which may contain an ester or ether moiety. In case of n=2, $X^1$ is —C(=O)—O—$R^9$= or —C(=O)—NH—$R^9$=, wherein $R^9$ is a trivalent group obtained by eliminating one hydrogen from a $C_1$-$C_{10}$ straight, branched or cyclic alkylene group, which may be substituted with fluorine and which may contain an ester or ether moiety. $R^4$ is a $C_1$-$C_{12}$ straight, branched or cyclic alkylene group, phenylene group, or a combination of alkylene with phenylene, which may be substituted with fluorine and which may contain an ester or ether moiety. $R^5$ is hydrogen, fluorine, methyl, trifluoromethyl or difluoromethyl, or $R^5$ may bond with $R^4$ to form a ring which may have an ether, fluorinated alkylene or trifluoromethyl moiety. $R^7$ is a $C_1$-$C_{20}$ straight, branched or cyclic alkyl group which is substituted with at least one fluorine atom and which may contain an ether, ester or sulfonamide moiety. M is a methylene group, oxygen atom or sulfur atom, subscripts p-1, p-2, q-1 and q-2 are numbers in the range: $0 \leq (p-1) < 1.0$, $0 \leq (p-2) < 1.0$, $0 < (p-1)+(p-2) < 1.0$, $0 \leq (q-1) < 1.0$, $0 \leq (q-2) < 1.0$, $0 < (q-1)+(q-2) < 1.0$, and $0.5 \leq (p-1)+(p-2)+(q-1)+(q-2) \leq 1.0$.

The resist composition having the copolymer comprising recurring units of formula (1) added thereto is coated to form a photoresist film. The photoresist film is characterized in that a polymeric surfactant having copolymerized therein recurring units derived from at least one monomer selected from among acenaphthylene, indene, benzofuran, and benzothiophene and recurring units having a fluoroalkyl group is present on the film surface. The polymeric surfactant segregates on the photoresist film surface at the end of photoresist coating and functions to suppress the release of outgassing components from the resist film and to minimize defects in the resist pattern after development.

While the recurring units derived from at least one monomer selected from among acenaphthylene, indene, benzofuran, and benzothiophene are represented by units (p-1) and (p-2) in formula (1), examples of the monomers from which units (p-1) and (p-2) are derived are shown below, but not limited thereto.

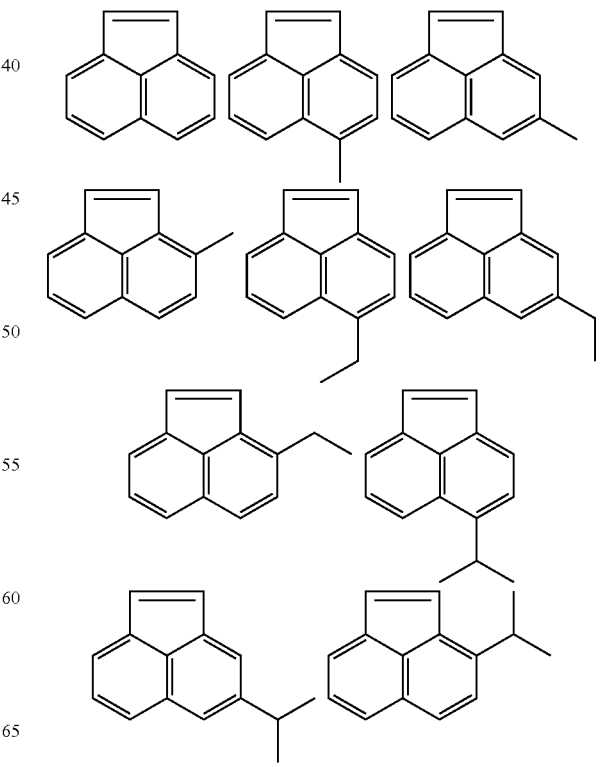

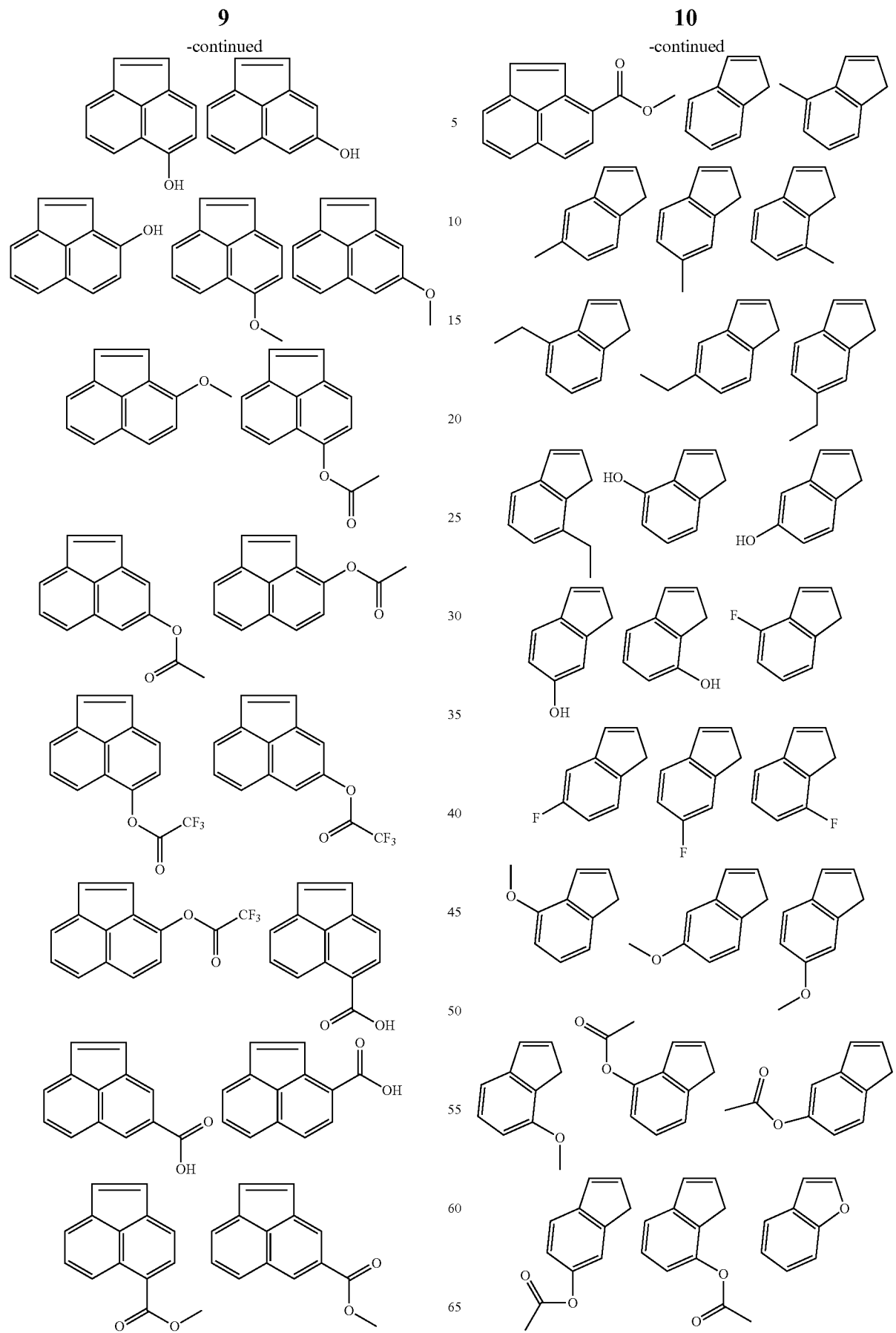

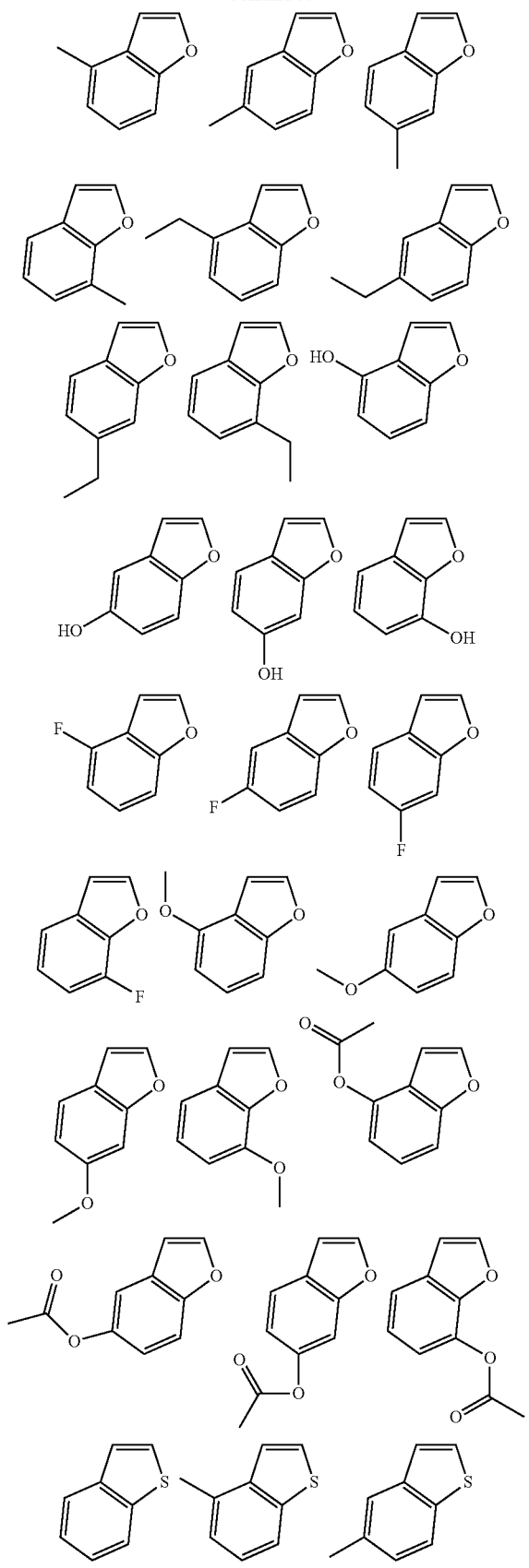
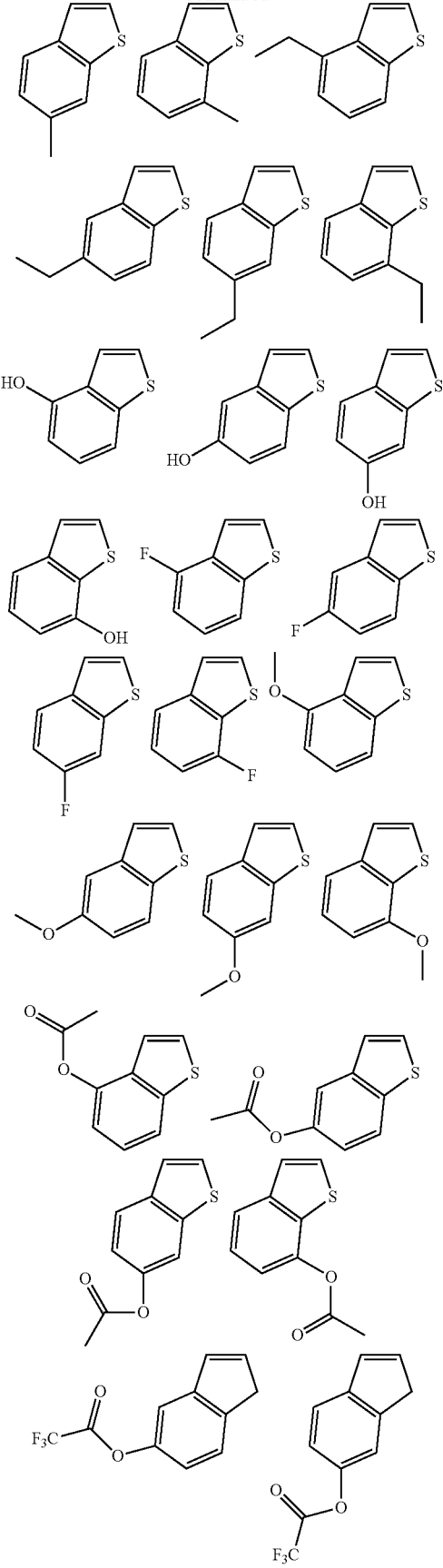

-continued

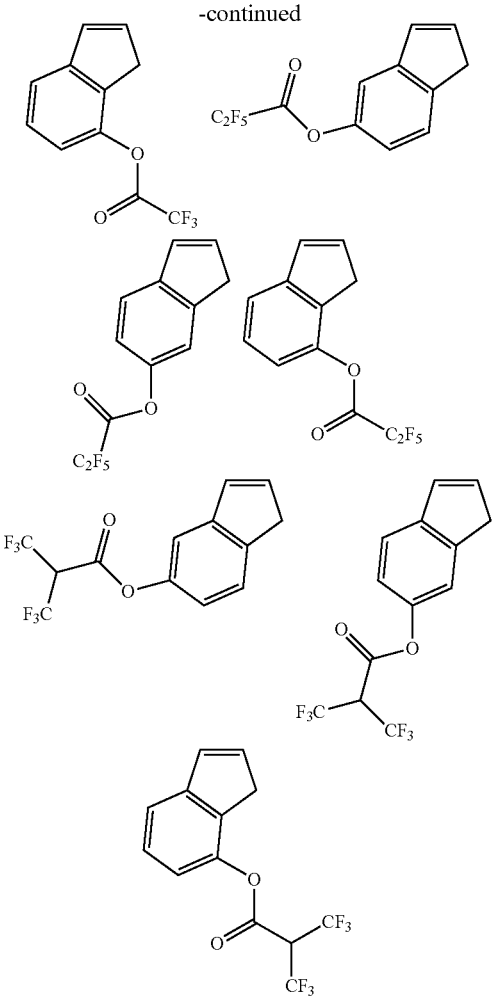

In the case of a monomer having a hydroxyl group, the hydroxyl group may be replaced by an acetyl, acetal or similar group at the monomer stage, and the polymerization be followed by deprotection reaction to restore the hydroxyl group. Where the hydroxyl group is replaced by an acetyl group, the polymerization may be followed by alkaline hydrolysis to deprotect the acetyl group into a hydroxyl group. Where the hydroxyl group is replaced by an acid labile group such as acetal, deprotection via hydrolysis with an acid catalyst may be carried out to restore a hydroxyl group.

The recurring units having fluorine are typically recurring units (q-1) having an α-trifluoromethyl alcohol group and recurring units (q-2) having a fluoroalkyl group in formula (1).

Examples of the monomer from which recurring units (q-1) having an α-trifluoromethyl alcohol group are derived are given below.

-continued

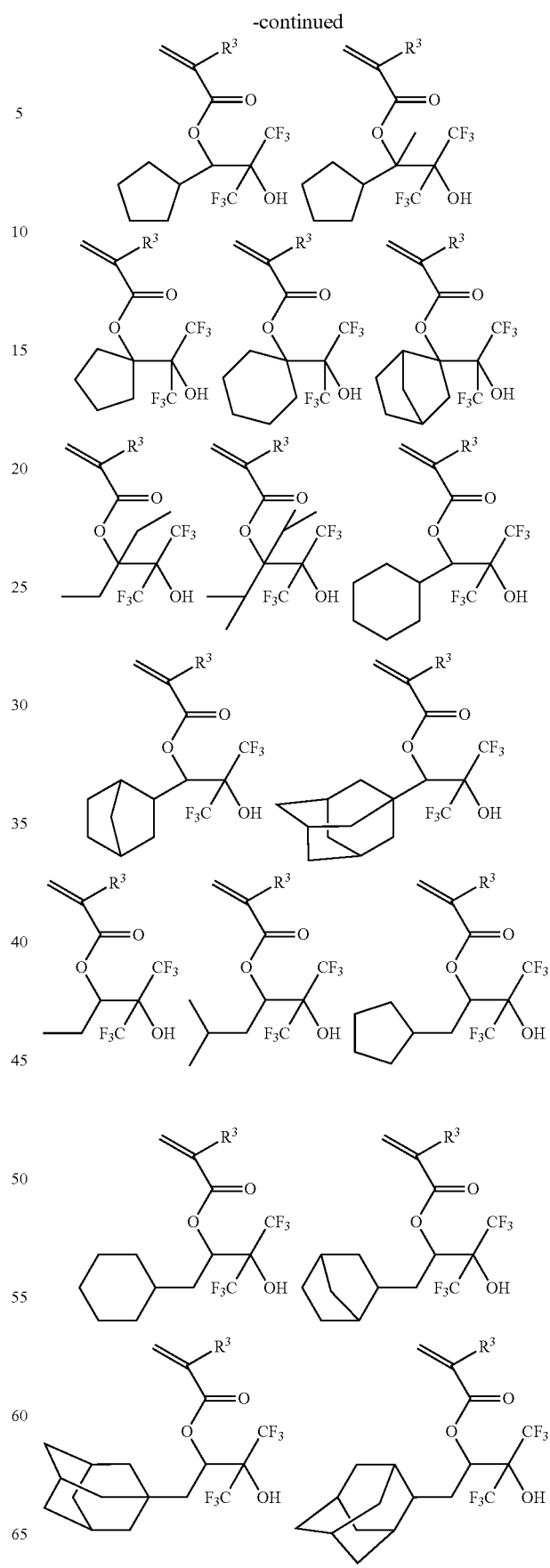

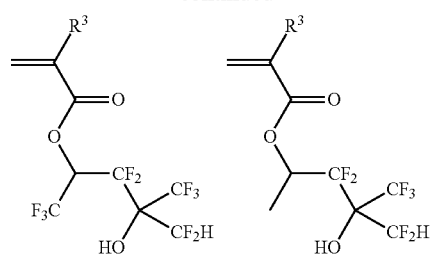
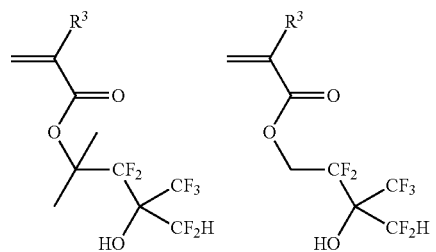
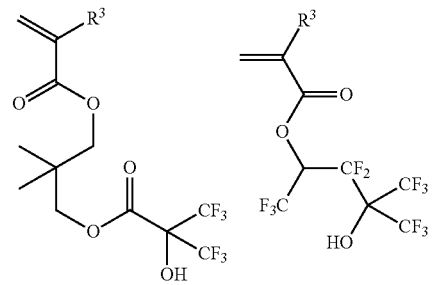
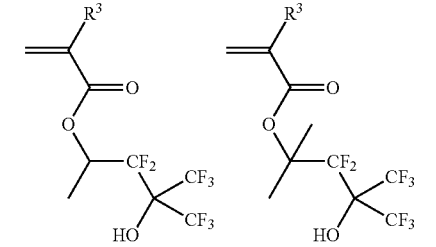
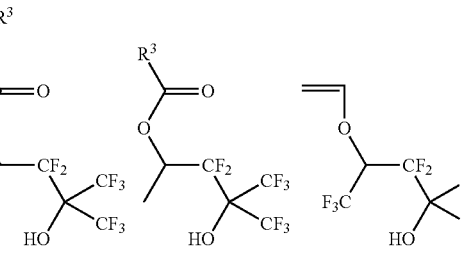
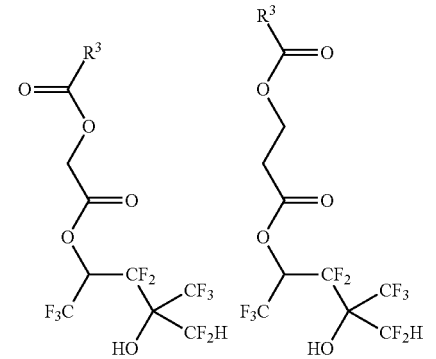
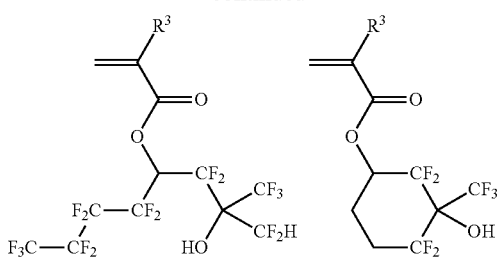
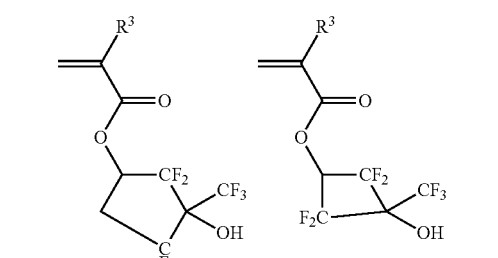
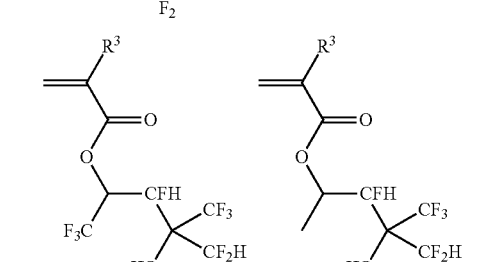
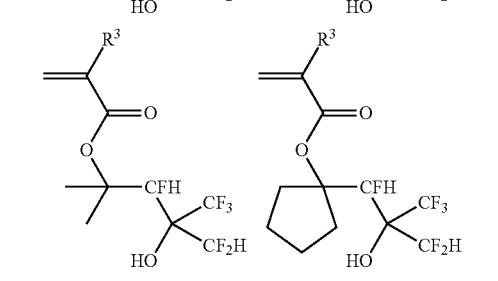
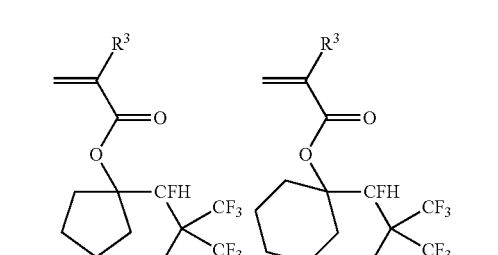
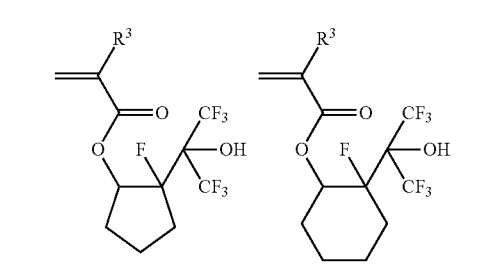

-continued
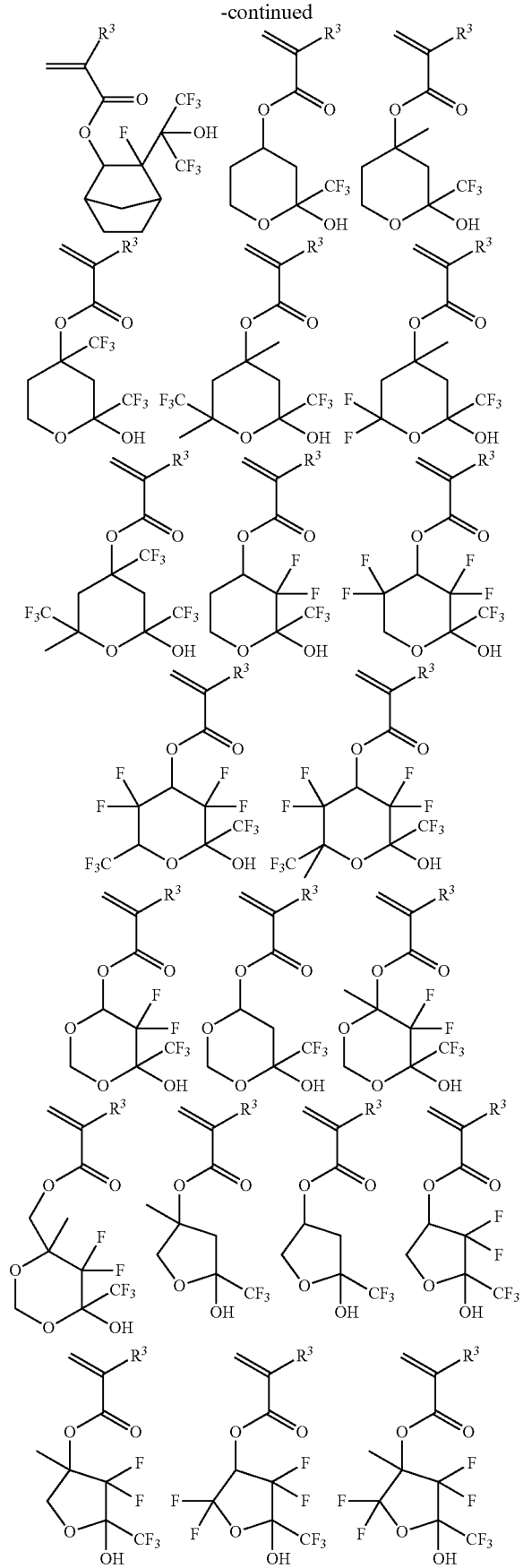
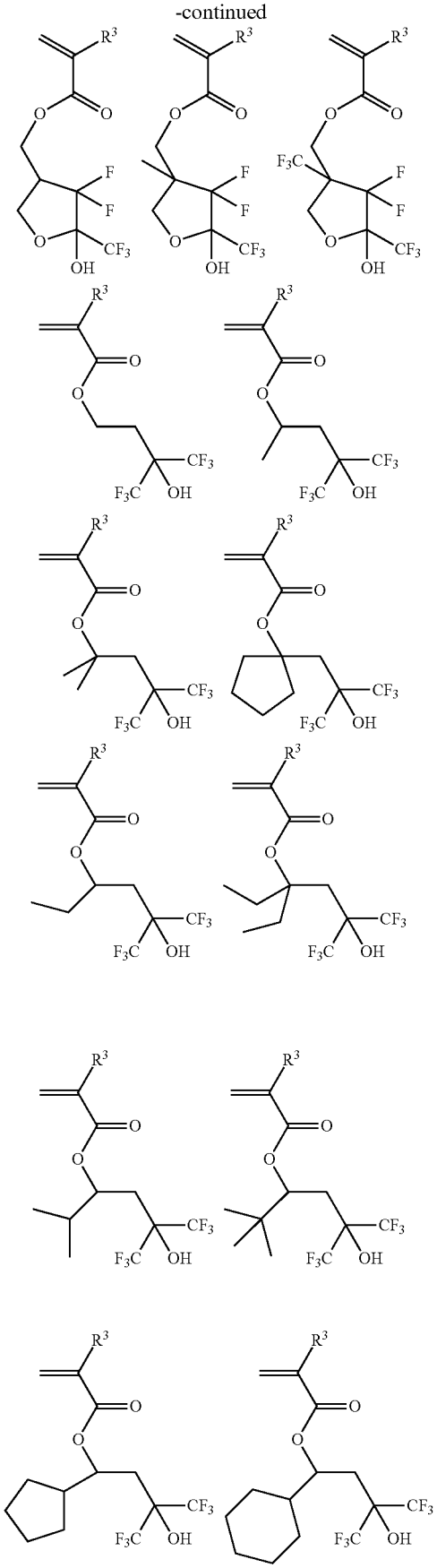

-continued
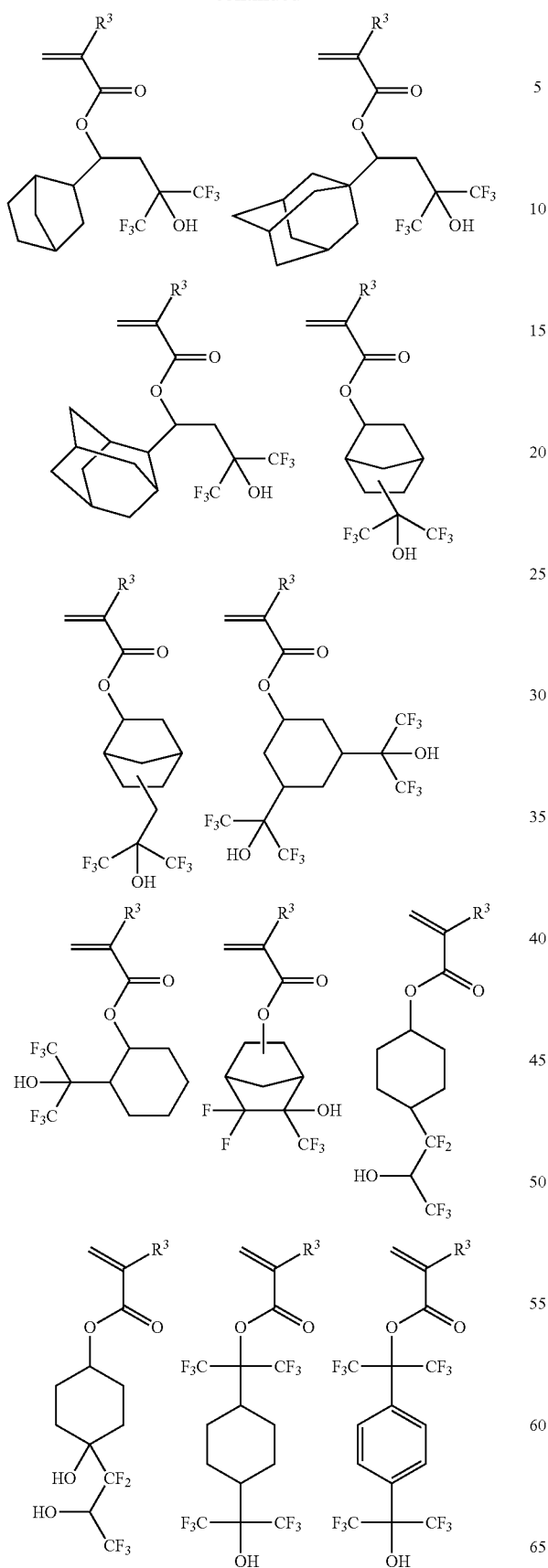
-continued
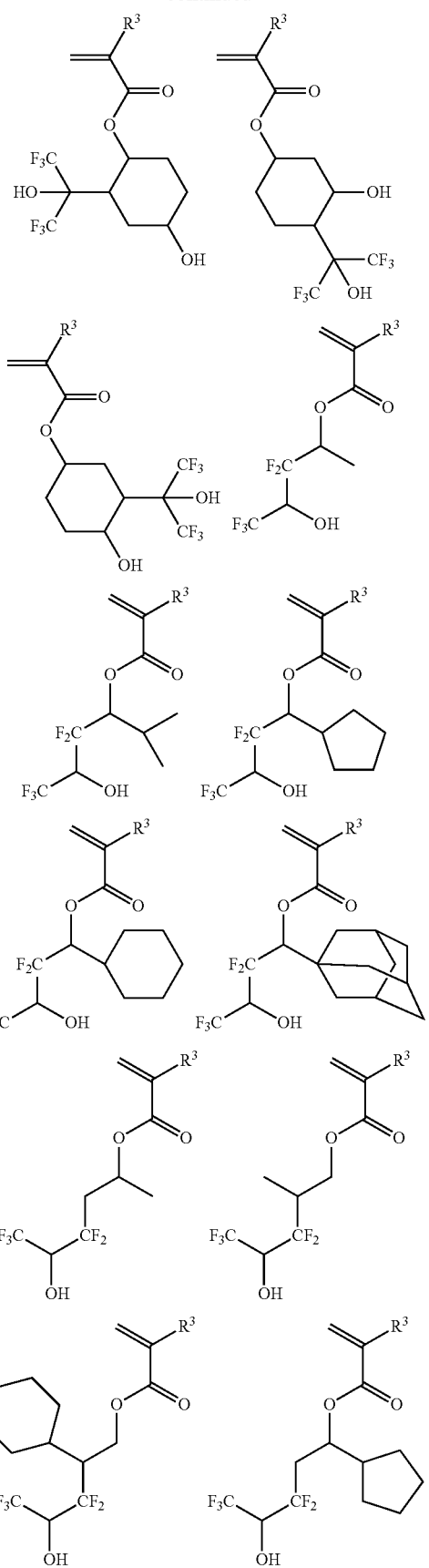

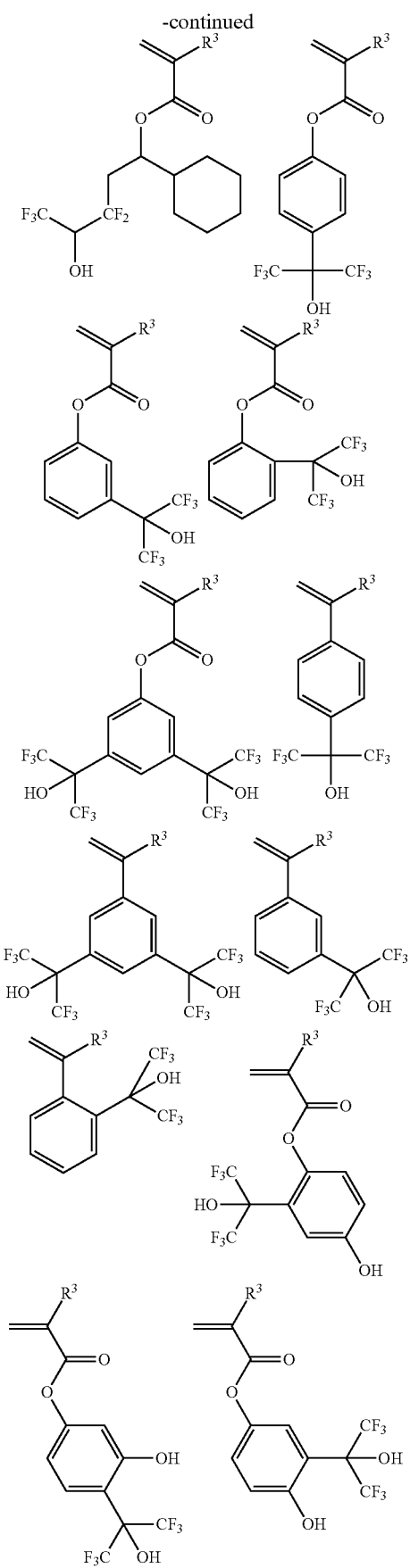
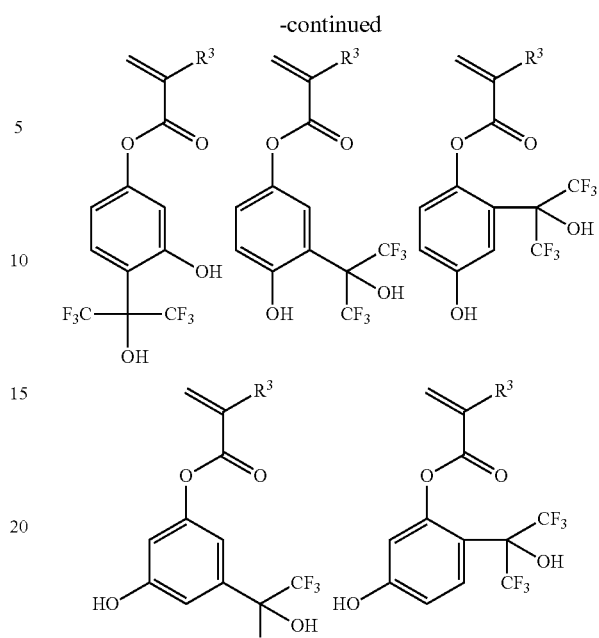
Note that $R^3$ is as defined above.
Examples of the monomer from which recurring units (q-2) having a fluoroalkyl group are derived are given below.
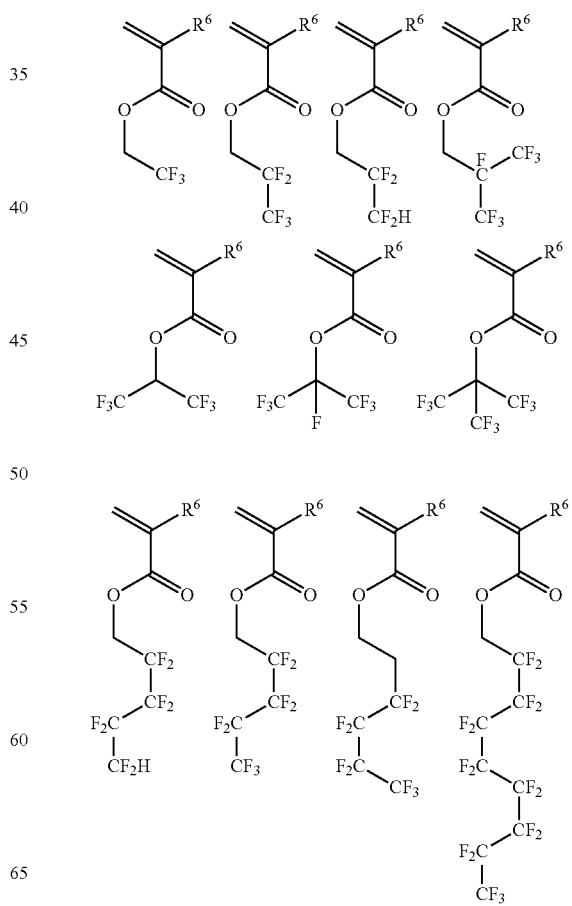

-continued
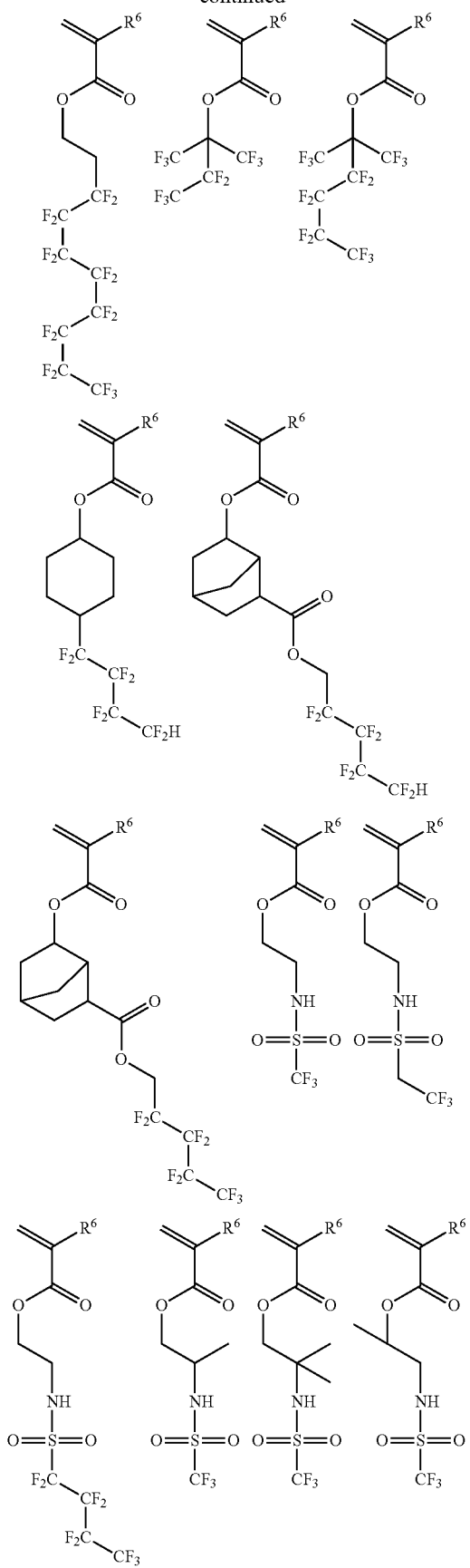
-continued
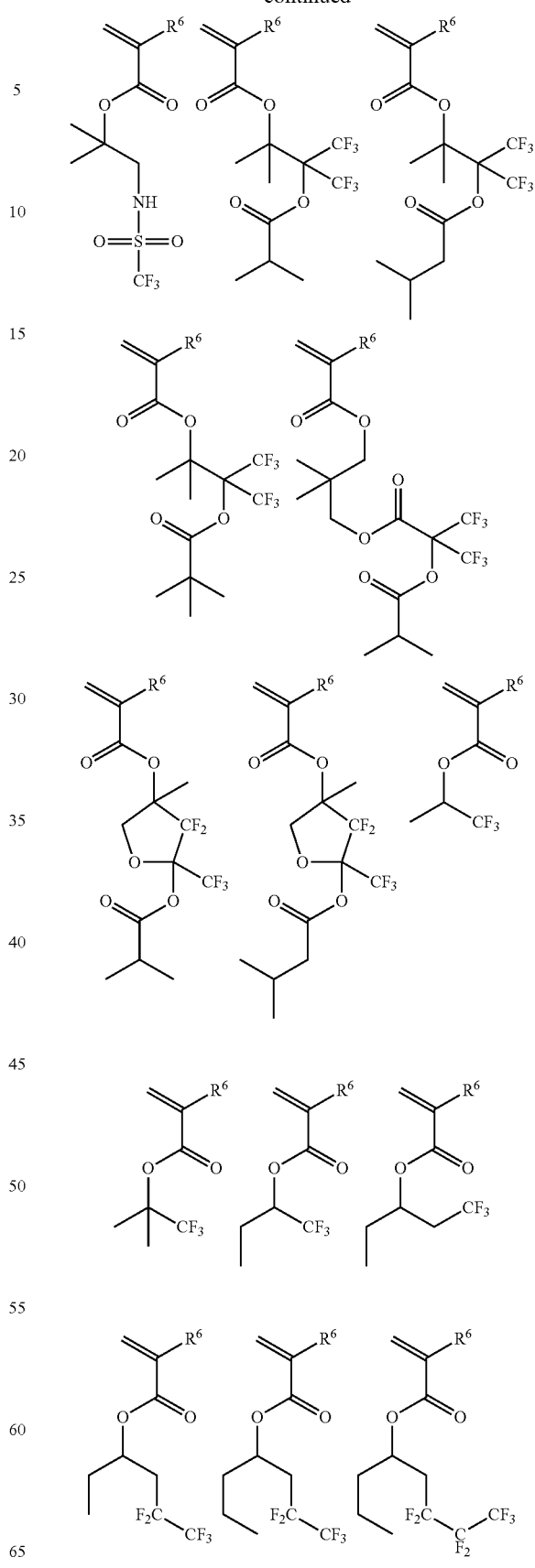

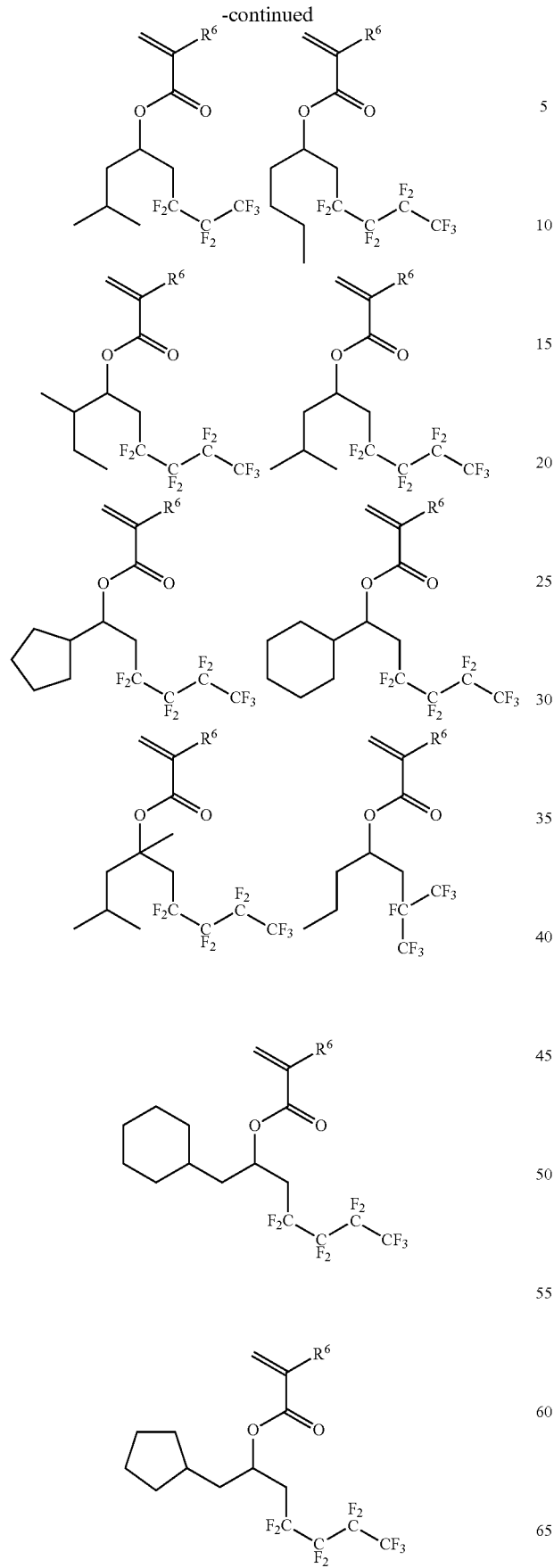
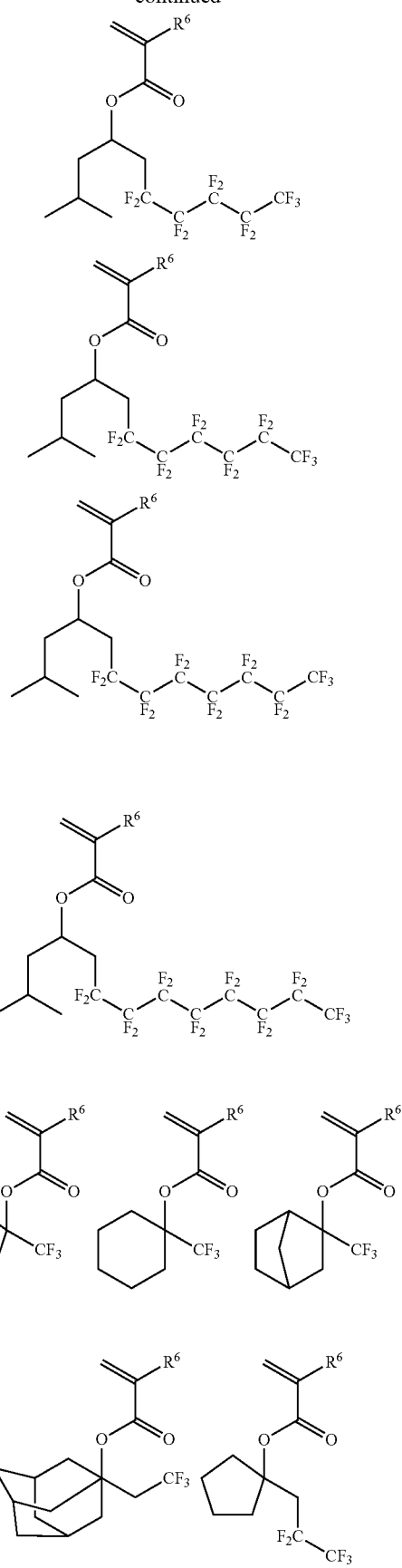

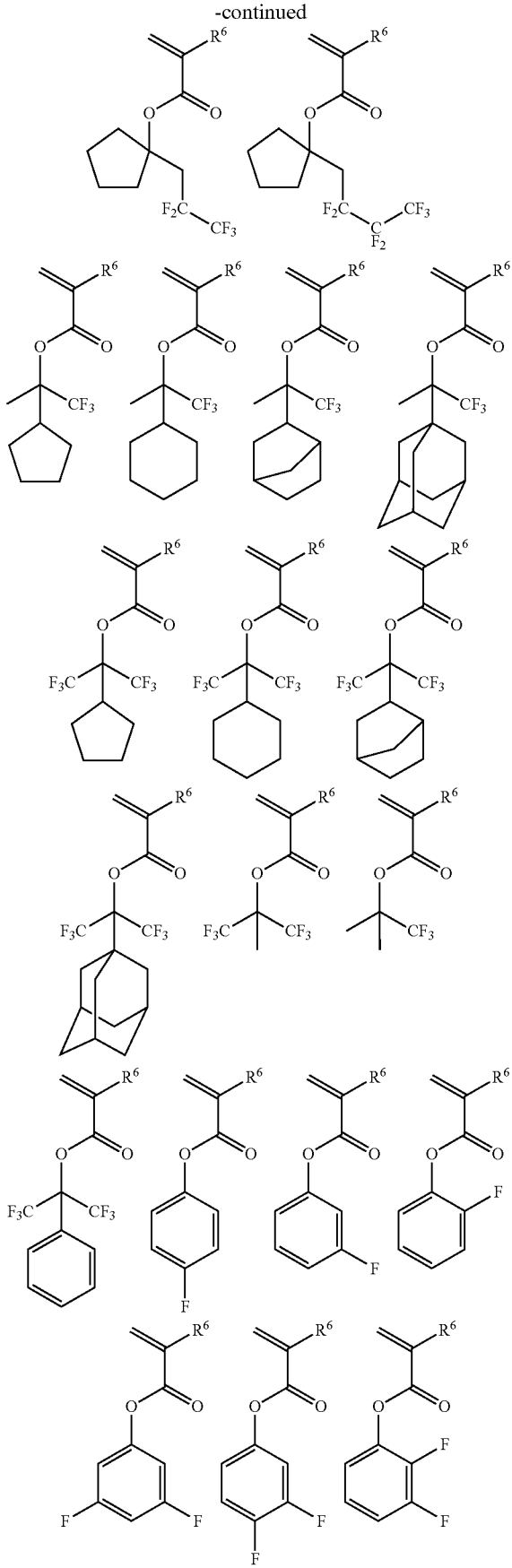
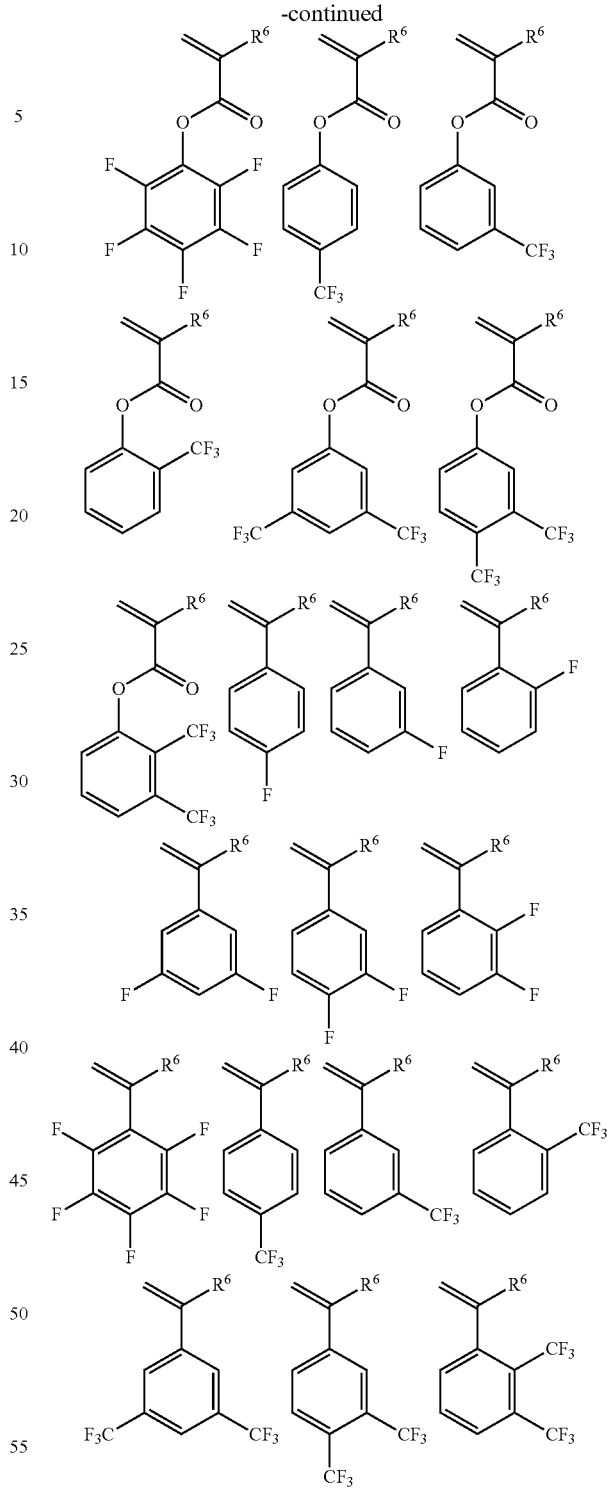

Note that $R^6$ is as defined above.

In addition to the recurring units (p-1), (p-2), (q-1) and (q-2) in formula (1), the copolymer to be added to the resist composition may have further copolymerized therein recurring units (r) having a carboxyl group for the purposes of improving alkali solubility and rendering the resist film after development more hydrophilic.

Examples of the recurring units (r) having a carboxyl group are given below.

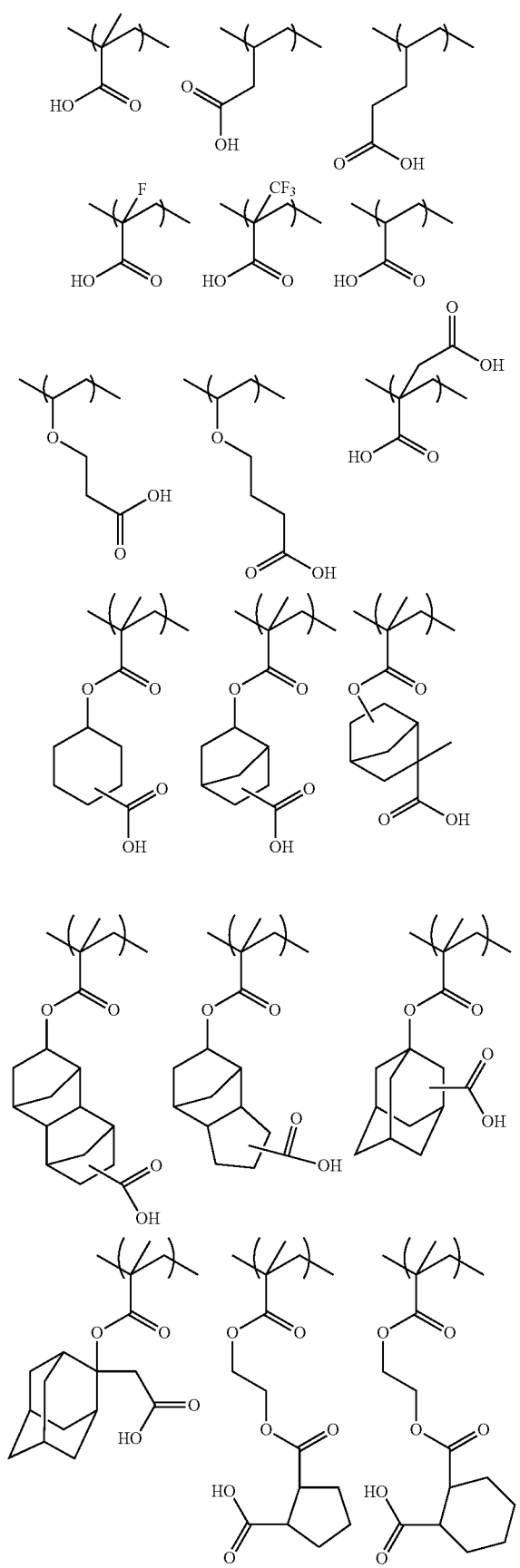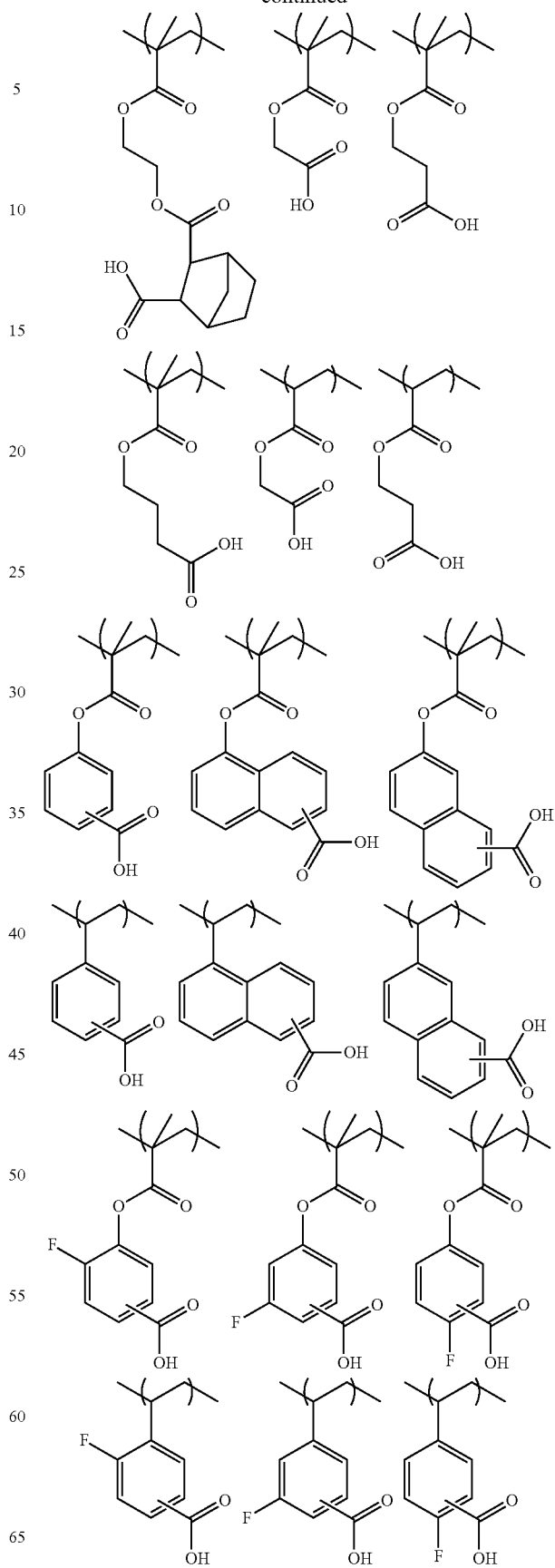
-continued

31
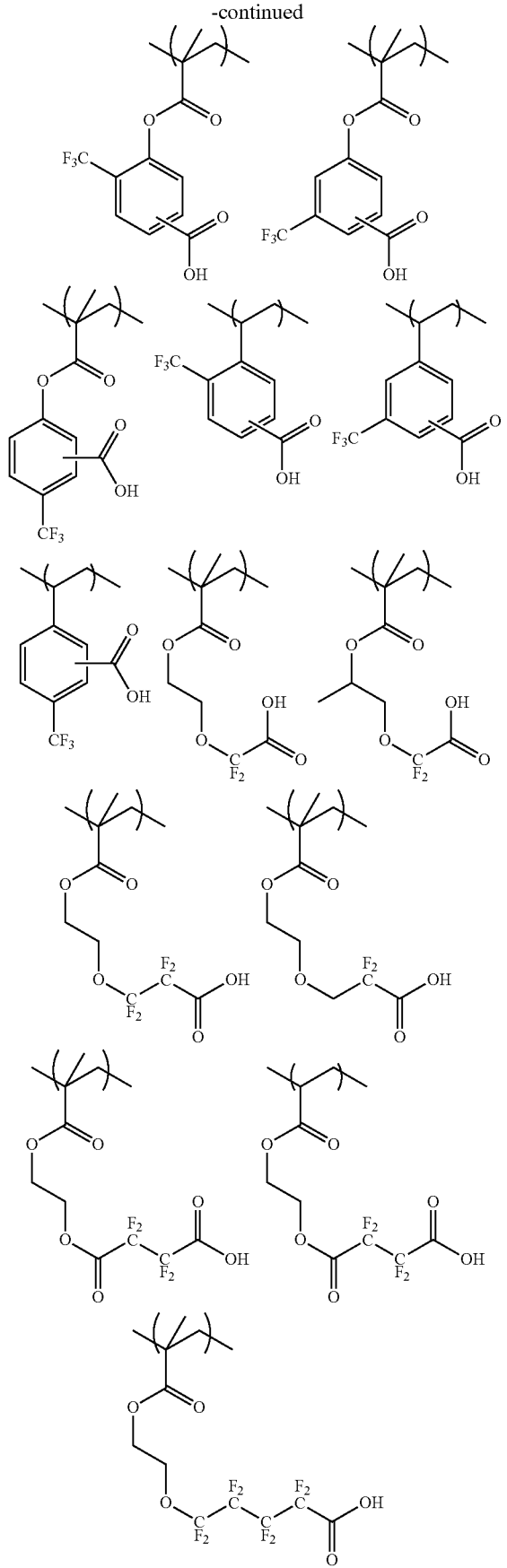
32
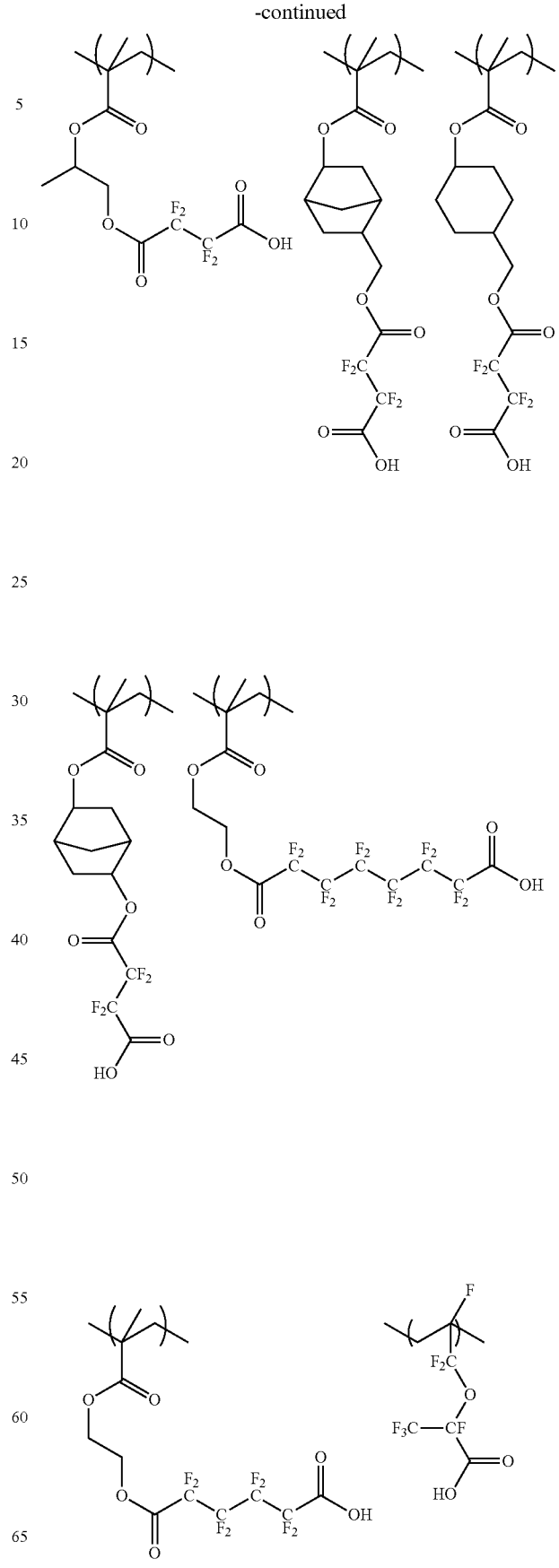

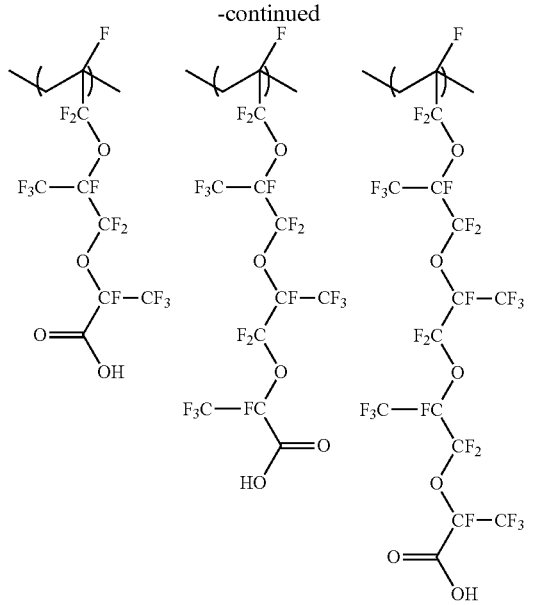

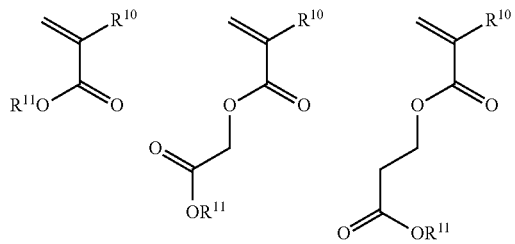

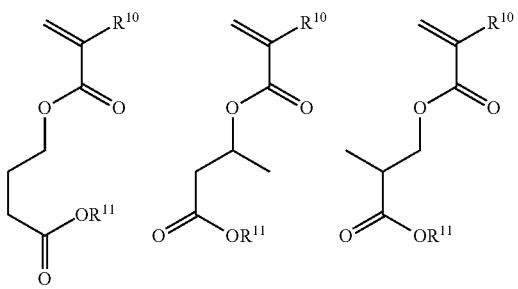

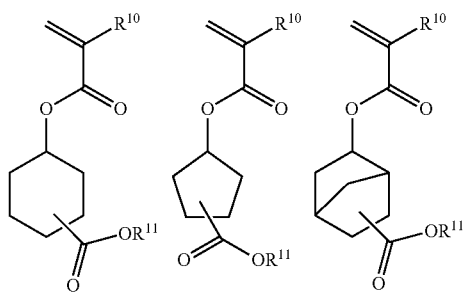

While the copolymer to be added to the resist composition as polymeric additive comprises the recurring units (p-1), (p-2), (q-1) and (q-2) and optionally, the recurring units (r), their molar fraction is in the following range:
0≤(p-1)<1.0, 0≤(p-2)<1.0, 0<(p-1)+(p-2)<1.0, preferably 0≤(p-1)≤0.9, 0≤(p-2)≤0.9, 0.02≤(p-1)+(p-2)≤0.9, and more preferably 0≤(p-1)≤0.8, 0≤(p-2)≤0.8, 0.04≤(p-1)+(p-2)≤0.8; 0≤(q-1)<1.0, 0≤(q-2)<1.0, 0<(q-1)+(q-2)<1.0, and 0.5≤(p-1)+(p-2)+(q-1)+(q-2)≤1.0;
0≤r<1.0, preferably 0≤r≤0.8, more preferably 0≤r≤0.7; provided that (p-1)+(p-2)+(q-1)+(q-2)+r=1.0.

Base Resin

The polymer serving as a base resin in the resist composition of the invention essentially comprises recurring units having an acid labile group. Specifically, the recurring units having an acid labile group include recurring units (a1) of (meth)acrylate having an acid labile group $R^{11}$ substituted thereon and recurring units (a2) of hydroxystyrene having an acid labile group $R^{13}$ substituted thereon, as represented by the general formula (2).

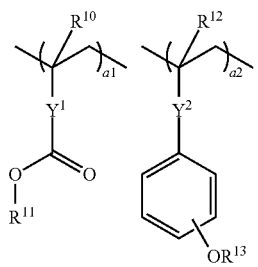

(2)

Herein $R^{10}$ and $R^{12}$ are each independently hydrogen or methyl, $R^{11}$ and $R^{13}$ each are an acid labile group, $Y^1$ is a single bond, a $C_1$-$C_{12}$ linking group having at least one of ester, lactone ring, phenylene and naphthylene, a phenylene group or a naphthylene group, $Y^2$ is a single bond, ester group or amide group, subscripts a1 and a2 are numbers in the range: 0≤a1≤0.9, 0≤a2≤0.9, and 0<a1+a2<1.0.

Examples of the monomer from which recurring units (a1) are derived are given below.

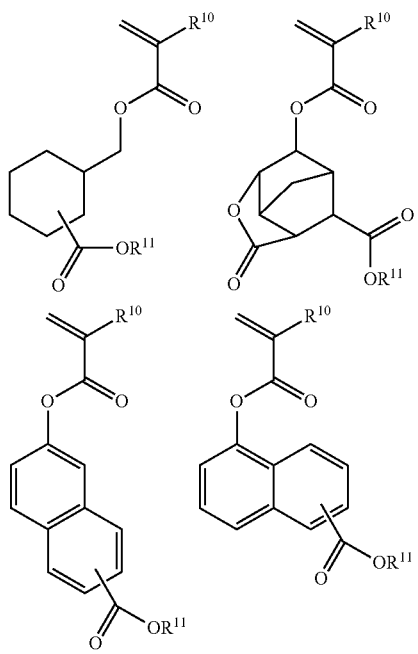

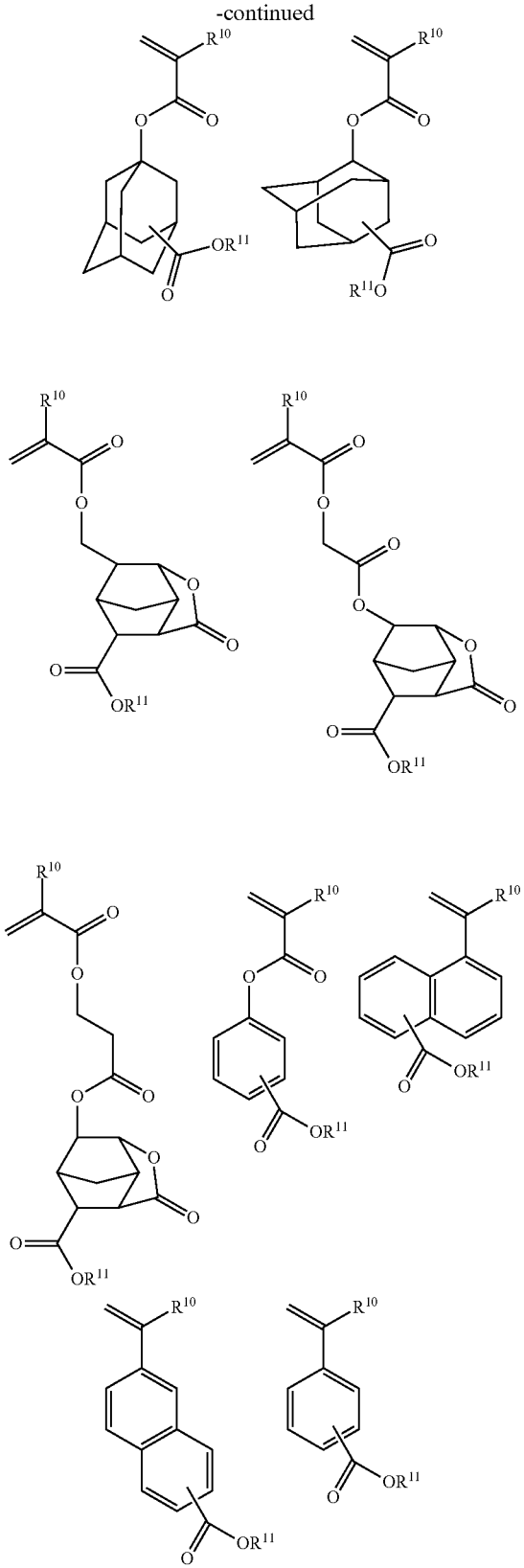

Note that $R^{10}$ and $R^{11}$ are as defined above.

Examples of the monomer from which recurring units (a2) are derived are given below.

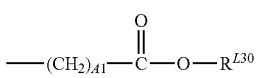

Note that $R^{12}$ and $R^{13}$ are as defined above.

The acid labile groups represented by $R^{11}$ and $R^{13}$ in formula (2) may be selected from a variety of such groups. The acid labile groups may be the same or different and preferably include groups of the following formulae (A-1) to (A-3).

(A-1)
$$-(CH_2)_{A1}-\overset{O}{\underset{}{C}}-O-R^{L30}$$

(A-2)
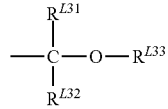

(A-3)
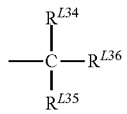

In formula (A-1), $R^{L30}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (A-3). Exemplary tertiary alkyl groups are tert-butyl, tert-amyl, 1,1-diethylpropyl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, and 2-methyl-2-adamantyl. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxolan-5-yl. Letter A1 is an integer of 0 to 6.

In formula (A-2), $R^{L31}$ and $R^{L32}$ are hydrogen or straight, branched or cyclic alkyl groups of 1 to 18 carbon atoms, preferably 1 to 10 carbon atoms. Exemplary alkyl groups include methyl, ethyl, propyl, isopropyl, n-butyl, sec-butyl, tert-butyl, cyclopentyl, cyclohexyl, 2-ethylhexyl, and n-octyl. $R^{L33}$ is a monovalent hydrocarbon group of 1 to 18 carbon atoms, preferably 1 to 10 carbon atoms, which may contain a heteroatom such as oxygen, examples of which include straight, branched or cyclic alkyl groups and substituted forms of such alkyl groups in which some hydrogen atoms are replaced by hydroxyl, alkoxy, oxo, amino, alkylamino or the like. Illustrative examples of the substituted alkyl groups are shown below.

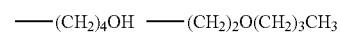
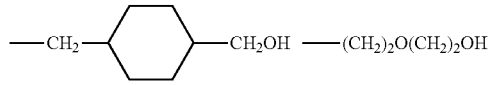
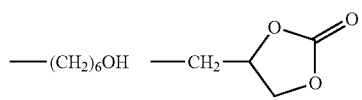

A pair of $R^{L31}$ and $R^{L32}$, $R^{L31}$ and $R^{L33}$, or $R^{L32}$ and $R^{L33}$ may bond together to form a ring with the carbon and oxygen atoms to which they are attached. Each of $R^{L31}$, $R^{L32}$ and $R^{L33}$ is a straight or branched alkylene group of 1 to 18 carbon atoms, preferably 1 to 10 carbon atoms when they form a ring, while the ring preferably has 3 to 10 carbon atoms, more preferably 4 to 10 carbon atoms.

Examples of the acid labile groups of formula (A-1) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl groups.

Also included are substituent groups having the formulae (A-1)-1 to (A-1)-10.

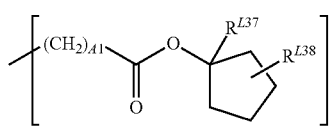
(A-1)-1

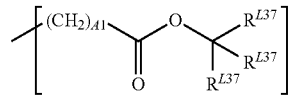
(A-1)-2

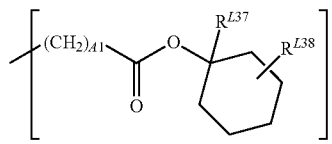
(A-1)-3

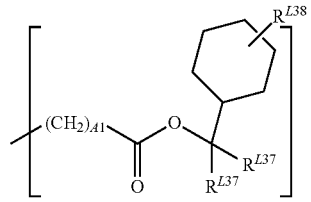
(A-1)-4

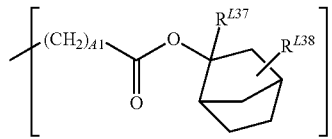
(A-1)-5

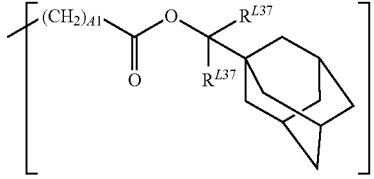
(A-1)-6

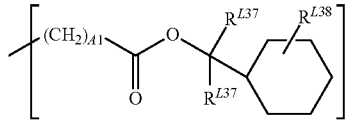
(A-1)-7

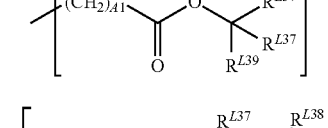
(A-1)-8

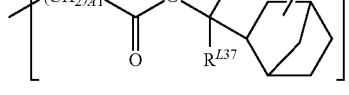
(A-1)-9

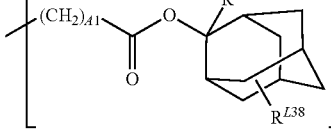
(A-1)-10

Herein $R^{L37}$ is each independently a straight, branched or cyclic $C_1$-$C_{10}$ alkyl group or $C_6$-$C_{20}$ aryl group. $R^{L38}$ is hydrogen or a straight, branched or cyclic $C_1$-$C_{10}$ alkyl group. $R^{L39}$ is each independently a straight, branched or cyclic $C_2$-$C_{10}$ alkyl group or $C_6$-$C_{20}$ aryl group. A1 is an integer of 0 to 6.

Of the acid labile groups of formula (A-2), the straight and branched ones are exemplified by the following groups having formulae (A-2)-1 to (A-2)-35.

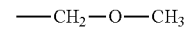
(A-2)-1

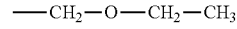
(A-2)-2

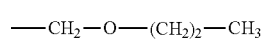 (A-2)-3
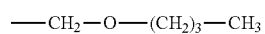 (A-2)-4
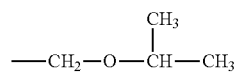 (A-2)-5
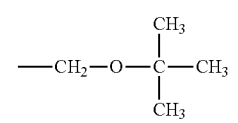 (A-2)-6
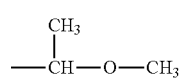 (A-2)-7
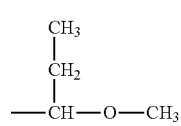 (A-2)-8
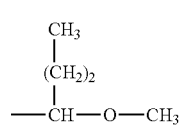 (A-2)-9
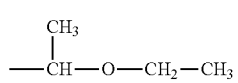 (A-2)-10
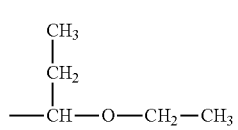 (A-2)-11
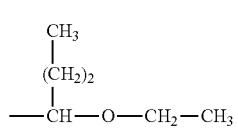 (A-2)-12
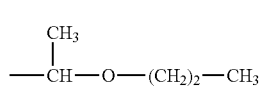 (A-2)-13
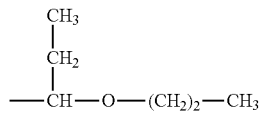 (A-2)-14
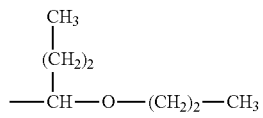 (A-2)-15
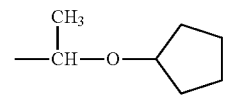 (A-2)-16
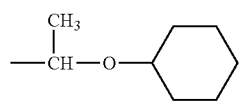 (A-2)-17
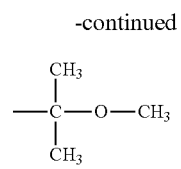 (A-2)-18
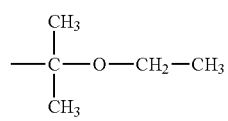 (A-2)-19
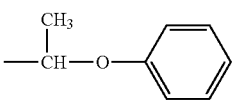 (A-2)-20
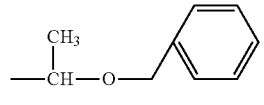 (A-2)-21
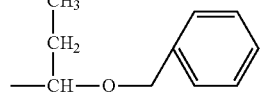 (A-2)-22
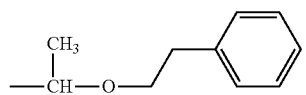 (A-2)-23
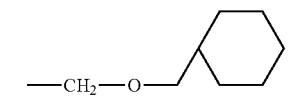 (A-2)-24
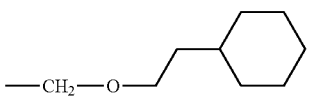 (A-2)-25
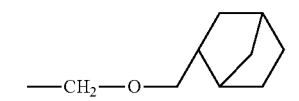 (A-2)-26
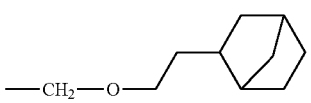 (A-2)-27
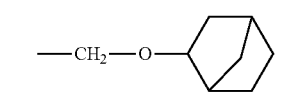 (A-2)-28
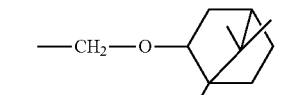 (A-2)-29
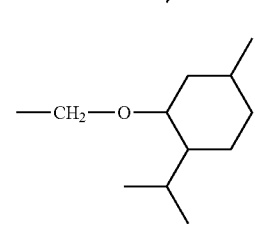 (A-2)-30

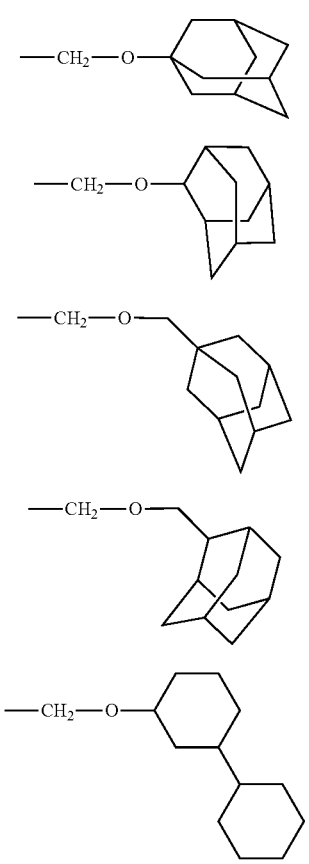

(A-2)-31
(A-2)-32
(A-2)-33
(A-2)-34
(A-2)-35

Of the acid labile groups of formula (A-2), the cyclic ones are, for example, tetrahydrofuran-2-yl, 2-methyltetrahydrofuran-2-yl, tetrahydropyran-2-yl, and 2-methyltetrahydropyran-2-yl.

Other examples of acid labile groups include those of the following formula (A-2a) or (A-2b) while the polymer may be crosslinked within the molecule or between molecules with these acid labile groups.

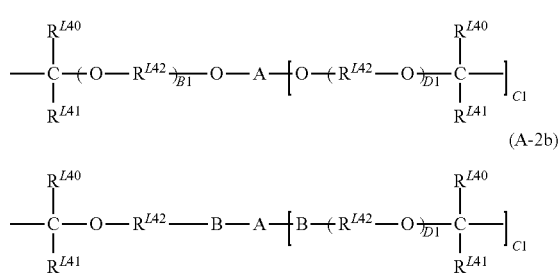

(A-2a)
(A-2b)

Herein $R^{L40}$ and $R^{L41}$ each are hydrogen or a straight, branched or cyclic $C_1$-$C_8$ alkyl group, or $R^{L40}$ and $R^{L41}$, taken together, may form a ring with the carbon atom to which they are attached, and $R^{L40}$ and $R^{L41}$ are straight or branched $C_1$-$C_8$ alkylene groups when they form a ring. $R^{L42}$ is a straight, branched or cyclic $C_1$-$C_{10}$ alkylene group. Each of B1 and D1 is 0 or an integer of 1 to 10, preferably 0 or an integer of 1 to 5, and C1 is an integer of 1 to 7. "A" is a (C1+1)-valent aliphatic or alicyclic saturated hydrocarbon group, aromatic hydrocarbon group or heterocyclic group having 1 to 50 carbon atoms, which may be separated by a heteroatom or in which some hydrogen atoms attached to carbon atoms may be substituted by hydroxyl, carboxyl, carbonyl groups or fluorine atoms. "B" is —CO—O—, —NHCO—O— or —NHCONH—.

Preferably, "A" is selected from divalent to tetravalent, straight, branched or cyclic $C_1$-$C_{20}$ alkylene, alkyltriyl and alkyltetrayl groups, and $C_6$-$C_{30}$ arylene groups, which may contain a heteroatom or in which some hydrogen atoms attached to carbon atoms may be substituted by hydroxyl, carboxyl, acyl groups or halogen atoms. The subscript C1 is preferably an integer of 1 to 3.

The crosslinking acetal groups of formulae (A-2a) and (A-2b) are exemplified by the following formulae (A-2)-36 through (A-2)-43.

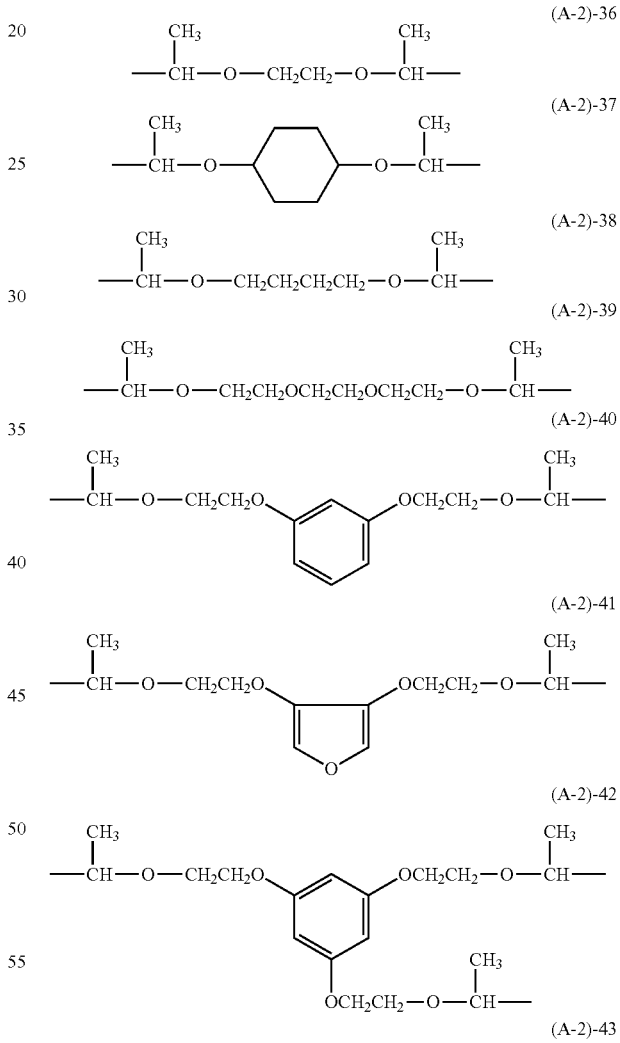

In formula (A-3), $R^{L34}$, $R^{L35}$ and $R^{L36}$ each are a monovalent hydrocarbon group, typically a straight, branched or cyclic $C_1$-$C_{20}$ alkyl group, which may contain a heteroatom such as oxygen, sulfur, nitrogen or fluorine. A pair of $R^{L34}$ and $R^{L35}$, $R^{L34}$ and $R^{L36}$, or $R^{L35}$ and $R^{L36}$ may bond together to form a $C_3$-$C_{20}$ ring with the carbon atom to which they are attached.

Exemplary tertiary alkyl groups of formula (A-3) include tert-butyl, triethylcarbyl, 1-ethylnorbornyl, 1-methylcyclohexyl, 1-ethylcyclopentyl, 2-(2-methyl)adamantyl, 2-(2-ethyl)adamantyl, and tert-amyl.

Other exemplary tertiary alkyl groups include those of the following formulae (A-3)-1 to (A-3)-18.

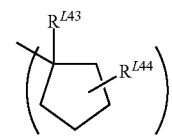
(A-3)-1

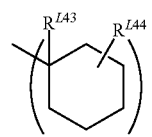
(A-3)-2

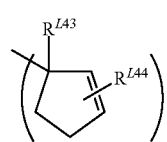
(A-3)-3

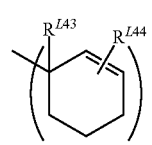
(A-3)-4

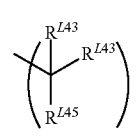
(A-3)-5

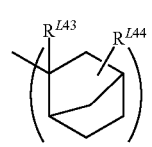
(A-3)-6

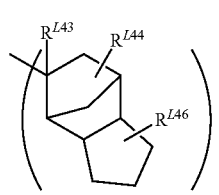
(A-3)-7

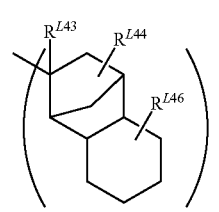
(A-3)-8

-continued

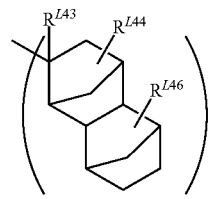
(A-3)-9

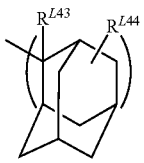
(A-3)-10

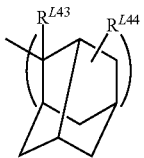
(A-3)-11

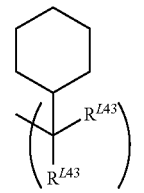
(A-3)-12

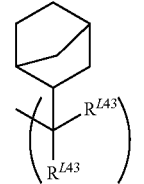
(A-3)-13

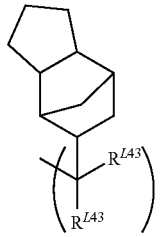
(A-3)-14

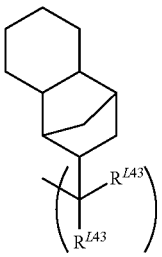
(A-3)-15

-continued (A-3)-16

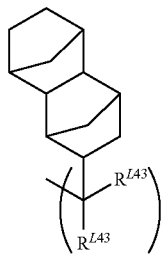

(A-3)-17

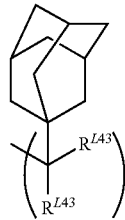

(A-3)-18

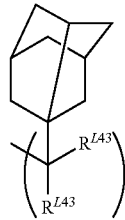

Herein $R^{L43}$ is each independently a straight, branched or cyclic $C_1$-$C_8$ alkyl group or $C_6$-$C_{20}$ aryl group, typically phenyl or naphthyl, $R^{L44}$ and $R^{L46}$ each are hydrogen or a straight, branched or cyclic $C_1$-$C_{20}$ alkyl group, and $R^{L45}$ is a $C_6$-$C_{20}$ aryl group, typically phenyl.

The polymer may be crosslinked within the molecule or between molecules with groups having $R^{L47}$ which is a di- or multi-valent alkylene or arylene group, as shown by the following formulae (A-3)-19 and (A-3)-20.

(A-3)-19

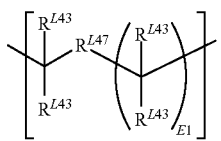

(A-3)-20

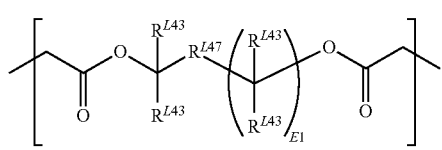

Herein $R^{L43}$ is as defined above, $R^{L47}$ is a straight, branched or cyclic $C_1$-$C_{20}$ alkylene group or arylene group, typically phenylene, which may contain a heteroatom such as oxygen, sulfur or nitrogen, and E1 is an integer of 1 to 3.

Of recurring units having acid labile groups of formula (A-3), recurring units of (meth)acrylate having an exo-form structure represented by the formula (A-3)-21 are preferred.

(A-3)-21

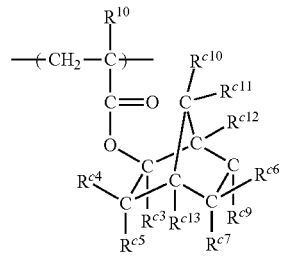

Herein, $R^{10}$ is as defined above. $R^{c3}$ is a straight, branched or cyclic $C_1$-$C_8$ alkyl group or an optionally substituted $C_6$-$C_{20}$ aryl group. $R^{c4}$ to $R^{c9}$, $R^{c12}$ and $R^{c13}$ are each independently hydrogen or a monovalent $C_1$-$C_{15}$ hydrocarbon group which may contain a heteroatom. $R^{c10}$ and $R^{c11}$ each are hydrogen or a monovalent $C_1$-$C_{15}$ hydrocarbon group which may contain a heteroatom. Alternatively, a pair of $R^{c4}$ and $R^{c5}$, $R^{c6}$ and $R^{c8}$, $R^{c6}$ and $R^{c9}$, $R^{c7}$ and $R^{c9}$, $R^{c7}$ and $R^{c13}$, $R^{c8}$ and $R^{c12}$, $R^{c10}$ and $R^{c11}$, or $R^{c11}$ and $R^{c12}$, taken together, may form a ring, and in that event, each ring-forming R is a divalent $C_1$-$C_{15}$ hydrocarbon group which may contain a heteroatom. Also, a pair of $R^{c4}$ and $R^{c13}$, $R^{c10}$ and $R^{c13}$, or $R^{c6}$ and $R^{c8}$ which are attached to vicinal carbon atoms may bond together directly to form a double bond. The formula also represents an enantiomer.

The ester form monomers from which recurring units having an exo-form structure represented by formula (A-3)-21 are derived are described in U.S. Pat. No. 6,448,420 (JP-A 2000-327633). Illustrative non-limiting examples of suitable monomers are given below.

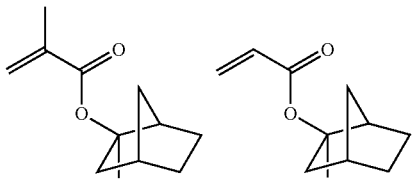

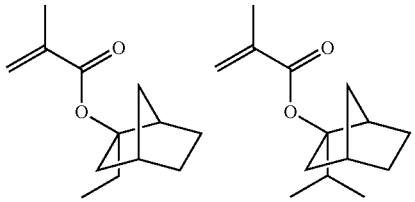

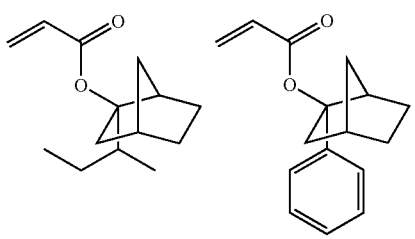

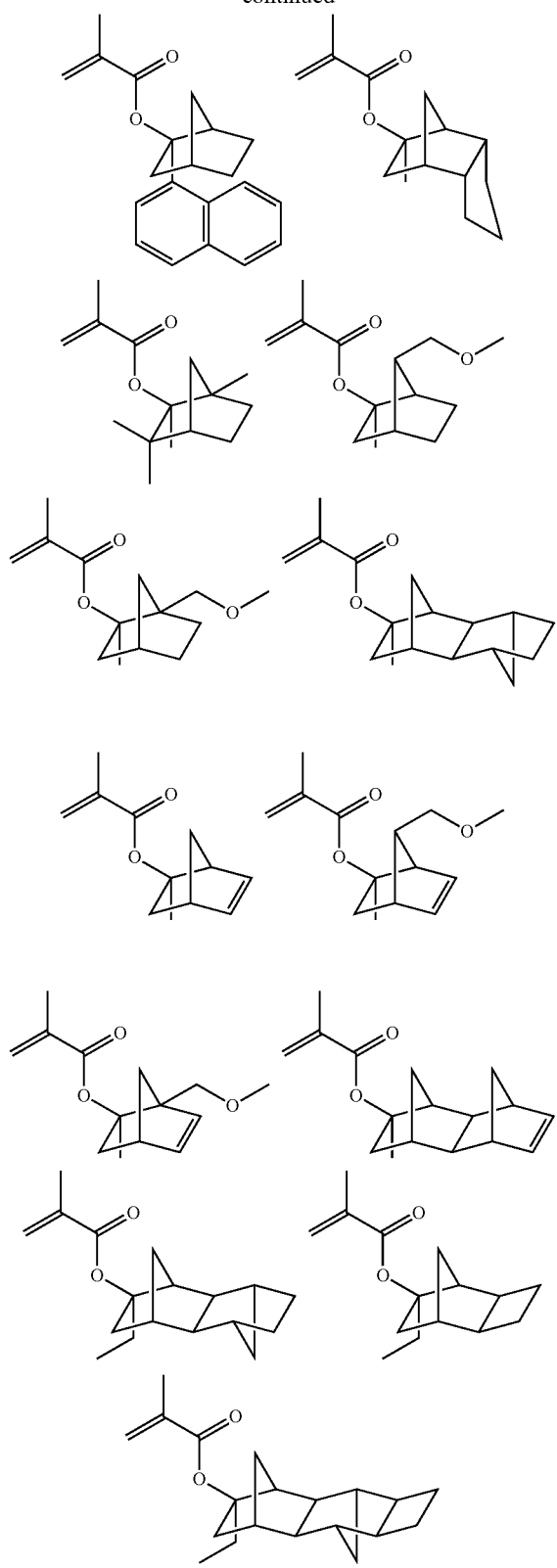

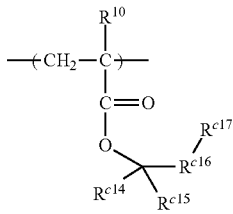
(A-3)-22

Herein, $R^{10}$ is as defined above. $R^{c14}$ and $R^{c15}$ are each independently a monovalent, straight, branched or cyclic $C_1$-$C_{10}$ hydrocarbon group, or $R^{c14}$ and $R^{c15}$, taken together, may form an aliphatic hydrocarbon ring with the carbon atom to which they are attached. $R^{c16}$ is a divalent group selected from furandiyl, tetrahydrofurandiyl and oxanorbornanediyl. $R^{c17}$ is hydrogen or a monovalent, straight, branched or cyclic $C_1$-$C_{10}$ hydrocarbon group which may contain a heteroatom.

Examples of the monomers from which the recurring units substituted with acid labile groups having furandiyl, tetrahydrofurandiyl and oxanorbornanediyl are derived are shown below. Note that Me is methyl and Ac is acetyl.

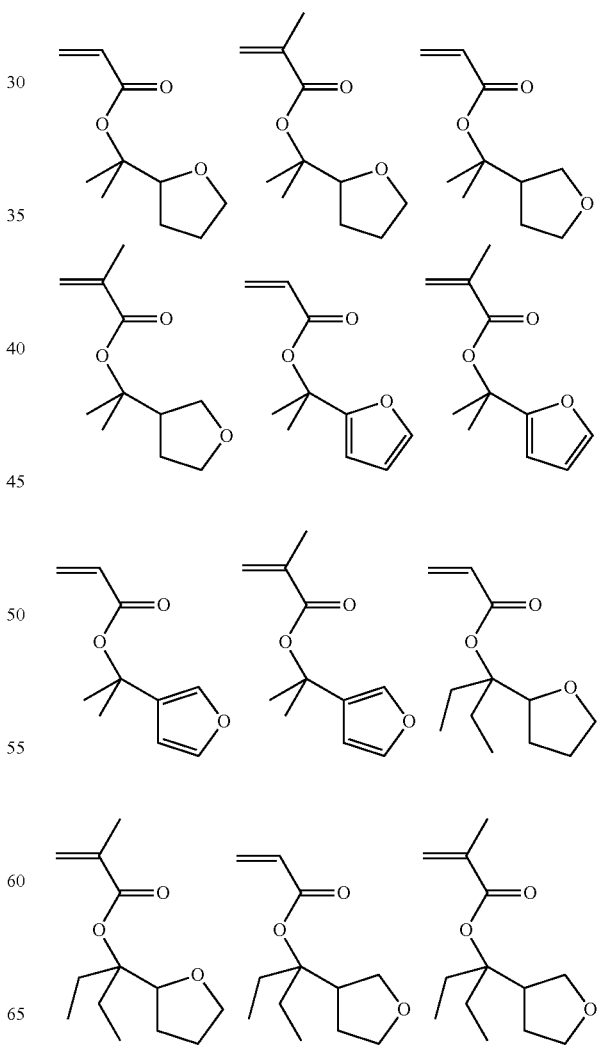

Also included in the acid labile groups of formula (A-3) are acid labile groups of (meth)acrylate having furandiyl, tetrahydrofurandiyl or oxanorbornanediyl as represented by the following formula (A-3)-22.

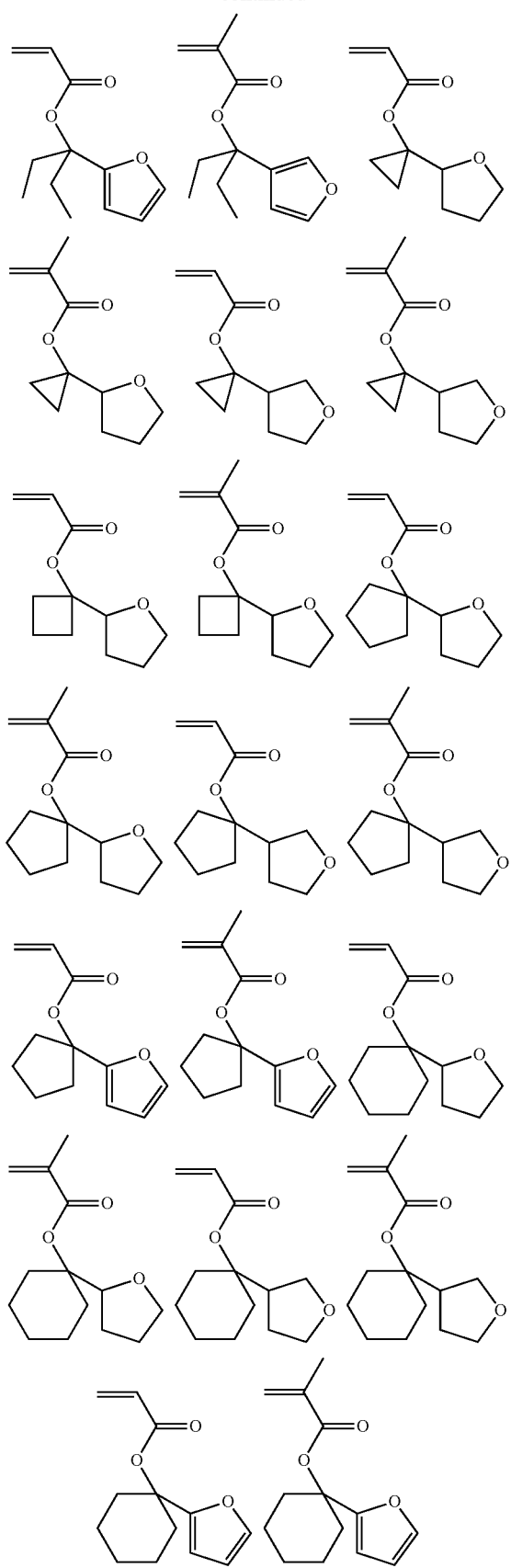
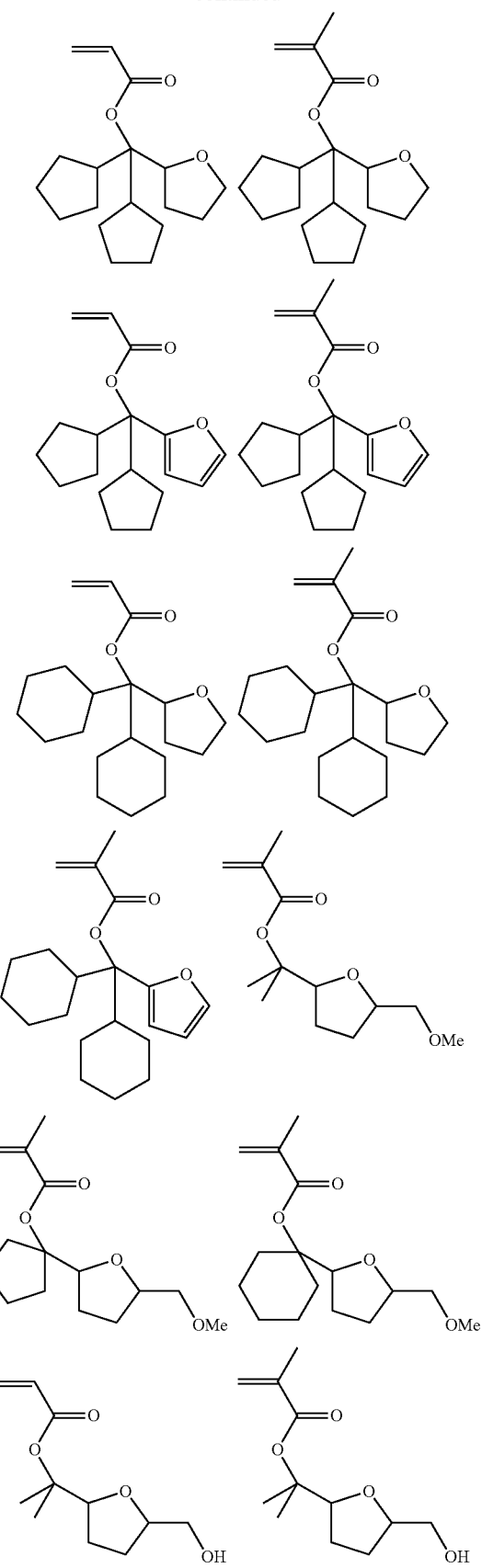

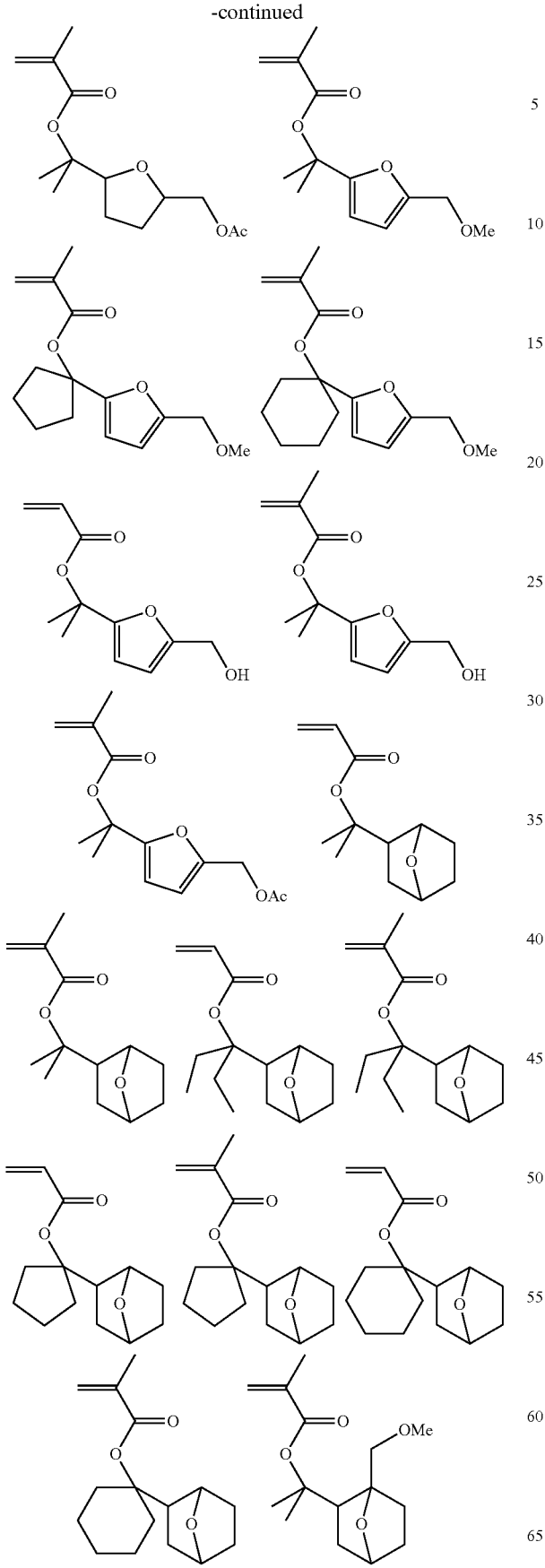
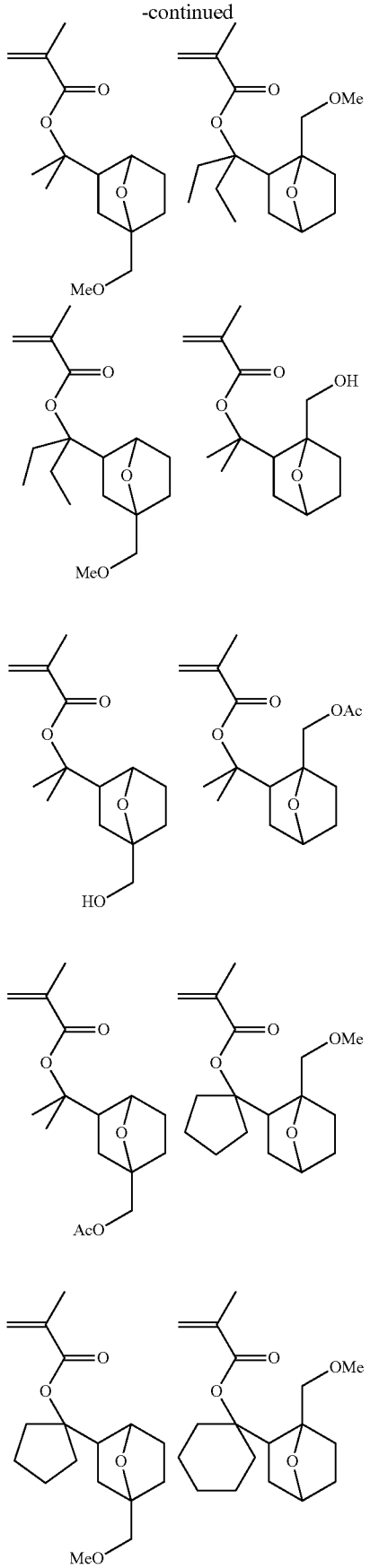

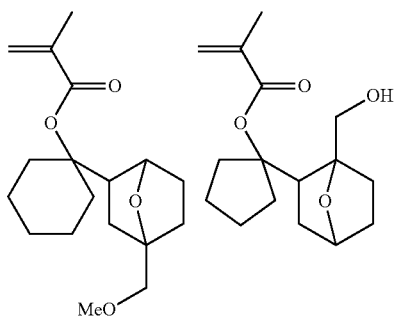
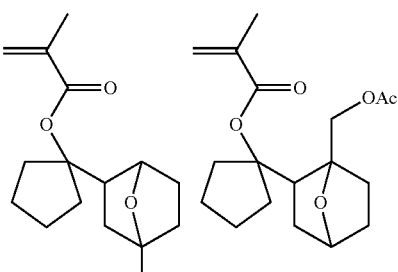
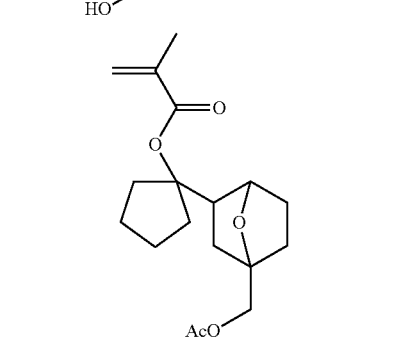

In a preferred embodiment of the polymer serving as base resin, recurring units (c) having an adhesive group may be copolymerized with the recurring units (a1) and (a2) having an acid labile group, represented by formula (2), for the purposes of improving compatibility with other components and suppressing a film thickness loss on the resist surface. Suitable adhesive groups include hydroxyl, carboxyl, lactone ring, carbonyl, carbonate, ester, ether, amide, sulfonamide, cyano, sulfonic acid ester, lactam and the like. The preferred recurring units (c) are those having a phenolic hydroxyl group which has a sensitizing effect in the EB and EUV lithography. The recurring units (c) having a phenolic hydroxyl group are typically selected from units (c1) to (c9) represented by the general formula (4).

(4)

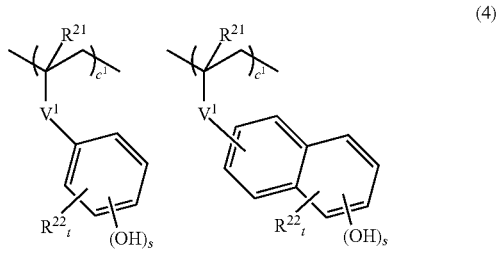

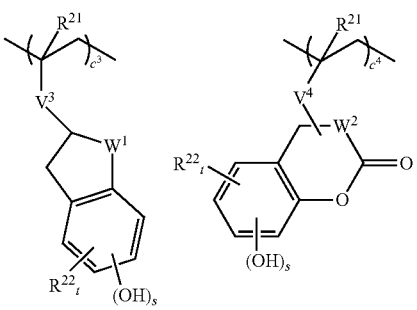
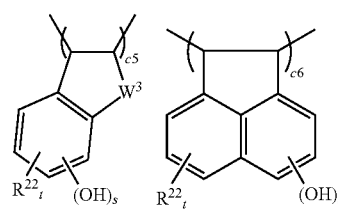
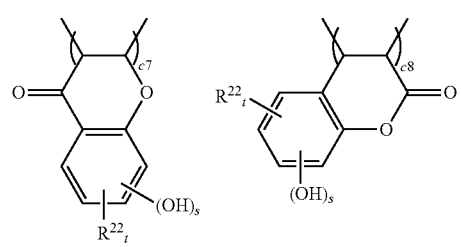
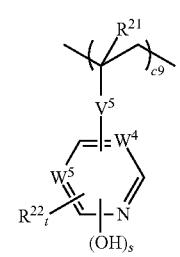

Herein $R^{21}$ is each independently hydrogen or methyl, $V^1$, $V^2$ and $V^5$ each are a single bond or —C(=O)—O—$R^{23}$—, $V^3$ and $V^4$ each are —C(=O)—O—$R^{24}$—, $R^{23}$ and $R^{24}$ each are a single bond or a straight, branched or cyclic $C_1$-$C_{10}$ alkylene group which may contain an ether or ester moiety, $R^{22}$ is each independently hydrogen, or a $C_1$-$C_4$ straight or branched alkyl, alkoxy, cyano, alkoxycarbonyl, acyloxy or acyl group, $W^1$ and $W^2$ each are methylene or ethylene, $W^3$ is methylene, oxygen or sulfur, $W^4$ and $W^5$ each are CH or nitrogen, and s and t each are 1 or 2.

Examples of the monomers from which the recurring units (c1) to (c9) having a phenolic hydroxyl group are derived are given below.

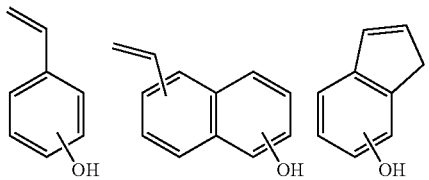

55
-continued
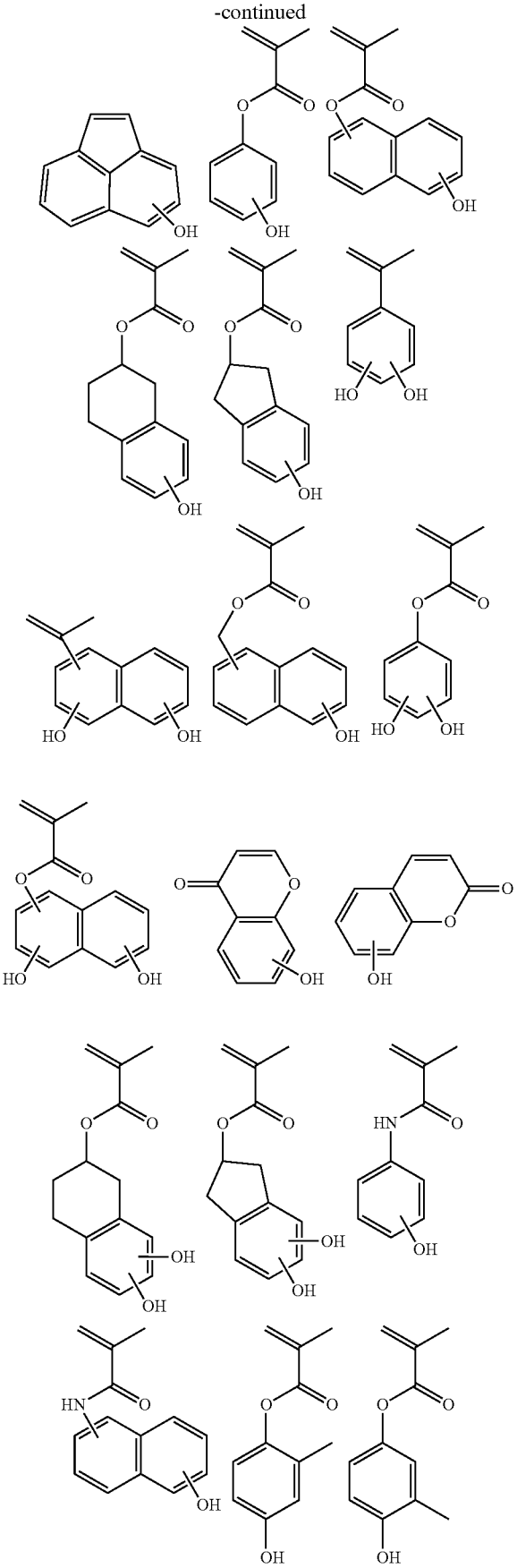
56
-continued
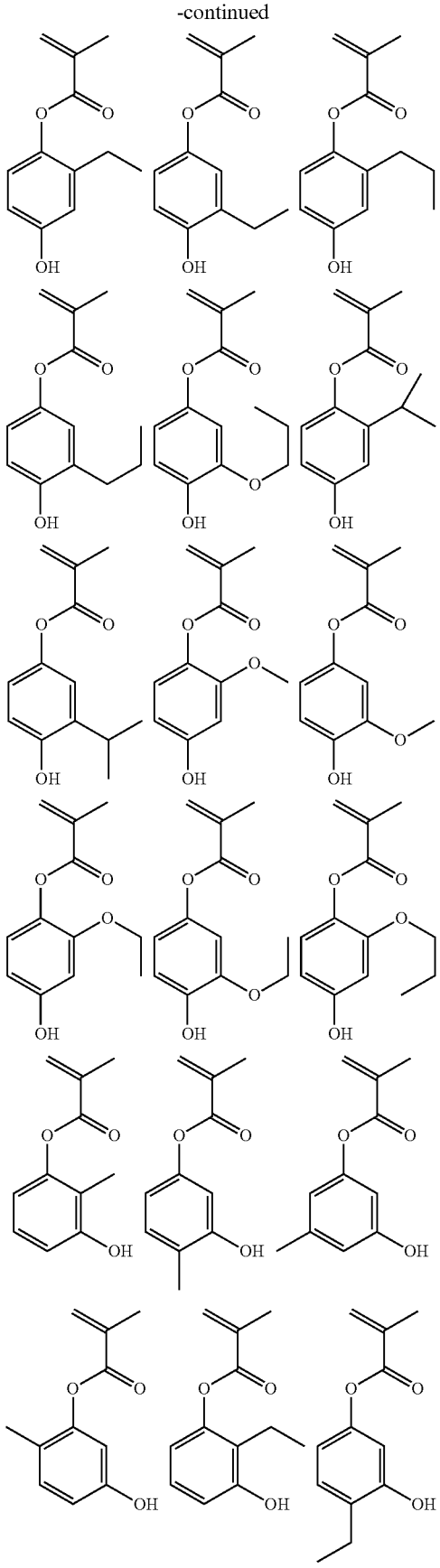

57
-continued
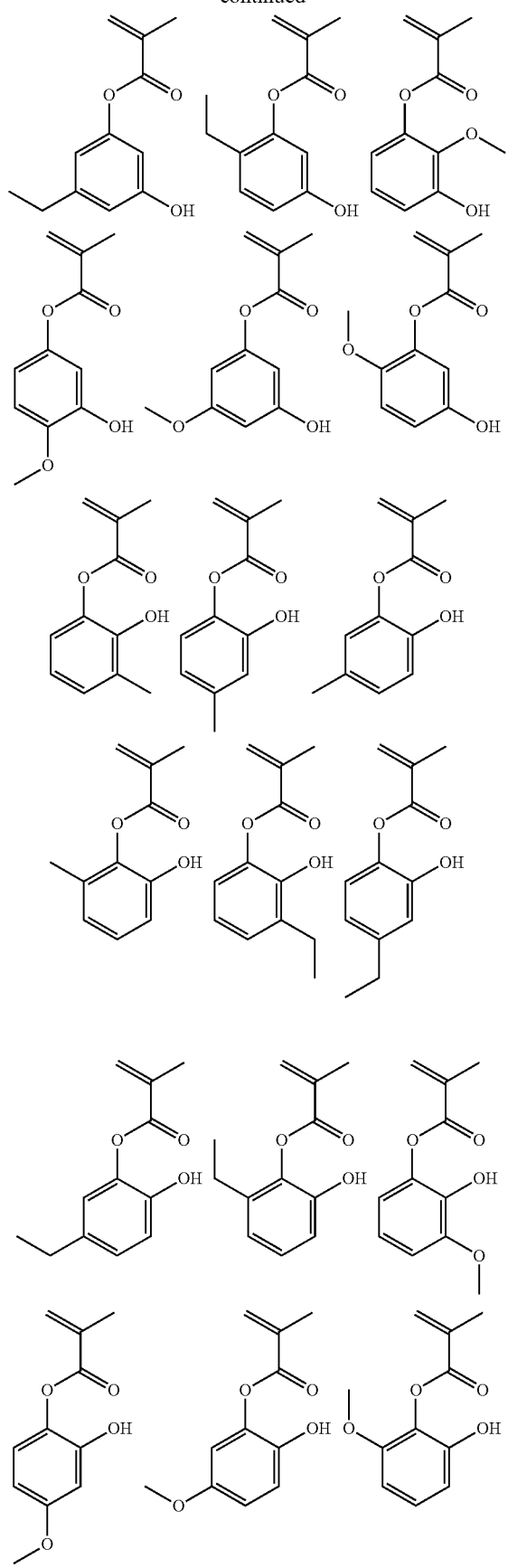
58
-continued
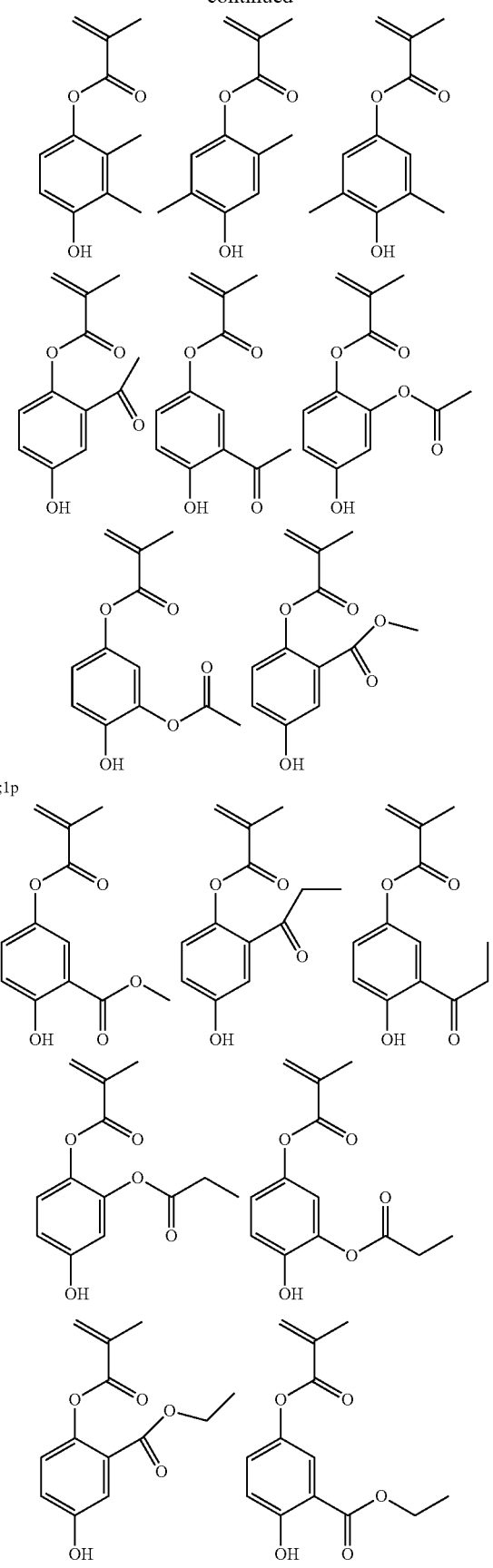

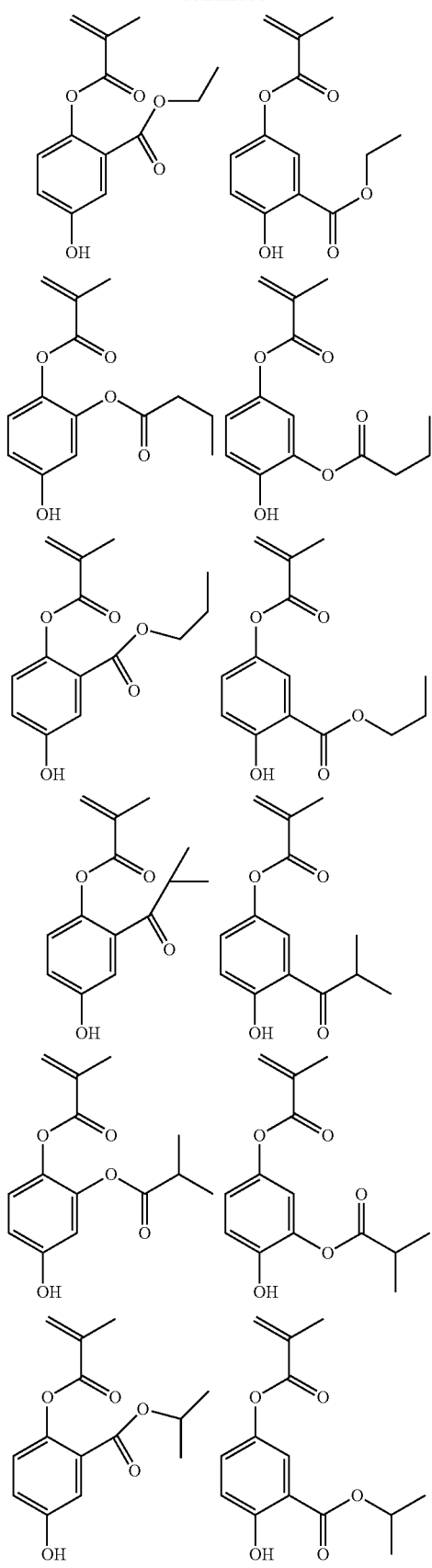
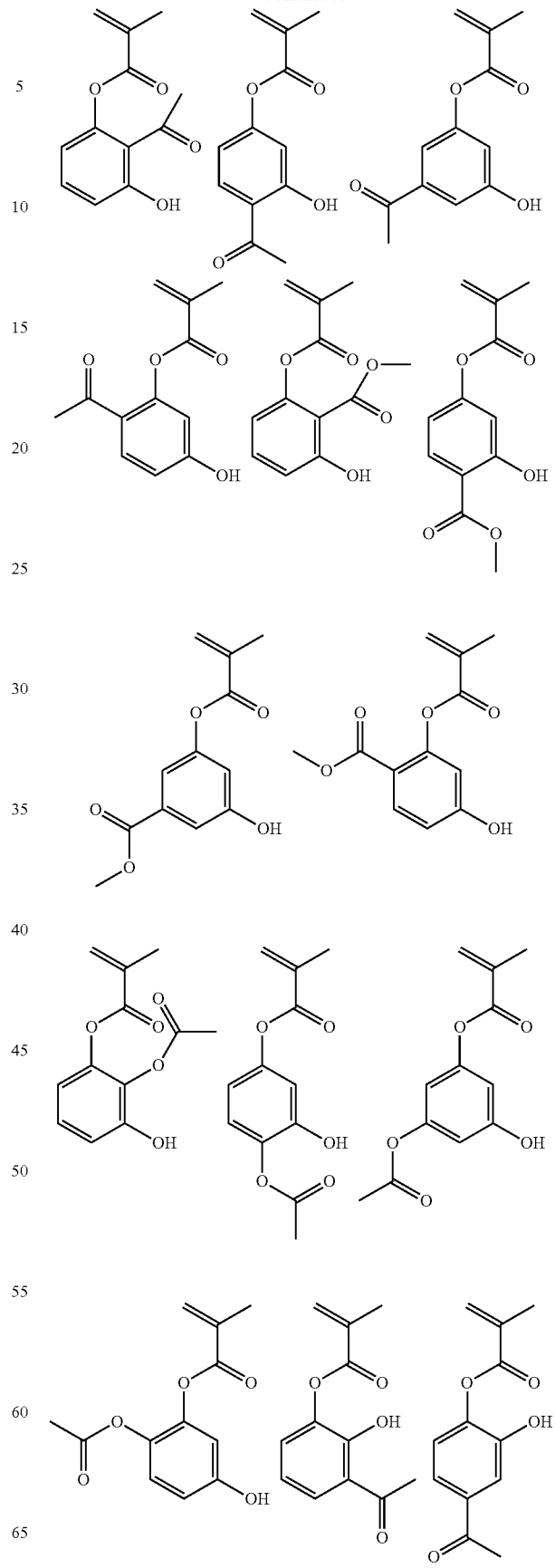

61
-continued
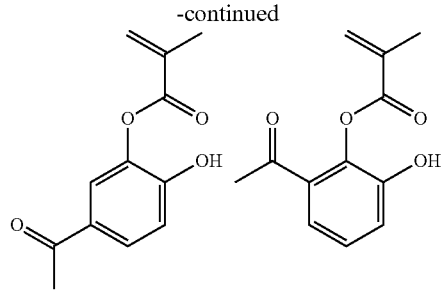
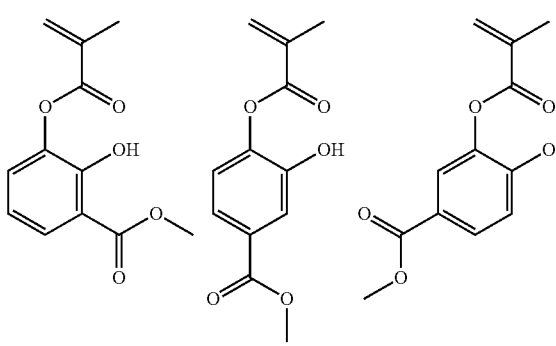
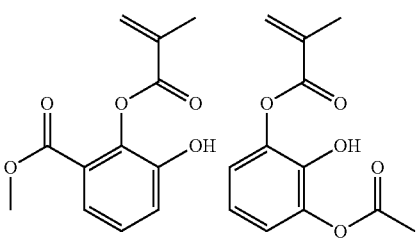
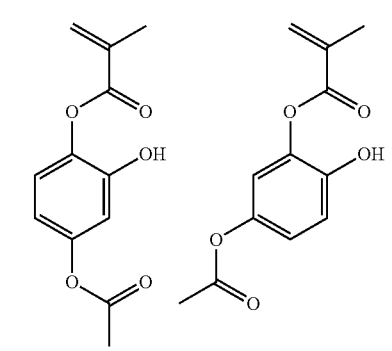
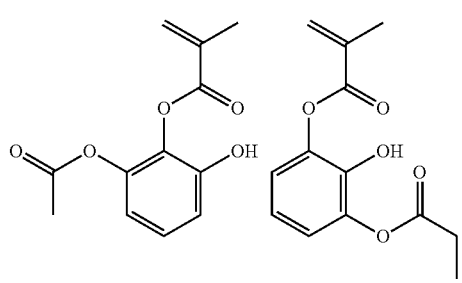
62
-continued
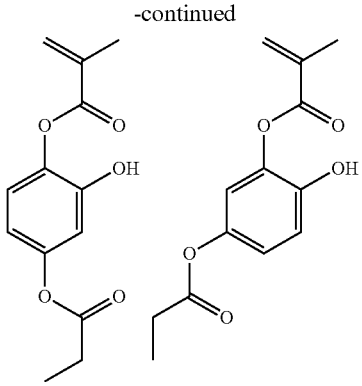
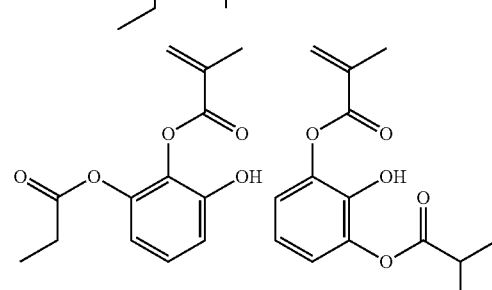
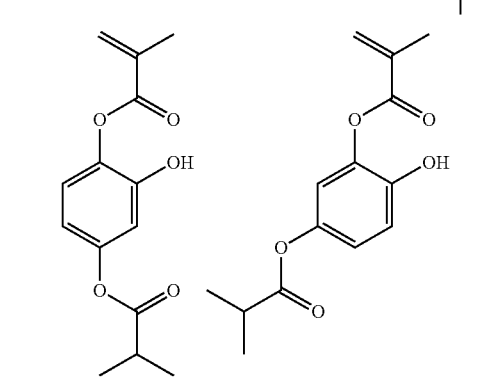
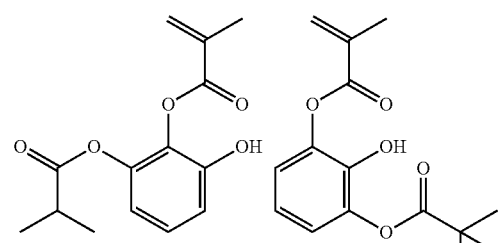
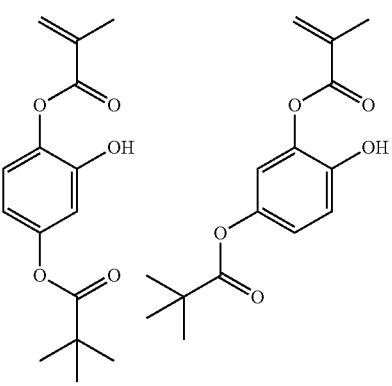

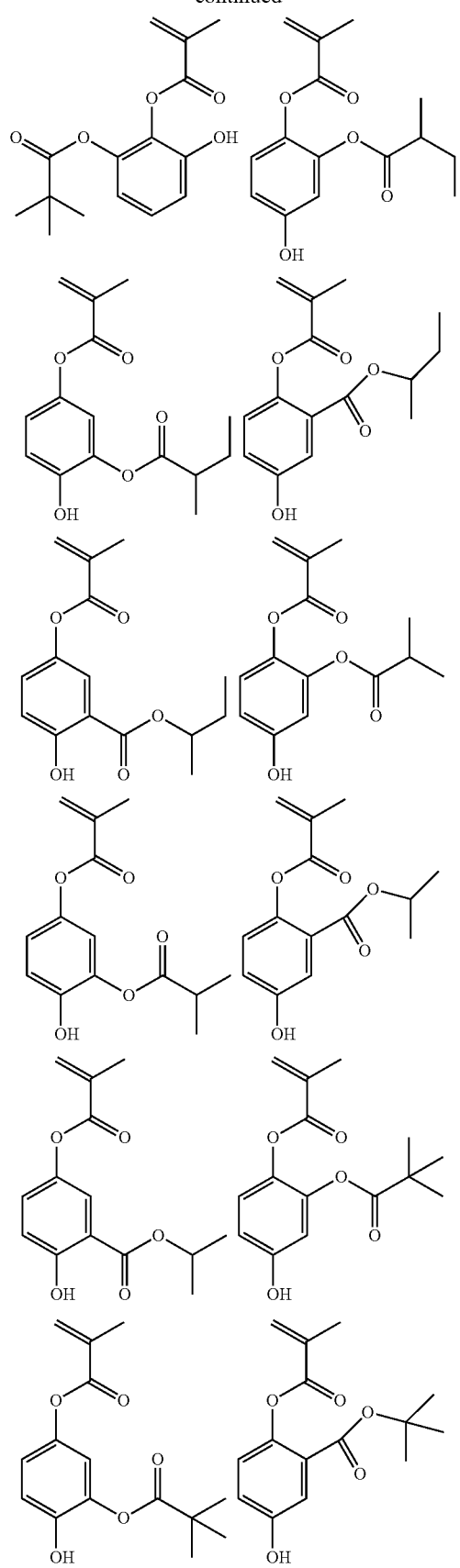
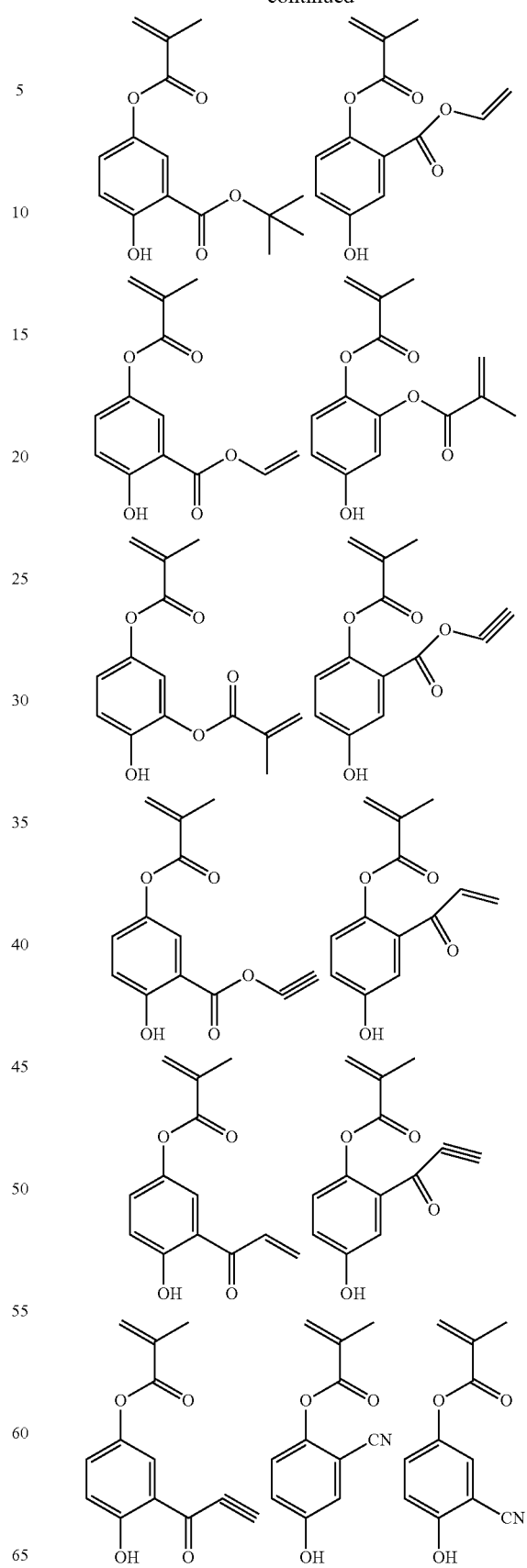

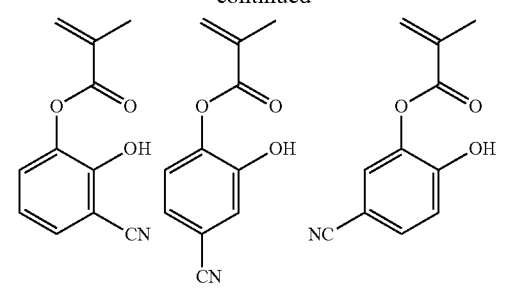
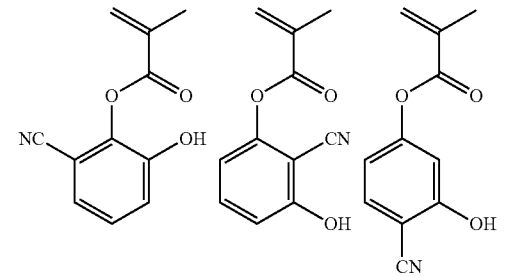
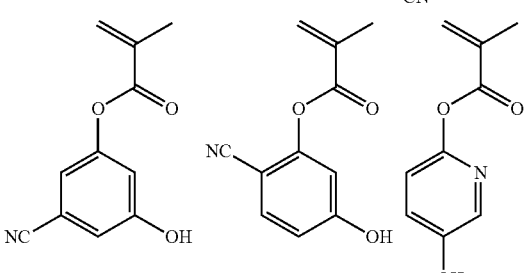
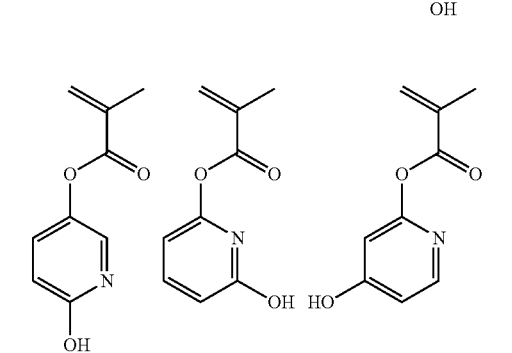
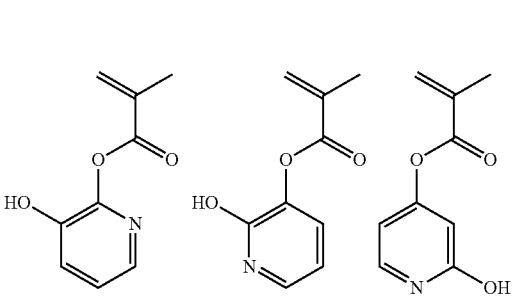
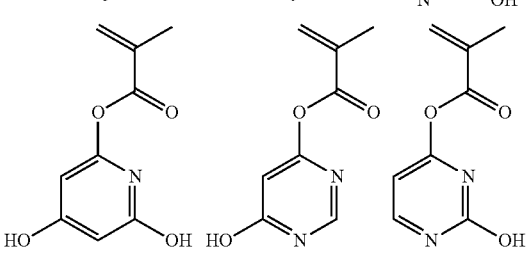
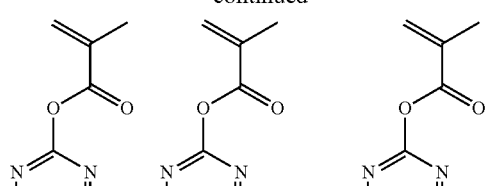
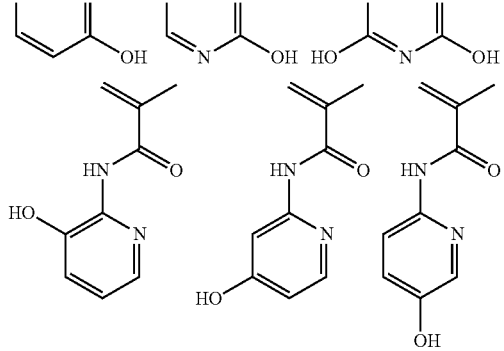
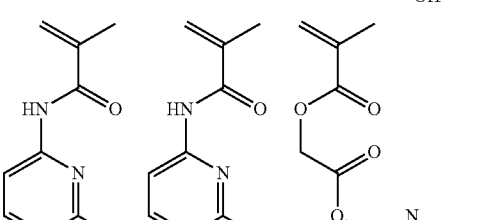
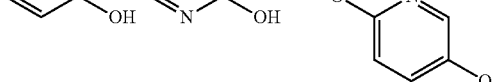
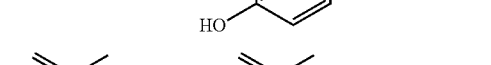
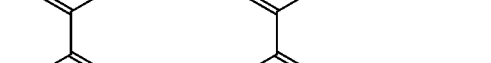
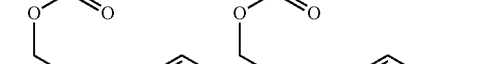
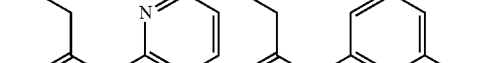
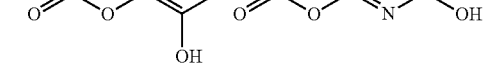
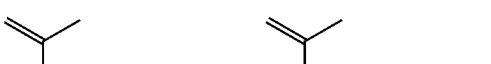

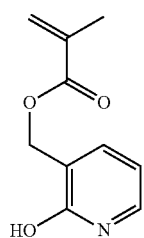
Examples of the monomers from which the recurring units having an adhesive group such as hydroxyl (exclusive of phenolic hydroxyl), lactone ring, ether, ester, carbonyl, cyano, sulfonic acid ester, sulfonamide group, cyclic —O—C(=O)—S— or —O—C(=O)—NH— group are derived are given below.
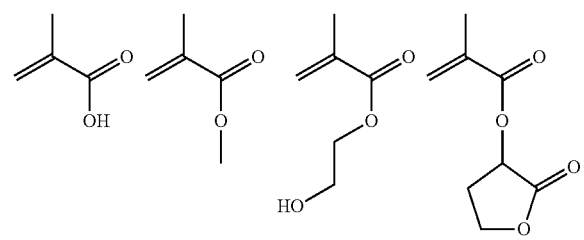
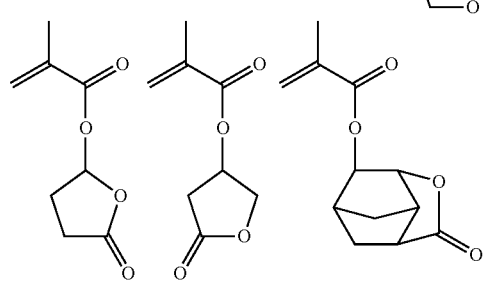
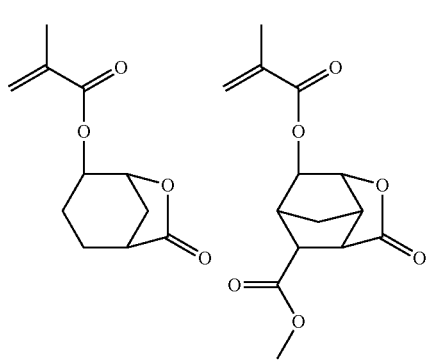
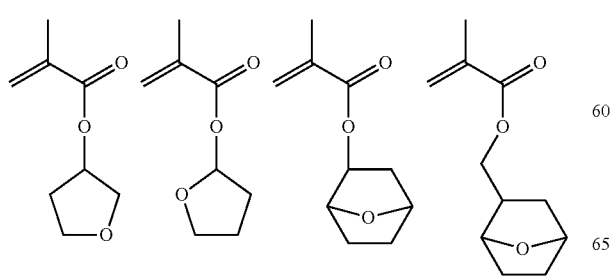
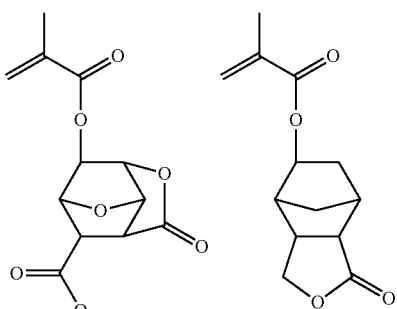
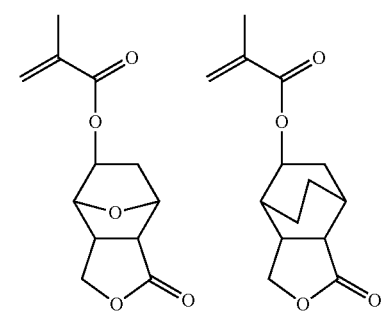
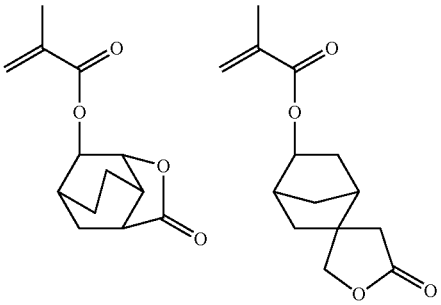
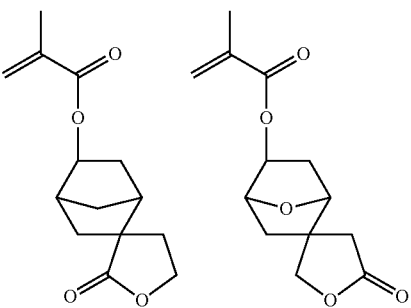
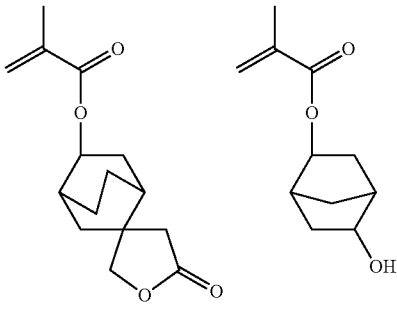

-continued
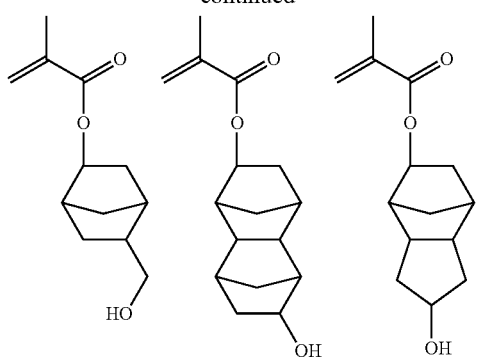
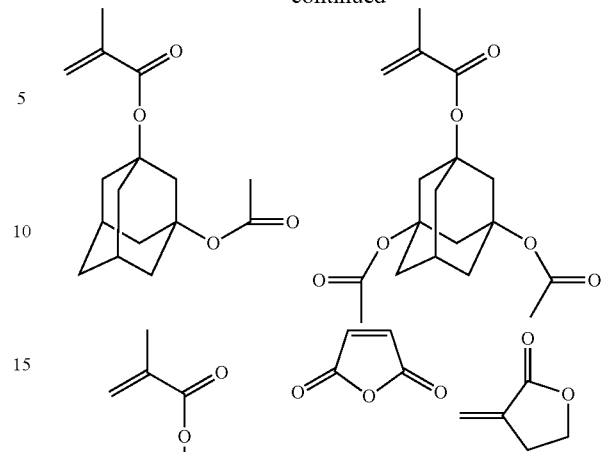
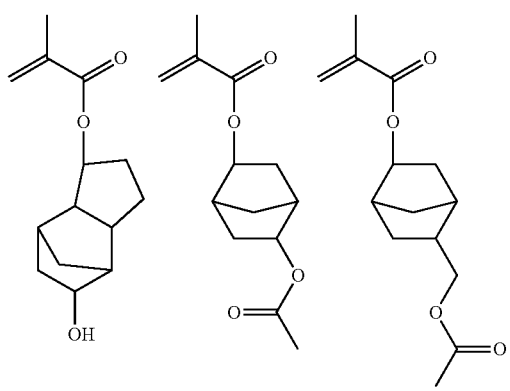
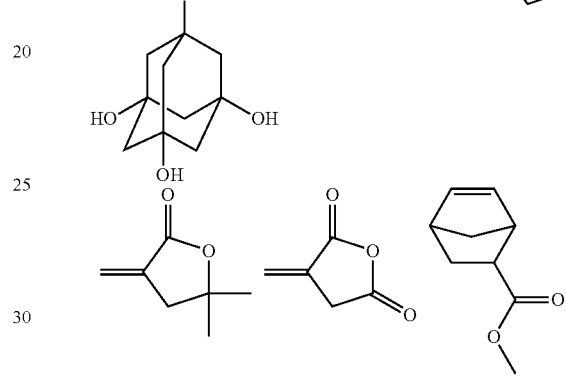
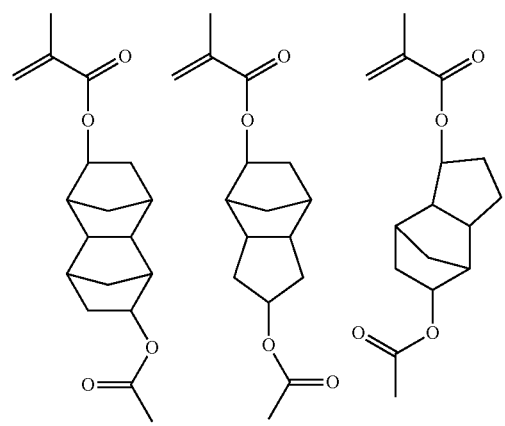
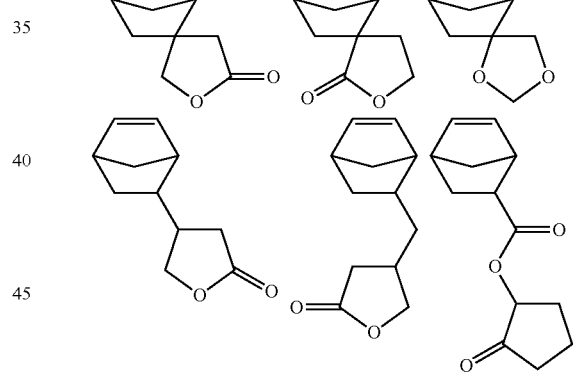
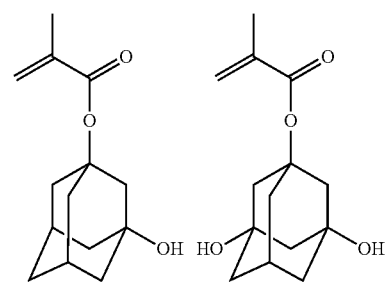
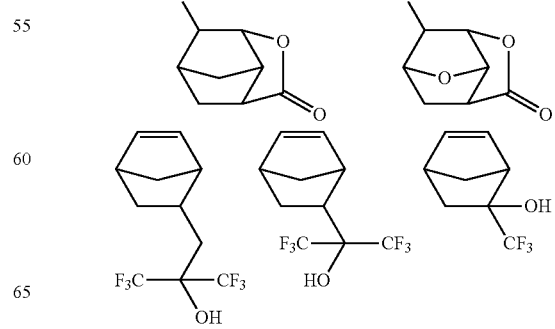

71
-continued
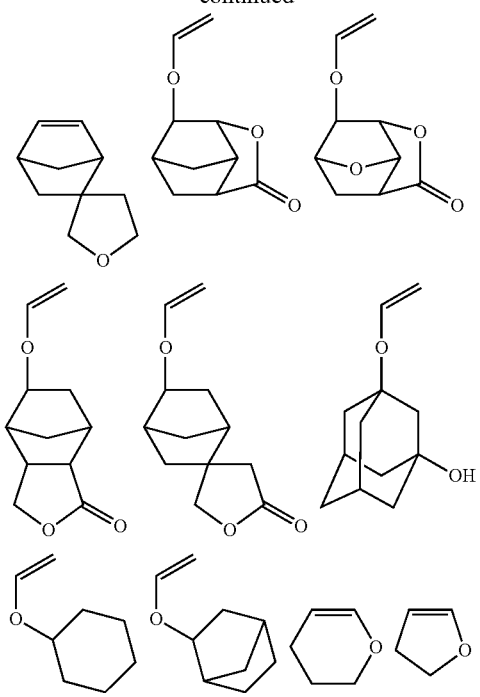
72
-continued
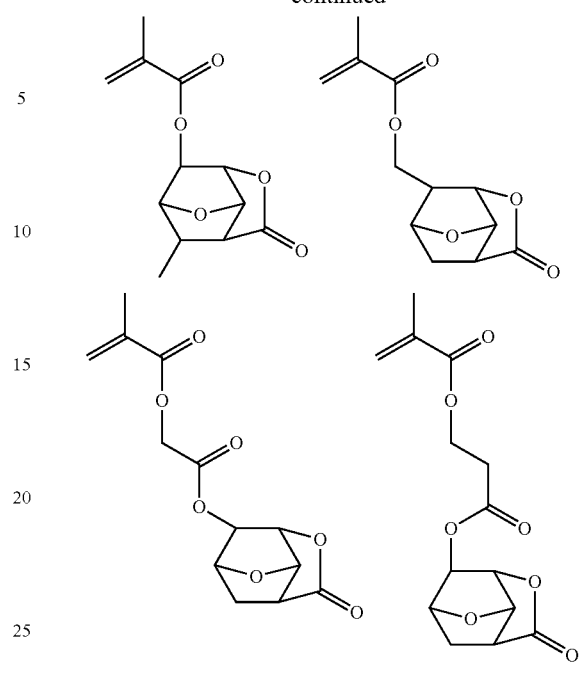
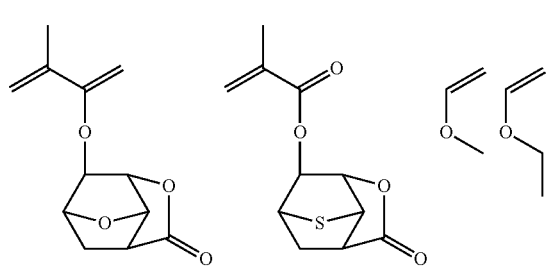
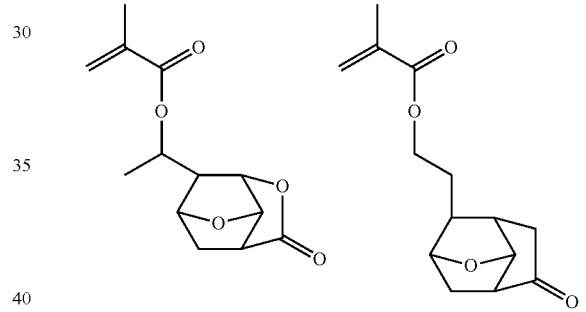
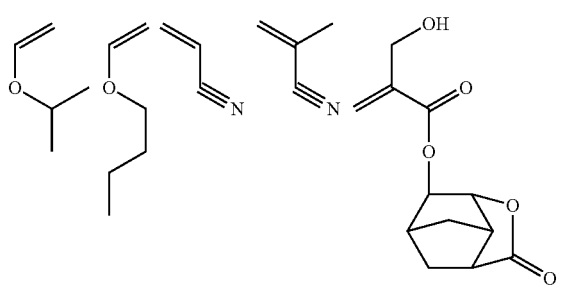
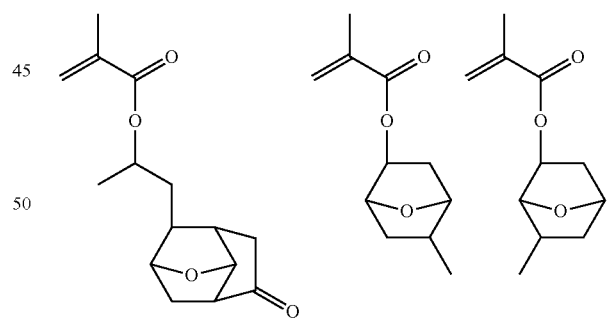
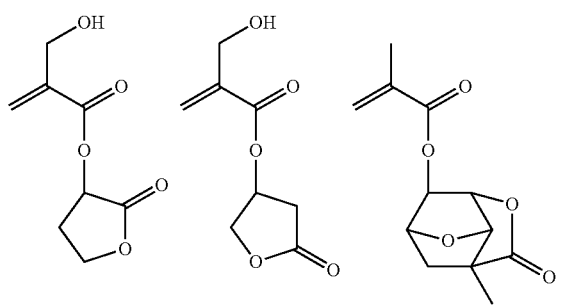
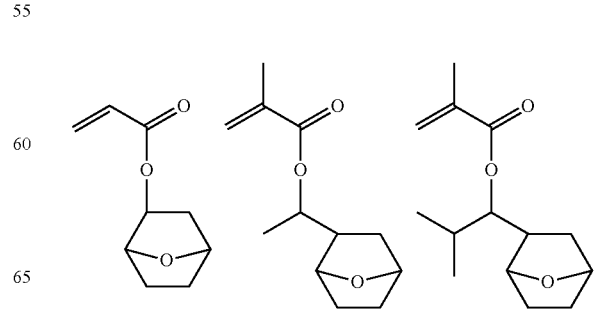

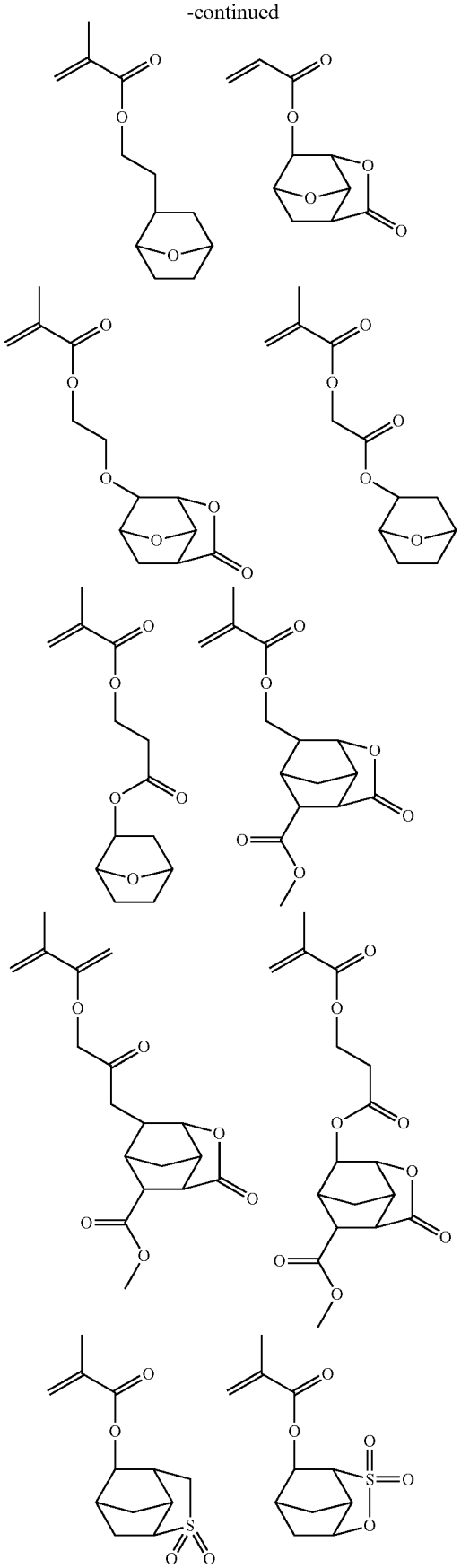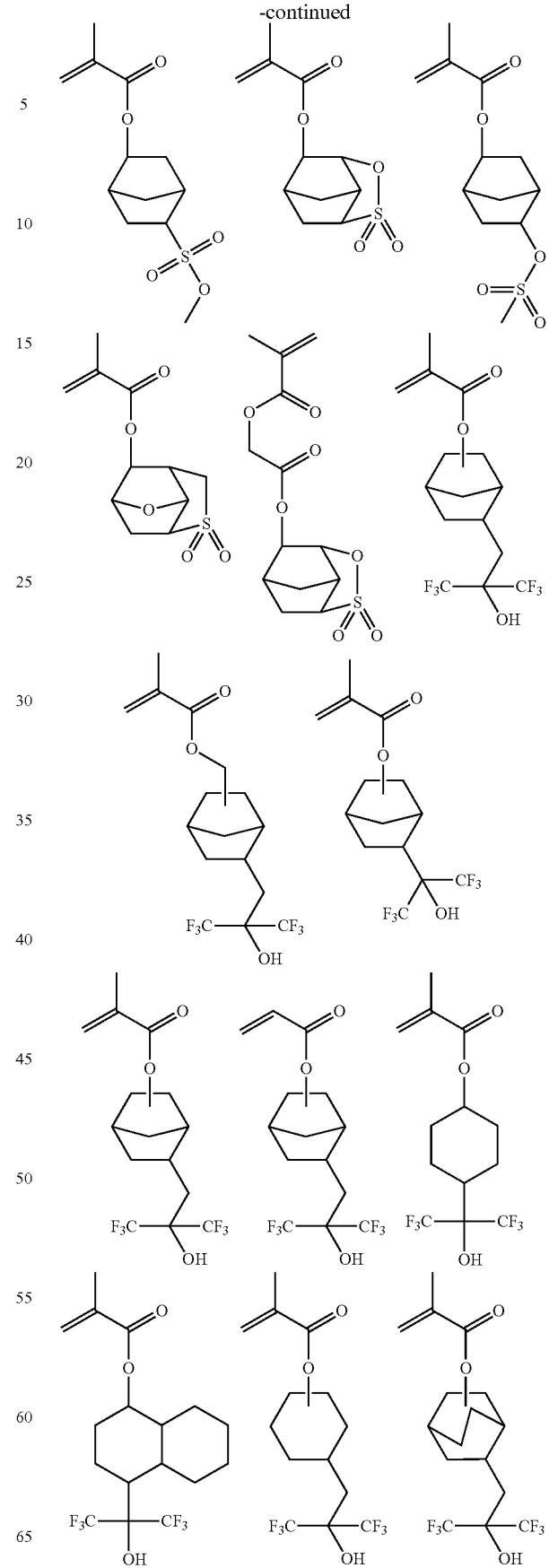

75
-continued
76
-continued
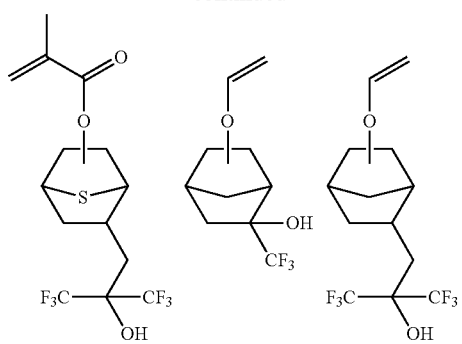
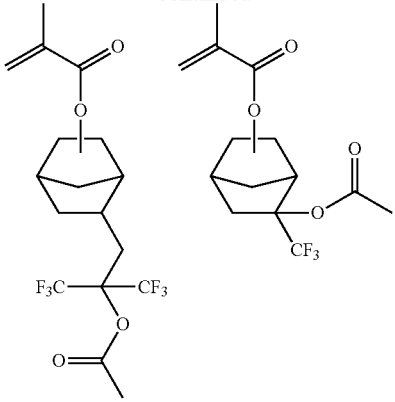
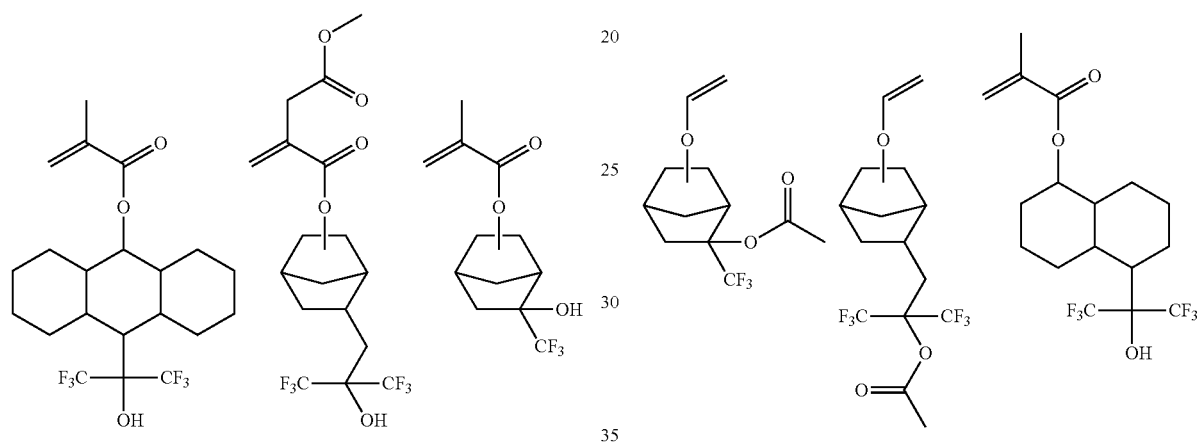
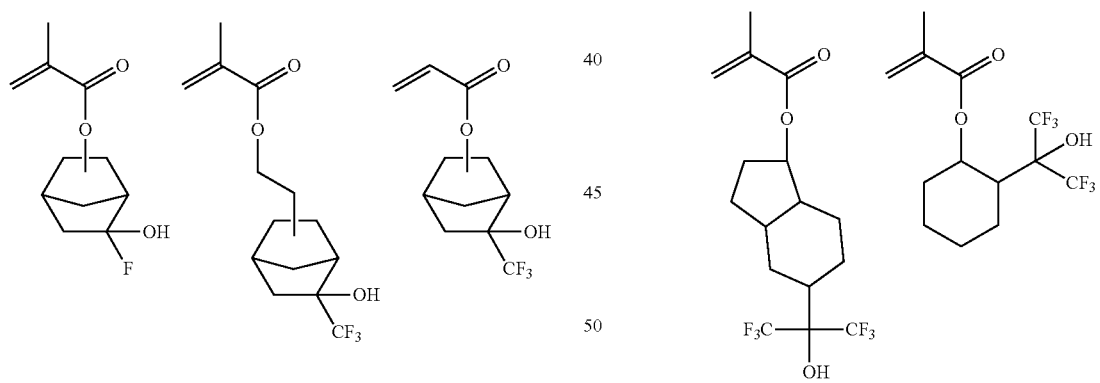
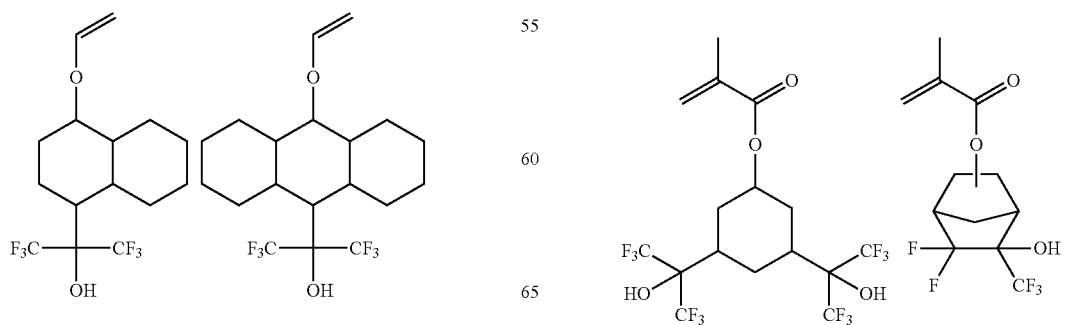

-continued
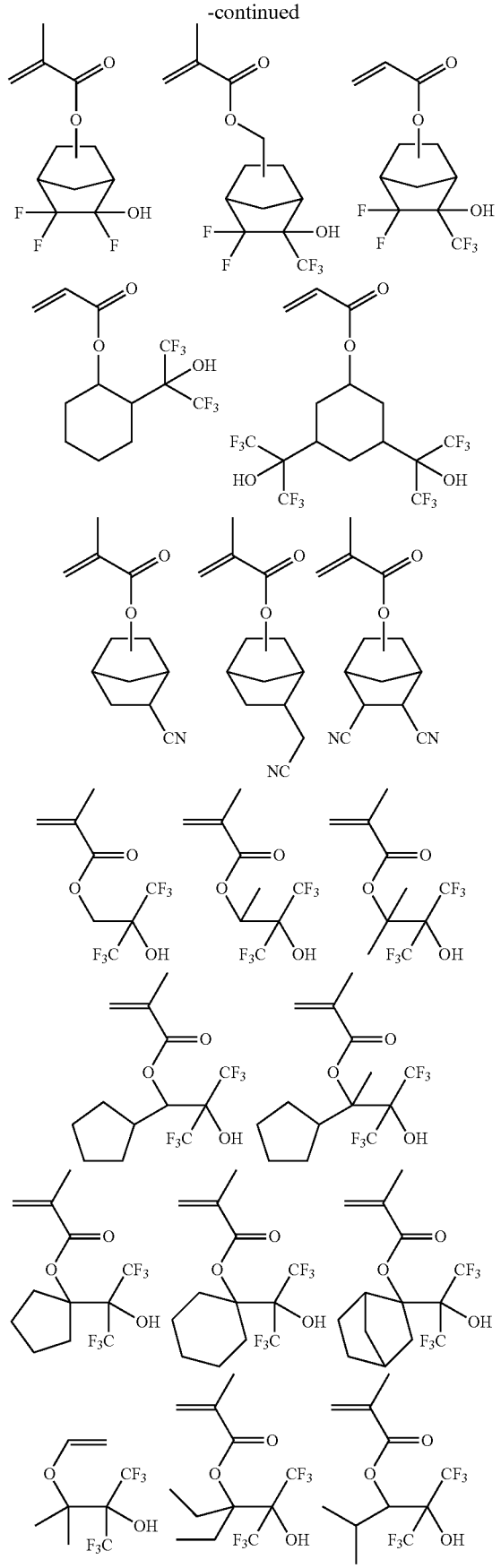
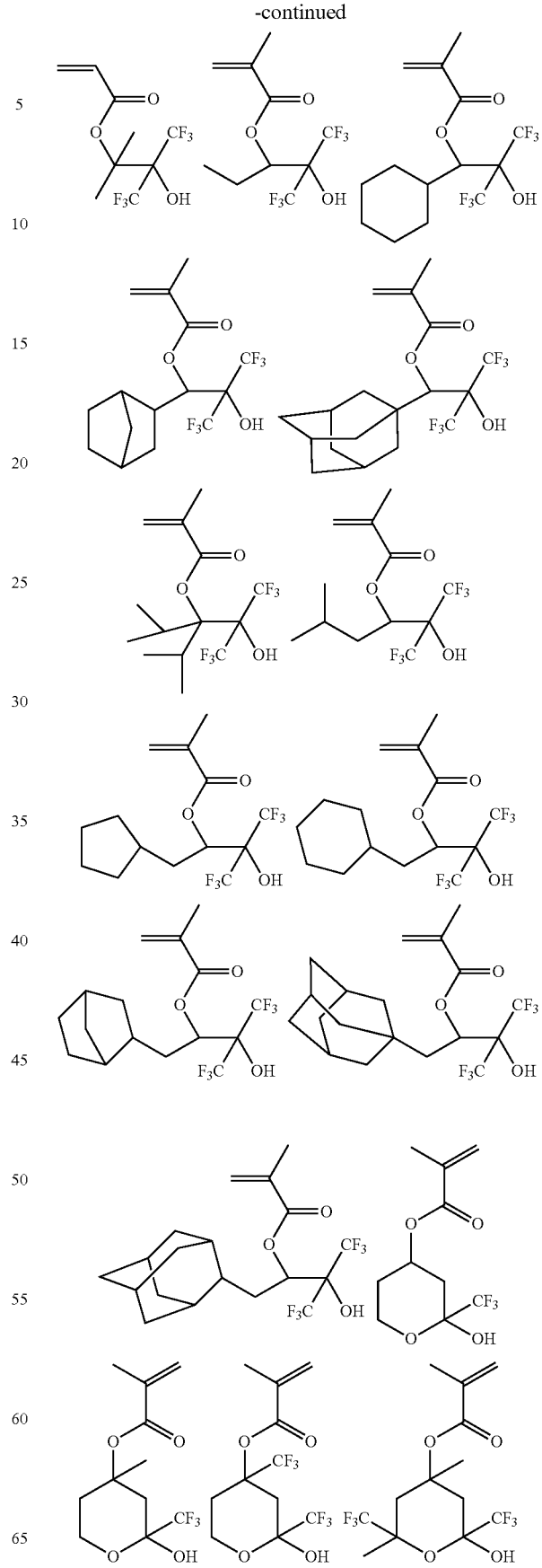

-continued
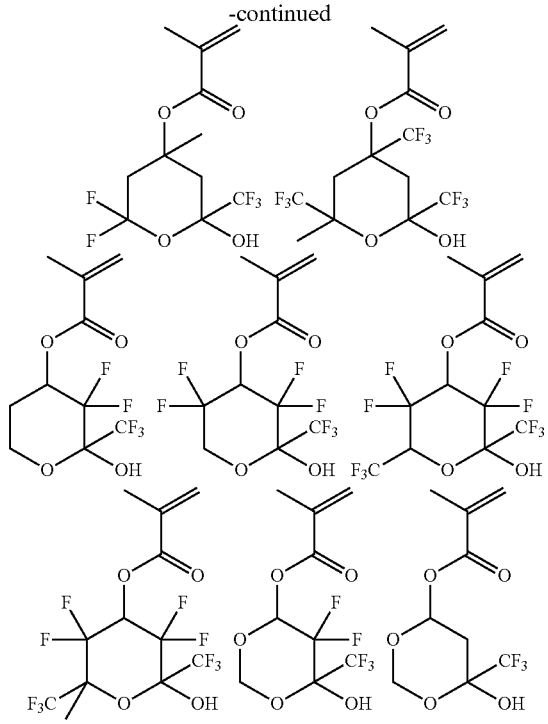
-continued
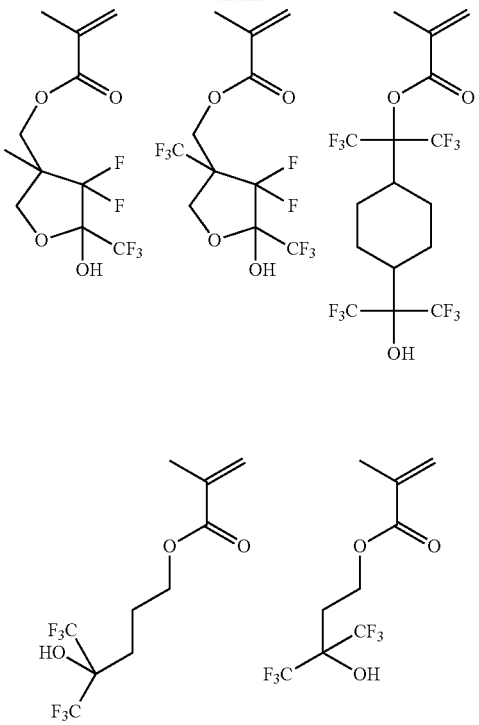
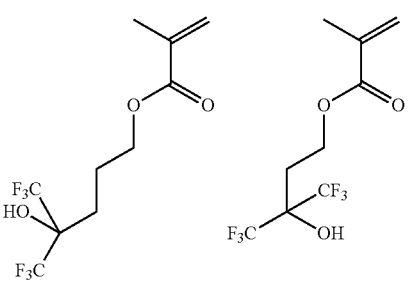
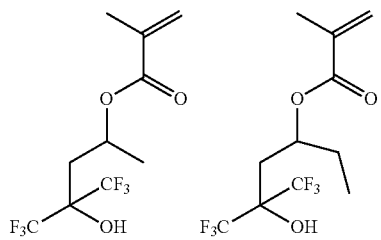
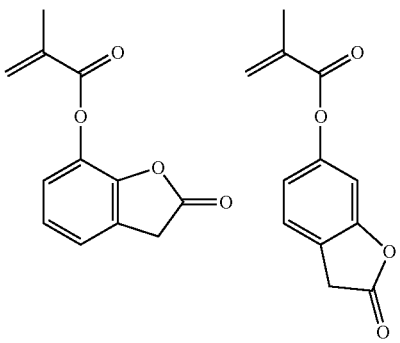
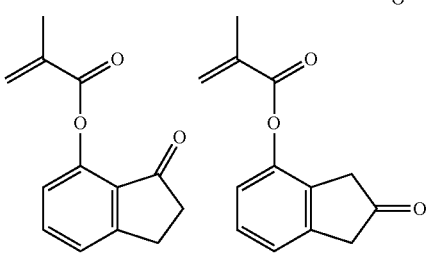

81
-continued
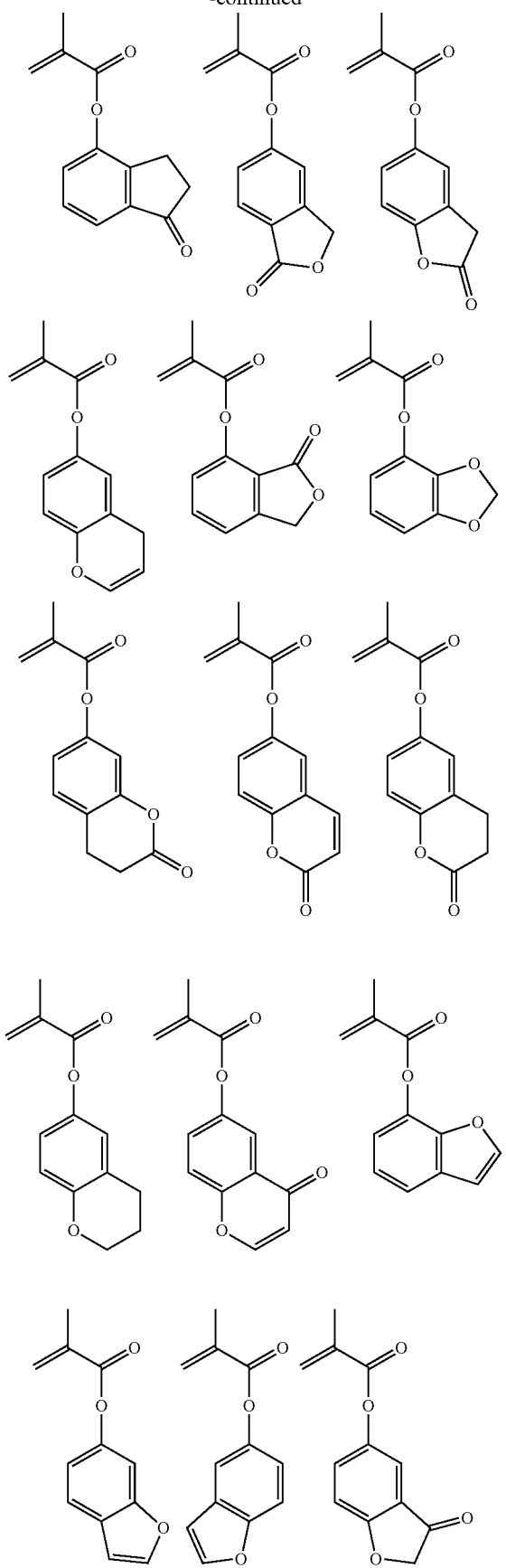
82
-continued
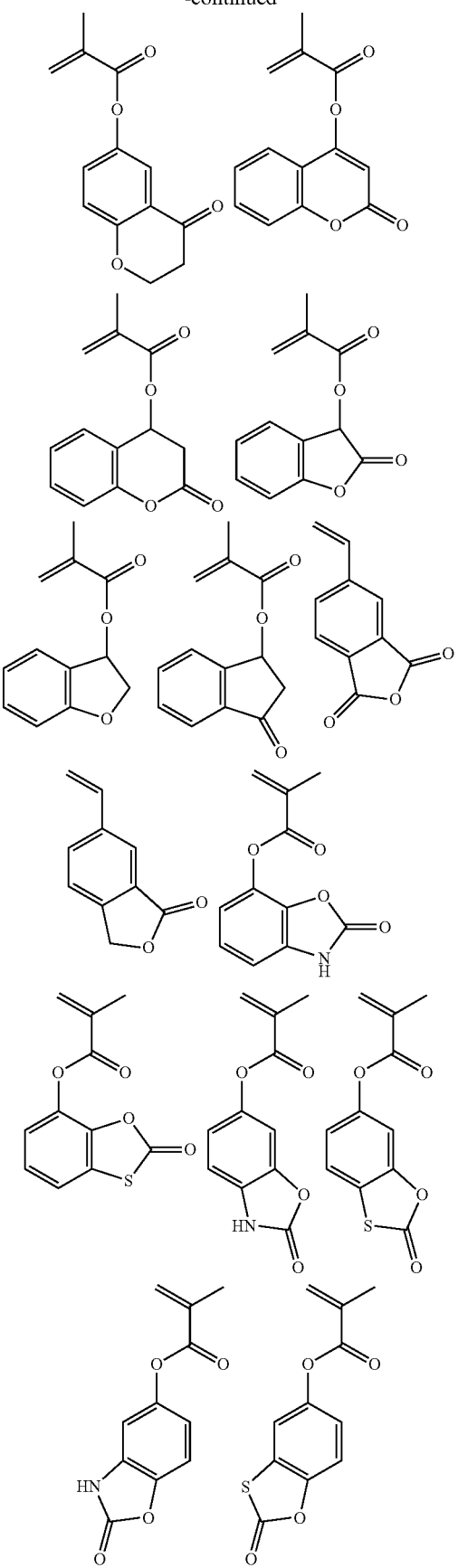

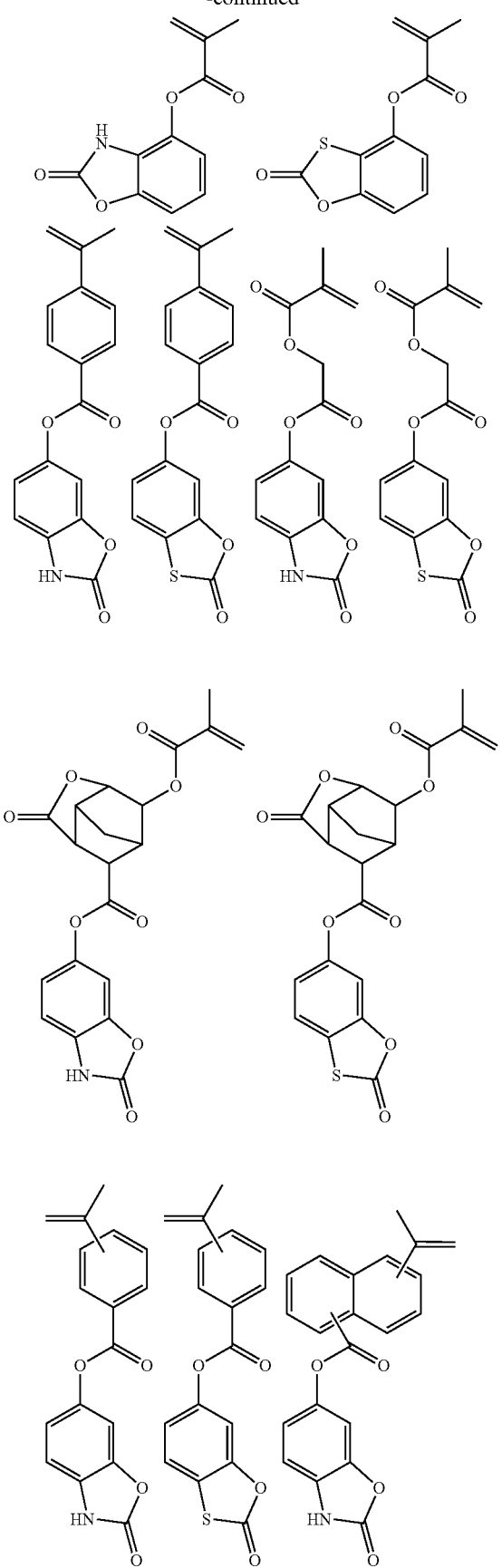
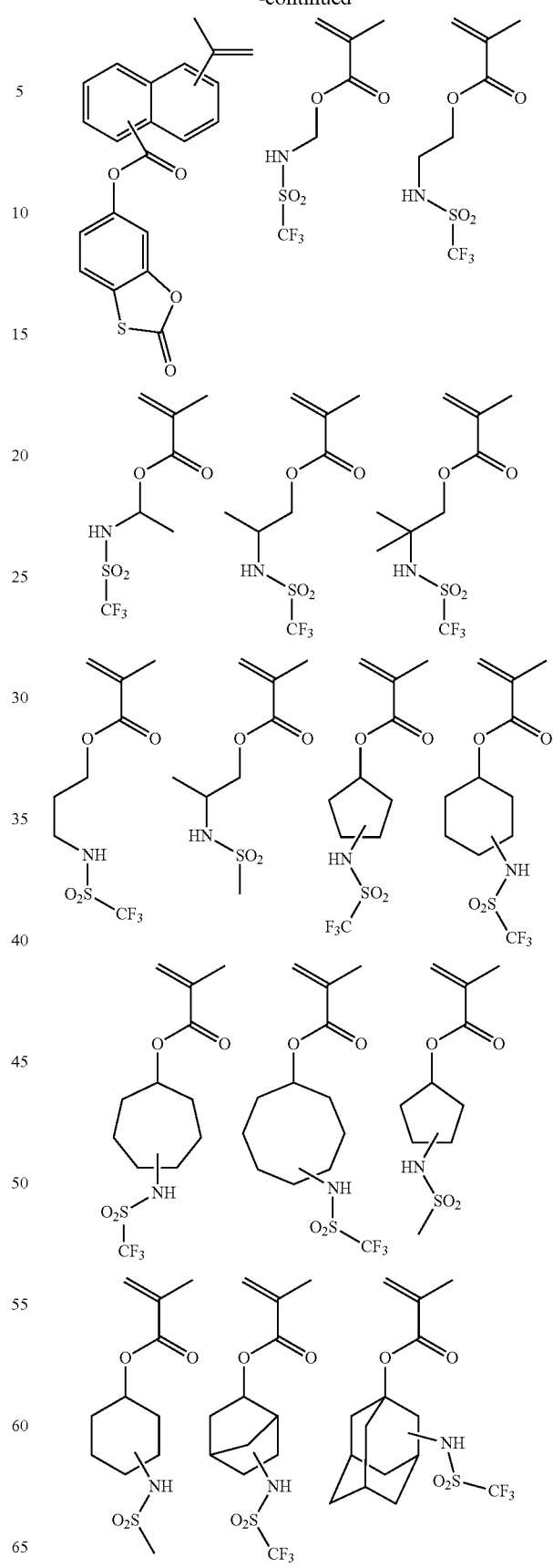

-continued

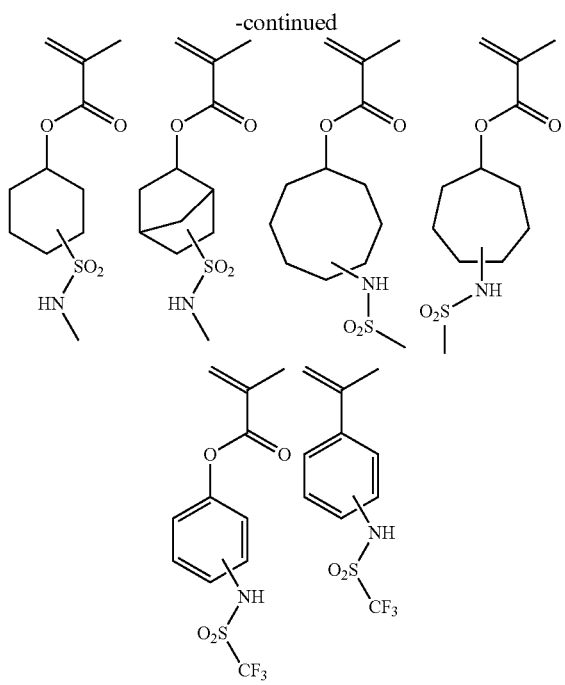

In the case of a monomer having a hydroxyl group, the hydroxyl group may be replaced by an acetal group susceptible to deprotection with acid, typically ethoxyethoxy, prior to polymerization, and the polymerization be followed by deprotection with weak acid and water. Alternatively, the hydroxy group may be replaced by an acetyl, formyl, pivaloyl or similar group prior to polymerization, and the polymerization be followed by alkaline hydrolysis.

In a more preferred embodiment, the polymer serving as base resin has further copolymerized therein recurring units (d) selected from units (d1) to (d5) of indene, acenaphthylene, chromone, coumarin, and norbornadiene, or derivatives thereof, represented by the following formula (5).

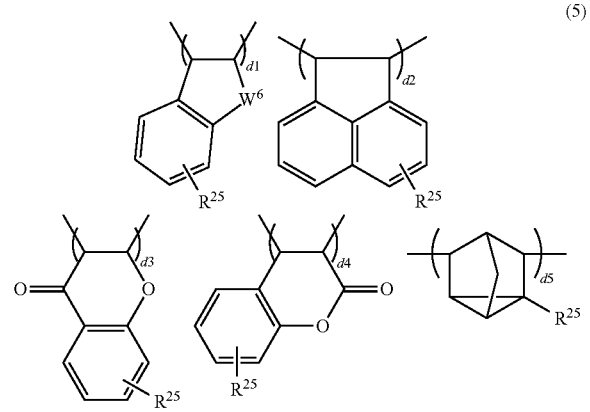

(5)

Herein $R^{25}$ is each independently hydrogen, a $C_1$-$C_{30}$ alkyl, haloalkyl, alkoxy, alkanoyl or alkoxycarbonyl group, $C_6$-$C_{10}$ aryl group, halogen, or 1,1,1,3,3,3-hexafluoro-2-propanol group, and $W^6$ is methylene, oxygen or sulfur. As used herein, the term "haloalkyl" refers to alkyl in which some or all hydrogen atoms are substituted by halogen.

Examples of suitable monomers from which recurring units (d1) to (d5) of indene, acenaphthylene, chromone, coumarin, and norbornadiene derivatives are derived are given below.

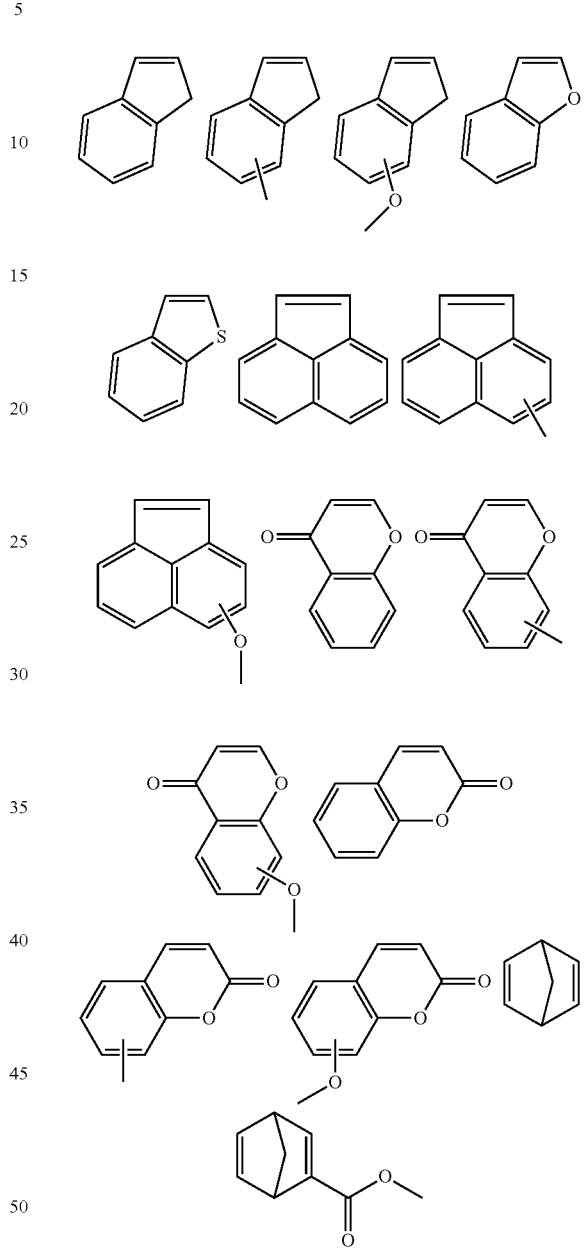

In a further embodiment, an acid generator (b) in the form of an onium salt having polymerizable olefin may be copolymerized with the foregoing monomers. JP-A H04-230645, JP-A 2005-084365, and JP-A 2006-045311 disclose sulfonium salts having polymerizable olefin capable of generating a specific sulfonic acid and similar iodonium salts. JP-A 2006-178317 discloses a sulfonium salt having sulfonic acid directly attached to the main chain.

In this embodiment, the polymer may have further copolymerized therein recurring units (b1) to (b3) having a sulfonium salt, represented by the following formula (3). Sometimes, units (b1) to (b3) are collectively referred to as units (b).

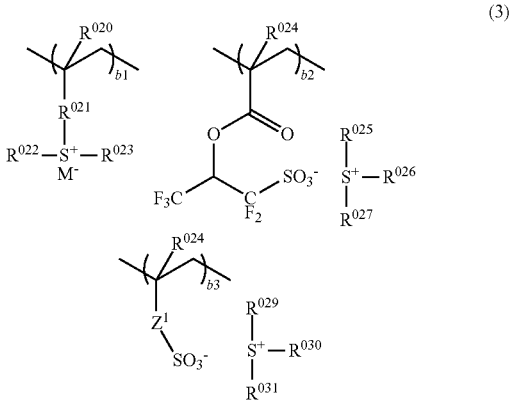 (3)

Herein $R^{020}$, $R^{024}$, and $R^{028}$ each are hydrogen or methyl. $R^{021}$ is a single bond, phenylene, —O—$R^{033}$—, or —C(=O)—Y—$R^{033}$—, wherein Y is oxygen or NH, and $R^{033}$ is a straight, branched or cyclic $C_1$-$C_6$ alkylene group, alkenylene or phenylene group, which may contain a carbonyl (—CO—), ester (—COO—), ether (—O—) or hydroxyl moiety. $R^{022}$, $R^{023}$, $R^{025}$, $R^{026}$, $R^{027}$, $R^{029}$, $R^{030}$, and $R^{031}$ are each independently a straight, branched or cyclic $C_1$-$C_{12}$ alkyl group which may contain a carbonyl, ester or ether moiety, or a $C_6$-$C_{12}$ aryl, $C_7$-$C_{20}$ aralkyl, or thiophenyl group. $Z^1$ is a single bond, methylene, ethylene, phenylene, fluorophenylene, —O—$R^{032}$—, or —C(=O)—$Z^2$—$R^{032}$—, wherein $Z^2$ is oxygen or NH, and $R^{032}$ is a straight, branched or cyclic $C_1$-$C_6$ alkylene group, alkenylene or phenylene group, which may contain a carbonyl, ester, ether or hydroxyl moiety. $M^-$ is a non-nucleophilic counter ion. Molar fractions b1, b2 and b3 are in the range of $0 \leq b1 \leq 0.3$, $0 \leq b2 \leq 0.3$, $0 \leq b3 \leq 0.3$, and $0 \leq b1+b2+b3 \leq 0.3$.

Examples of the non-nucleophilic counter ion represented by $M^-$ include halide ions such as chloride and bromide ions; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; alkylsulfonate ions such as mesylate and butanesulfonate; imidates such as bis(trifluoromethylsulfonyl)imide, bis(perfluoroethylsulfonyl)imide and bis(perfluorobutylsulfonyl)imide; methidates such as tris(trifluoromethylsulfonyl)methide and tris(perfluoroethylsulfonyl)methide.

The attachment of an acid generator to the polymer main chain is effective in restraining acid diffusion, thereby preventing a reduction of resolution due to blur by acid diffusion. Also edge roughness (LER or LWR) is improved since the acid generator is uniformly dispersed.

In the polymer, recurring units (a) to (d) may be incorporated in the following molar fraction:
$0 \leq a1 \leq 0.9$, $0 \leq a2 \leq 0.9$, $0 < a1+a2 < 1.0$, preferably $0 \leq a1 \leq 0.8$, $0 \leq a2 \leq 0.8$, $0.1 \leq a1+a2 \leq 0.8$, and more preferably $0 \leq a1 \leq 0.7$, $0 \leq a2 \leq 0.7$, $0.2 \leq a1+a2 \leq 0.7$;
$0 \leq b1 \leq 0.3$, $0 \leq b2 \leq 0.3$, $0 \leq b3 \leq 0.3$, and $0 \leq b (=b1+b2+b3) \leq 0.3$;
$0 \leq c < 1.0$, preferably $0 \leq c \leq 0.9$, and more preferably $0 \leq c \leq 0.8$;
$0 \leq d \leq 0.5$, preferably $0 \leq d \leq 0.4$, and more preferably $0 \leq d \leq 0.3$;
$0.5 \leq a1+a2+b1+b2+b3+c \leq 1.0$, preferably $0.6 \leq a1+a2+b1+b2+b3+c \leq 1.0$, more preferably $0.7 \leq a1+a2+b1+b2+b3+c \leq 1.0$; and $a1+a2+b1+b2+b3+c+d=1$.

The meaning of $a+b+c=1$, for example, is that in a polymer comprising recurring units (a), (b), and (c), the sum of recurring units (a), (b), and (c) is 100 mol % based on the total amount of entire recurring units. The meaning of $a+b+c<1$ is that the sum of recurring units (a), (b), and (c) is less than 100 mol % based on the total amount of entire recurring units, indicating the inclusion of other recurring units.

There have been described a copolymer of formula (1) as polymeric additive for modifying the resist film surface and an acid labile group-containing polymer of formula (2) as base resin. These polymers may be synthesized by any desired methods, for example, by dissolving one or more monomers selected from the monomers to form recurring units (p), (q) and (r) or recurring units (a) to (d) in an organic solvent, adding a radical polymerization initiator thereto, and effecting heat polymerization.

Examples of the organic solvent which can be used for polymerization include toluene, benzene, tetrahydrofuran, diethyl ether and dioxane. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably the system is heated at 50 to 80° C. for polymerization to take place. The reaction time is 2 to 100 hours, preferably 5 to 20 hours.

When hydroxyacenaphthylene is copolymerized, an alternative method is possible. Specifically, acetoxyacenaphthylene is used instead of hydroxyacenaphthylene, and after polymerization, the acetoxy group is deprotected by alkaline hydrolysis as mentioned above, for thereby converting the polymer product to hydroxypolyacenaphthylene. For alkaline hydrolysis, a base such as aqueous ammonia or triethylamine may be used. The reaction temperature is −20° C. to 100° C., preferably 0° C. to 60° C., and the reaction time is 0.2 to 100 hours, preferably 0.5 to 20 hours.

The polymer, which may be either the copolymer as polymeric additive or the polymer as base resin, should preferably have a weight average molecular weight (Mw) in the range of 1,000 to 500,000, and more preferably 2,000 to 30,000, as measured by GPC versus polystyrene standards. With too low a Mw, the resist composition may become less heat resistant. A polymer with too high a Mw may lose alkaline solubility and give rise to a footing phenomenon after pattern formation.

If a multi-component polymer has a wide molecular weight distribution or dispersity (Mw/Mn), which indicates the presence of lower and higher molecular weight polymer fractions, there is a possibility that foreign matter is left on the pattern or the pattern profile is degraded. The influences of molecular weight and dispersity become stronger as the pattern rule becomes finer. Therefore, the multi-component polymer should preferably have a narrow dispersity (Mw/Mn) of 1.0 to 2.0, especially 1.0 to 1.5, in order to provide a resist composition suitable for micropatterning to a small feature size.

It is understood that a mixture of two or more polymers which differ in compositional ratio, molecular weight or dispersity is acceptable as the base resin.

The resist composition is based on a blend of an alkali-soluble polymeric additive or copolymer comprising recurring units (p-1), (p-2), (q-1), (q-2) and (r) which segregates on the resist film surface after coating and functions to suppress outgassing from the resist film, to prevent formation of bridge and blob defects, and to minimize LWR, and an acid labile group-containing polymer or base polymer comprising recurring units (a1), (a2), (b1), (b2), (b3), (c) and (d) which turns soluble in alkaline developer under the action of acid. Typically the surface segregating polymeric additive is blended in an amount of 0.1 to 50 parts, preferably 0.2 to 30 parts, and more preferably 0.2 to 20 parts by weight per 100 parts by weight of the base polymer. Also typically, the surface segregating polymeric additive alone has an alkaline dissolution rate of 0.1 to 100,000 nm/s, preferably 1 to 50,000 nm/s, and more preferably 10 to 20,000 nm/s.

Resist Composition

The resist composition may include an acid generator in order for the composition to function as a chemically amplified positive resist composition. Typical of the acid generator used herein is a photoacid generator (PAG) capable of generating an acid in response to actinic light or radiation. It is any compound capable of generating an acid upon exposure to high-energy radiation. Suitable PAGs include sulfonium salts, iodonium salts, sulfonyldiazomethane, N-sulfonyloxyimide, and oxime-O-sulfonate acid generators. The acid generators may be used alone or in admixture of two or more. Exemplary acid generators are described in U.S. Pat. No. 7,537,880 (JP-A 2008-111103, paragraphs [0122] to [0142]). In the embodiment wherein a polymer having recurring units (b) copolymerized therein is used as the base resin, the PAG may be omitted.

The resist composition may further comprise an organic solvent, basic compound, dissolution regulator, surfactant, and acetylene alcohol, alone or in combination.

Examples of the organic solvent used herein are described in JP-A 2008-111103, paragraphs [0144] to [0145] (U.S. Pat. No. 7,537,880). Specifically, exemplary solvents include ketones such as cyclohexanone and methyl-2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone, and mixtures thereof.

Exemplary basic compounds are described in JP-A 2008-111103, paragraphs [0146] to [0164], for example, primary, secondary and tertiary amine compounds, specifically amine compounds having a hydroxyl, ether, ester, lactone, cyano or sulfonate group. Exemplary surfactants are described in JP-A 2008-111103, paragraphs [0165] to [0166]. Exemplary dissolution regulators are described in JP-A 2008-122932 (US 2008090172), paragraphs [0155] to [0178], and exemplary acetylene alcohols in paragraphs [0179] to [0182]. Also useful are quenchers of polymer type as described in JP-A 2008-239918. The polymeric quencher segregates at the resist surface after coating and thus enhances the rectangularity of resist pattern. When a protective film is applied as is often the case in the immersion lithography, the polymeric quencher is also effective for preventing any film thickness loss of resist pattern or rounding of pattern top.

An appropriate amount of the acid generator used is 0.01 to 100 parts, and preferably 0.1 to 80 parts. An appropriate amount of the organic solvent used is 50 to 10,000 parts, especially 100 to 5,000 parts. The dissolution regulator may be blended in an amount of 0 to 50 parts, preferably 0 to 40 parts, the basic compound in an amount of 0 to 100 parts, preferably 0.001 to 50 parts, and the surfactant in an amount of 0 to 10 parts, preferably 0.0001 to 5 parts. All amounts are expressed in parts by weight relative to 100 parts by weight of the base resin.

Process

The resist composition, typically chemically amplified positive resist composition comprising a polymeric additive of formula (1), an acid labile group-containing polymer of formula (2), an acid generator, and a basic compound in an organic solvent is used in the fabrication of various integrated circuits. Pattern formation using the resist composition may be performed by well-known lithography processes. The process generally involves coating, prebake, exposure, bake (PEB), and development. If necessary, any additional steps may be added.

The resist composition is first applied onto a substrate on which an integrated circuit is to be formed (e.g., Si, $SiO_2$, SiN, SiON, TiN, WSi, BPSG, SOG, or organic antireflective coating) or a substrate on which a mask circuit is to be formed (e.g., Cr, CrO, CrON, MoSi, or $SiO_2$) by a suitable coating technique such as spin coating, roll coating, flow coating, dip coating, spray coating or doctor coating. The coating is prebaked on a hot plate at a temperature of 60 to 150° C. for 10 seconds to 30 minutes, preferably 80 to 120° C. for 30 seconds to 20 minutes. The resulting resist film is generally 0.1 to 2.0 μm thick.

The resist film is then exposed to a desired pattern of high-energy radiation such as UV, deep-UV, EB, x-ray, excimer laser light, γ-ray, synchrotron radiation or EUV (soft x-ray), directly or through a mask. The exposure dose is preferably about 1 to 200 $mJ/cm^2$, more preferably about 10 to 100 $mJ/cm^2$, or 0.1 to 100 $\mu C/cm^2$, more preferably 0.5 to 50 $\mu C/cm^2$. The resist film is further baked (PEB) on a hot plate at 60 to 150° C. for 10 seconds to 30 minutes, preferably 80 to 120° C. for 30 seconds to 20 minutes.

Thereafter the resist film is developed in a developer in the form of an aqueous base solution for 3 seconds to 3 minutes, preferably 5 seconds to 2 minutes by conventional techniques such as dip, puddle or spray techniques. Suitable developers are 0.1 to 10 wt %, preferably 2 to 10 wt %, more preferably 2 to 8 wt % aqueous solutions of tetramethylammonium hydroxide (TMAH), tetraethylammonium hydroxide (TEAH), tetrapropylammonium hydroxide (TPAH) and tetrabutylammonium hydroxide (TBAH). The resist film in the exposed area is dissolved in the developer whereas the resist film in the unexposed area is not dissolved. In this way, the desired positive pattern is formed on the substrate. It is appreciated that the resist composition of the invention is best suited for micro-patterning using such high-energy radiation as EB, EUV (soft x-ray), x-ray, γ-ray and synchrotron radiation among others.

Although TMAH aqueous solution is generally used as the developer, TEAH, TPAH and TBAH having a longer alkyl chain are effective in inhibiting the resist film from being swollen during development and thus preventing pattern collapse. JP 3429592 describes an example using an aqueous TBAH solution for the development of a polymer comprising recurring units having an alicyclic structure such as adamantane methacrylate and recurring units having an acid labile group such as t-butyl methacrylate, the polymer being water repellent due to the absence of hydrophilic groups.

The TMAH developer is most often used as 2.38 wt % aqueous solution, which corresponds to 0.26N. The TEAH, TPAH, and TBAH aqueous solutions should preferably have an equivalent normality. The concentration of TEAH, TPAH, and TBAH that corresponds to 0.26N is 3.84 wt %, 5.31 wt %, and 6.78 wt %, respectively.

When a pattern with a line size of 32 nm or less is resolved by the EB and EUV lithography, there arises a phenomenon that lines become wavy, lines merge together, and merged lines collapse. It is believed that this phenomenon occurs because lines are swollen in the developer and the thus expanded lines merge together. Since the swollen lines containing liquid developer are as soft as sponge, they readily collapse under the stress of rinsing. For this reason, the developer using a long-chain alkyl developing agent is effective for preventing film swell and hence, pattern collapse.

Alternatively, a negative tone pattern may be formed by organic solvent development. The organic solvent used as the developer is preferably selected from 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, isoamyl acetate, butenyl acetate, phenyl acetate, propyl formate, butyl formate, isobutyl formate, amyl formate, isoamyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, benzyl acetate, methyl phenylacetate, benzyl formate, phenylethyl formate, methyl 3-phenylpropionate, benzyl propionate, ethyl phenylacetate, and 2-phenylethyl acetate. These organic solvents may be used alone or in admixture of two or more.

At the end of organic solvent development, the resist film is rinsed. As the rinsing liquid, a solvent which is miscible with the developer and does not dissolve the resist film is preferred. Suitable solvents include alcohols of 3 to 10 carbon atoms, ether compounds of 8 to 12 carbon atoms, alkanes, alkenes, and alkynes of 6 to 12 carbon atoms, and aromatic solvents. Specifically, suitable alkanes of 6 to 12 carbon atoms include hexane, heptane, octane, nonane, decane, undecane, dodecane, methylcyclopentane, dimethylcyclopentane, cyclohexane, methylcyclohexane, dimethylcyclohexane, cycloheptane, cyclooctane, and cyclononane. Suitable alkenes of 6 to 12 carbon atoms include hexene, heptene, octene, cyclohexene, methylcyclohexene, dimethylcyclohexene, cycloheptene, and cyclooctene. Suitable alkynes of 6 to 12 carbon atoms include hexyne, heptyne, and octyne. Suitable alcohols of 3 to 10 carbon atoms include n-propyl alcohol, isopropyl alcohol, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether compounds of 8 to 12 carbon atoms include di-n-butyl ether, diisobutyl ether, di-sec-butyl ether, di-n-pentyl ether, diisopentyl ether, di-sec-pentyl ether, di-tert-amyl ether, and di-n-hexyl ether. The solvents may be used alone or in admixture. Besides the foregoing solvents, aromatic solvents may be used, for example, toluene, xylene, ethylbenzene, isopropylbenzene, tert-butylbenzene and mesitylene.

EXAMPLE

Examples and Comparative Examples are given below for further illustrating the invention, but they should not be construed as limiting the invention thereto. Mw is a weight average molecular weight as measured by GPC versus polystyrene standards, and Mw/Mn designates molecular weight distribution or dispersity. All parts (pbw) are by weight.
Preparation of Copolymers Various copolymers (Copolymers 1 to 13) to be added to resist compositions were prepared by combining suitable monomers, effecting copolymerization reaction in methyl ethyl ketone solvent, pouring into hexane for crystallization, repeatedly washing with hexane, isolation, and drying. The copolymers were analyzed by $^1$H-NMR to determine their composition and by GPC to determine Mw and dispersity Mw/Mn.

Copolymer 1

Mw=8,300

Mw/Mn=1.85

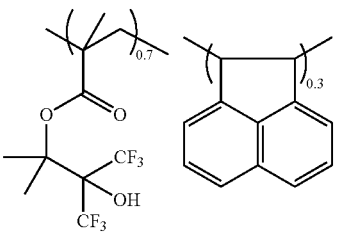

Copolymer 1

Copolymer 2

Mw=8,100

Mw/Mn=1.82

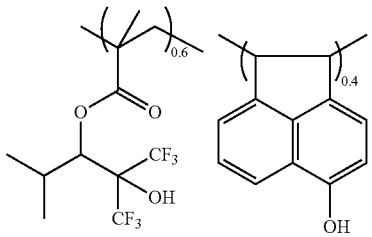

Copolymer 2

Copolymer 3

Mw=7,200

Mw/Mn=1.69

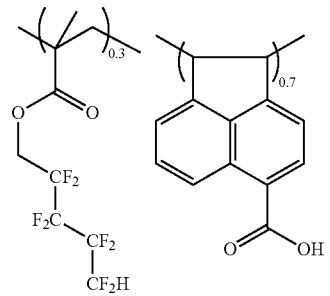

Copolymer 3

Copolymer 4
Mw=8,000
Mw/Mn=1.80
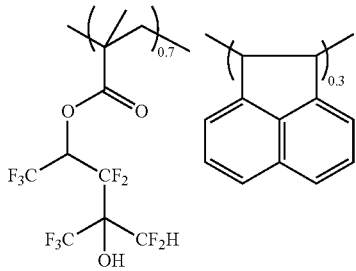
Copolymer 4
Copolymer 5
Mw=8,100
Mw/Mn=1.74
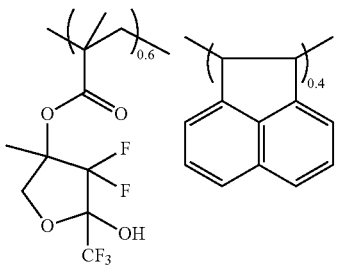
Copolymer 5
Copolymer 6
Mw=9,200
Mw/Mn=1.84
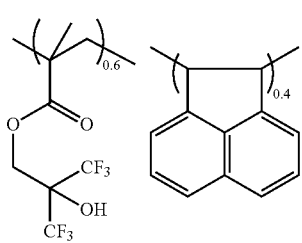
Copolymer 6
Copolymer 7
Mw=6,800
Mw/Mn=1.65
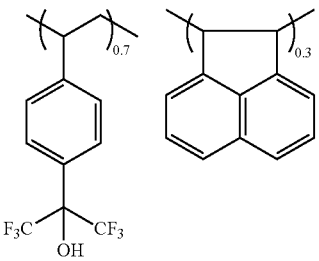
Copolymer 7
Copolymer 8
Mw=6,300
Mw/Mn=1.69
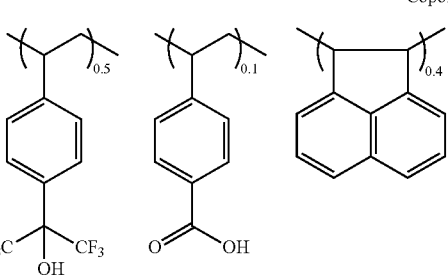
Copolymer 8
Copolymer 9
Mw=6,800
Mw/Mn=1.65
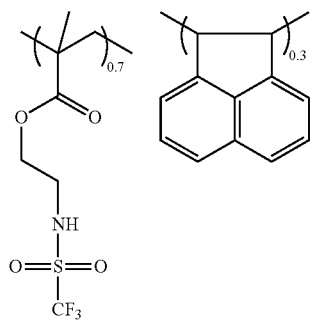
Copolymer 9

Copolymer 10
 Mw=6,100
 Mw/Mn=1.88

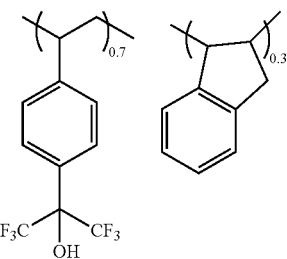

Copolymer 11
 Mw=6,600
 Mw/Mn=1.89

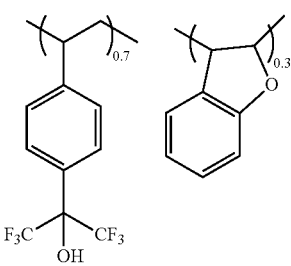

Copolymer 12
 Mw=6,300
 Mw/Mn=1.93

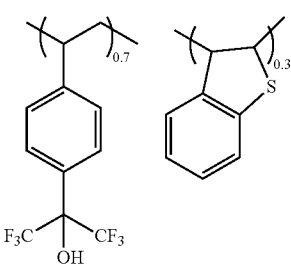

Copolymer 13
 Mw=6,300
 Mw/Mn=1.93

Copolymer 10

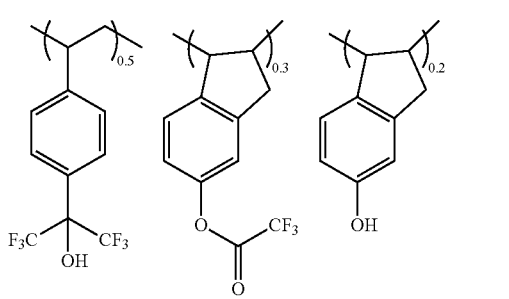

Copolymer 11

Copolymer 12

Examples and Comparative Examples

Preparation of Resist Composition

A positive resist composition in solution form was prepared by dissolving a resist film surface-modifying copolymer (Copolymers 1 to 13, shown above), a polymer obtained by conventional radical polymerization (Resist Polymers 1 to 5, shown below) and components in a solvent in accordance with the formulation of Table 1 and filtering through a filter with a pore size of 0.2 μm.

EUV Lithography Patterning Test

On a silicon substrate having a diameter of 4 inches, a silicon-containing SOG film of SHB-A940 (Shin-Etsu Chemical Co., Ltd.) was formed to a thickness of 35 nm. The positive resist composition was coated on the SOG film and prebaked on a hot plate at 110° C. for 60 seconds to form a resist film of 35 nm thick. The resist film was exposed to EUV through a pseudo phase-shift-mask (PSM) in an exposure tool (NA 0.3), baked (PEB) at the temperature shown in Table 2, developed in 0.20N tetrabutylammonium hydroxide (TBAH) aqueous solution for 30 seconds, rinsed with deionized water, and spin dried, forming a resist pattern. Sensitivity is the dose at which a 20-nm line-and-space pattern was formed. Maximum resolution is the minimum size which was resolved at that dose. The pattern was measured for edge roughness (LWR) under SEM. The results are shown in Table 2.

Outgassing Test Simulated for EUV Lithography

The resist composition (see Table 3) was coated onto a HMDS-primed 12-inch wafer to form a resist film of 60 nm thick. Using a resist outgassing tool (EUV Tech), the resist film was exposed to EB in a varying dose, baked (PEB) at the temperature shown in Table 3, and developed in an alkaline developer (2.38 wt % TMAH aqueous solution). E0 is the dose at which the film thickness became 0 nm. After the wafer was subjected to flood exposure at the dose of E0, the thickness of contaminants deposited on Witness Plate was measured by spectral ellipsometry. The results are shown in Table 3.

Resist Polymer 1
Mw=6,700
Mw/Mn=1.58
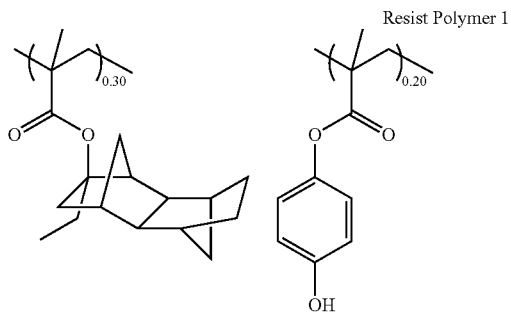
Resist Polymer 1
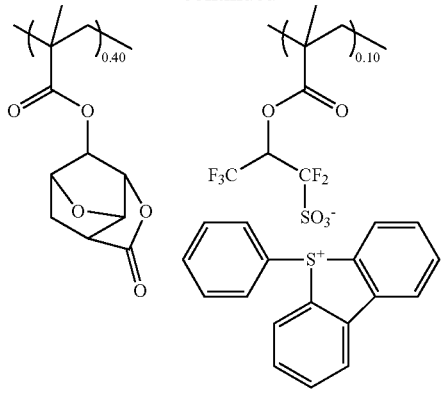
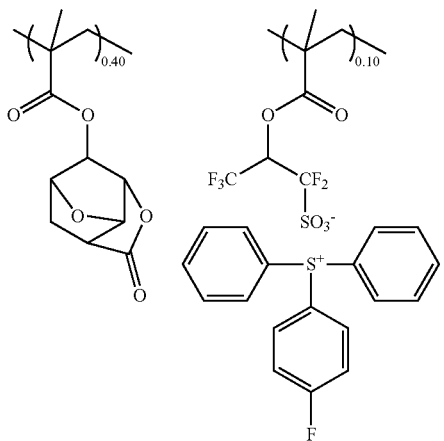
Resist Polymer 2
Mw=6,900
Mw/Mn=1.68
Resist Polymer 2
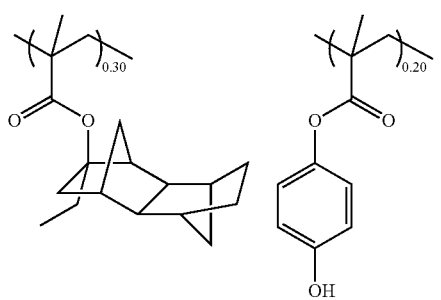
-continued
Resist Polymer 3
Mw=6,200
Mw/Mn=1.81
Resist Polymer 3
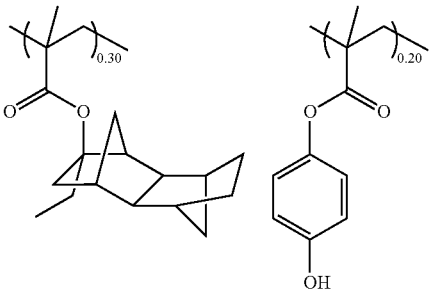
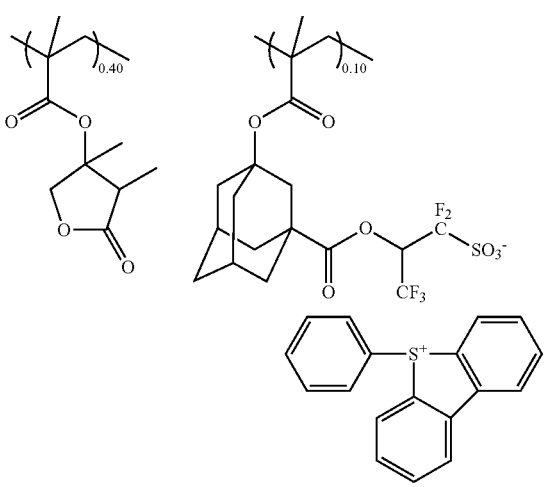

Resist Polymer 4
 Mw=7,200
 Mw/Mn=1.52
Resist Polymer 4
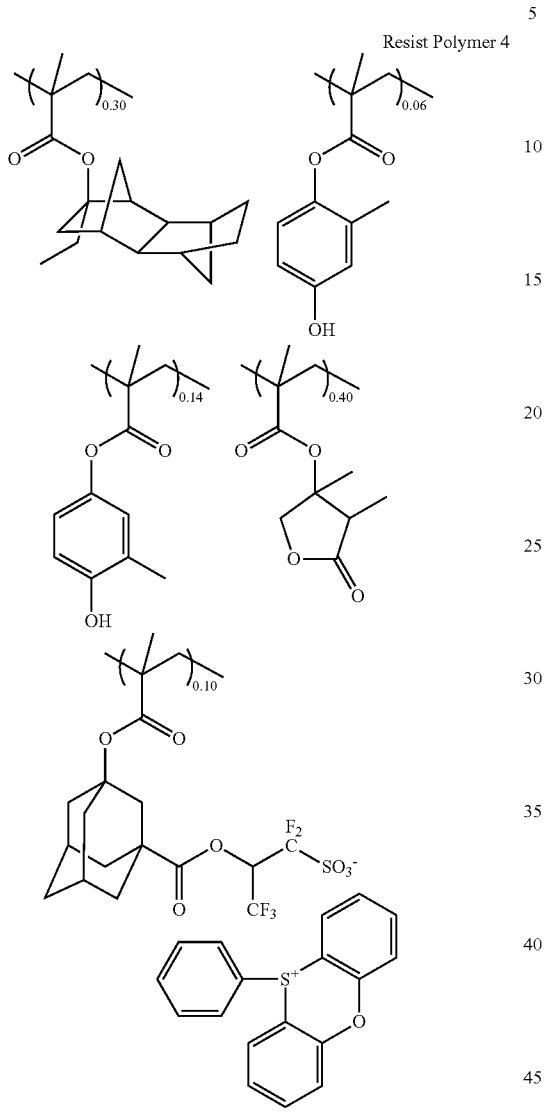
Resist Polymer 5
 Mw=5,200
 Mw/Mn=1.61
Resist Polymer 5
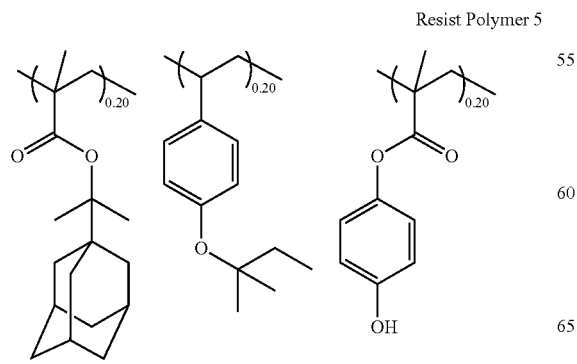
-continued
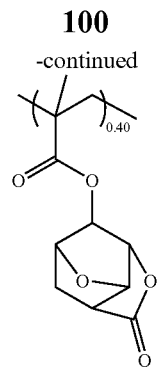
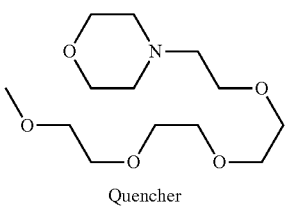
Quencher
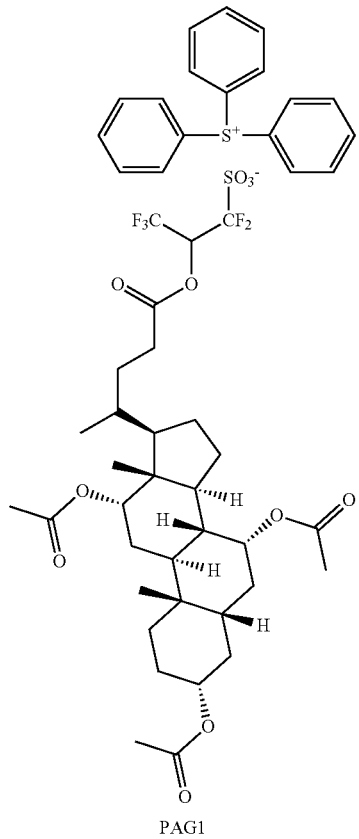
PAG1

TABLE 1

|  | Polymer (pbw) | PAG (pbw) | Quencher (pbw) | Additive (pbw) | Surfactant (pbw) | Solvent (pbw) |
|---|---|---|---|---|---|---|
| Resist 1 | Resist Polymer 1 (100) | — | Quencher (1.123) | Copolymer 1 (5.0) | FC-4430 (0.001) | PGMEA (2,000) PGME (1,000) CyH (3,000) |
| Resist 2 | Resist Polymer 2 (100) | — | Quencher (1.123) | Copolymer 1 (5.0) | FC-4430 (0.001) | PGMEA (2,000) PGME (1,000) CyH (3,000) |
| Resist 3 | Resist Polymer 3 (100) | — | Quencher (1.123) | Copolymer 1 (5.0) | FC-4430 (0.001) | PGMEA (2,000) PGME (1,000) CyH (3,000) |
| Resist 4 | Resist Polymer 4 (100) | — | Quencher (1.123) | Copolymer 1 (5.0) | FC-4430 (0.001) | PGMEA (2,000) PGME (1,000) CyH (3,000) |
| Resist 5 | Resist Polymer 5 (100) | PAG 1 (25) | Quencher (1.123) | Copolymer 1 (5.0) | FC-4430 (0.001) | PGMEA (4,000) CyH (2,000) |
| Resist 6 | Resist Polymer 1 (100) | — | Quencher (1.123) | Copolymer 2 (5.0) | FC-4430 (0.001) | PGMEA (2,000) PGME (1,000) CyH (3,000) |
| Resist 7 | Resist Polymer 1 (100) | — | Quencher (1.123) | Copolymer 3 (5.0) | FC-4430 (0.001) | PGMEA (2,000) PGME (1,000) CyH (3,000) |
| Resist 8 | Resist Polymer 1 (100) | — | Quencher (1.123) | Copolymer 4 (5.0) | FC-4430 (0.001) | PGMEA (2,000) PGME (1,000) CyH (3,000) |
| Resist 9 | Resist Polymer 1 (100) | — | Quencher (1.123) | Copolymer 5 (5.0) | FC-4430 (0.001) | PGMEA (2,000) PGME (1,000) CyH (3,000) |
| Resist 10 | Resist Polymer 1 (100) | — | Quencher (1.123) | Copolymer 6 (5.0) | FC-4430 (0.001) | PGMEA (2,000) PGME (1,000) CyH (3,000) |
| Resist 11 | Resist Polymer 1 (100) | — | Quencher (1.123) | Copolymer 7 (5.0) | FC-4430 (0.001) | PGMEA (2,000) PGME (1,000) CyH (3,000) |
| Resist 12 | Resist Polymer 1 (100) | — | Quencher (1.123) | Copolymer 8 (5.0) | FC-4430 (0.001) | PGMEA (2,000) PGME (1,000) CyH (3,000) |
| Resist 13 | Resist Polymer 1 (100) | — | Quencher (1.123) | Copolymer 9 (5.0) | FC-4430 (0.001) | PGMEA (2,000) PGME (1,000) CyH (3,000) |
| Resist 14 | Resist Polymer 1 (100) | — | Quencher (1.123) | Copolymer 10 (5.0) | FC-4430 (0.001) | PGMEA (2,000) PGME (1,000) CyH (3,000) |
| Resist 15 | Resist Polymer 1 (100) | — | Quencher (1.123) | Copolymer 11 (5.0) | FC-4430 (0.001) | PGMEA (2,000) PGME (1,000) CyH (3,000) |
| Resist 16 | Resist Polymer 1 (100) | — | Quencher (1.123) | Copolymer 12 (5.0) | FC-4430 (0.001) | PGMEA (2,000) PGME (1,000) CyH (3,000) |
| Resist 17 | Resist Polymer 1 (100) | — | Quencher (1.123) | Copolymer 13 (5.0) | FC-4430 (0.001) | PGMEA (2,000) PGME (1,000) CyH (3,000) |
| Comparative Resist 1 | Resist Polymer 1 (100) | — | Quencher (1.123) | — | FC-4430 (0.001) | PGMEA (2,000) PGME (1,000) CyH (3,000) |

PGMEA: propylene glycol monomethyl ether acetate
PGME: propylene glycol monomethyl ether
CyH: cyclohexanone
FC-4430: fluorochemical surfactant by 3M-Sumitomo Co., Ltd.

TABLE 2

|  | PEB temp. (° C.) | Sensitivity (mJ/cm$^2$) | Maximum resolution (nm) | LWR (nm) |
|---|---|---|---|---|
| Resist 1 | 90 | 15 | 17 | 4.0 |
| Resist 2 | 85 | 16 | 18 | 4.3 |
| Resist 3 | 85 | 17 | 17 | 3.9 |
| Resist 4 | 85 | 17 | 17 | 3.8 |
| Resist 5 | 85 | 15 | 16 | 5.0 |
| Resist 6 | 90 | 15 | 17 | 4.2 |
| Resist 7 | 90 | 15 | 17 | 4.3 |
| Resist 8 | 90 | 15 | 17 | 4.0 |
| Resist 9 | 90 | 15 | 17 | 4.0 |
| Resist 10 | 90 | 15 | 17 | 4.0 |
| Resist 11 | 90 | 15 | 17 | 4.1 |
| Resist 12 | 90 | 15 | 17 | 4.0 |
| Resist 13 | 90 | 15 | 17 | 4.1 |
| Resist 14 | 90 | 16 | 17 | 4.1 |
| Resist 15 | 90 | 17 | 17 | 4.2 |
| Resist 16 | 90 | 15 | 17 | 4.3 |
| Resist 17 | 90 | 15 | 17 | 4.6 |
| Comparative Resist 1 | 90 | 15 | 20 | 6.0 |

TABLE 3

| | PEB temp. (° C.) | Contamination thickness (nm) |
|---|---|---|
| Resist 1 | 90 | 1.0 |
| Comparative Resist 1 | 90 | 2.5 |

Japanese Patent Application No. 2012-194741 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A resist composition comprising
a polymer capable of increasing alkali solubility under the action of acid, as a base resin and
a copolymer comprising recurring units derived from at least one monomer selected from the group consisting of indene, benzofuran, and benzothiophene, and recurring units having at least one fluorine atom, as a polymeric additive,
said copolymer having the general formula (1):

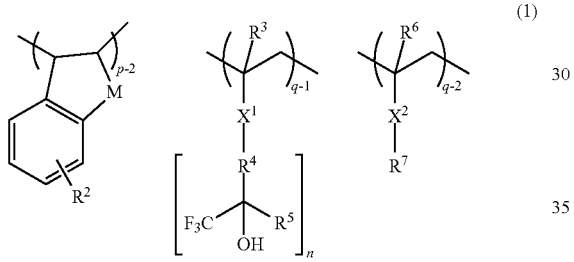

wherein $R^2$ is hydrogen, or $C_1$-$C_4$ straight or branched alkyl, alkoxy, acyloxy, hydroxyl, carboxyl, alkoxycarbonyl, or —OC(=O)R, wherein R is a $C_1$-$C_6$ straight or branched alkyl or fluoroalkyl group, $R^3$ and $R^6$ each are hydrogen or methyl, $X^2$ is a single bond, —O—, —C(=O)—O—$R^8$— or —C(=O)—NH—$R^8$—, wherein $R^8$ is a single bond or a $C_1$-$C_4$ straight or branched alkylene group which may contain an ester or ether moiety, n is 1 or 2, in case of n=1, $X^1$ is a single bond, —O—, —C(=O)—O—$R^8$— or —C(=O)—NH—$R^8$—, wherein $R^8$ is a single bond or a $C_1$-$C_4$ straight or branched alkylene group which may be substituted with fluorine and which may contain an ester or ether moiety, in case of n=2, $X^1$ is —C(=O)—O—$R^9$= or —C(=O)—NH—$R^9$=, wherein $R^9$ is a trivalent group obtained by eliminating one hydrogen from a $C_1$-$C_{10}$ straight, branched or cyclic alkylene group, which may be substituted with fluorine and which may contain an ester or ether moiety, $R^4$ is a $C_1$-$C_{12}$ straight, branched or cyclic alkylene group, phenylene group, or a combination thereof, which may be substituted with fluorine and which may contain an ester or ether moiety, $R^5$ is hydrogen, fluorine, methyl, trifluoromethyl or difluoromethyl, or $R^5$ may bond with $R^4$ to form a ring which may have an ether, fluorinated alkylene or trifluoromethyl moiety, $R^7$ is a $C_1$-$C_{20}$ straight, branched or cyclic alkyl group which is substituted with at least one fluorine atom and which may contain an ether, ester or sulfonamide moiety, M is a methylene group, oxygen atom or sulfur atom, subscripts p-2, q-1 and q-2 are numbers in the range: 0<(p-2)<1.0, 0≤(q-1)<1.0, 0≤(q-2)<1.0, 0<(q-1)+(q-2)<1.0 and 0.5≤(p-2)+(q-1)+(q-2)≤1.0.

2. The resist composition of claim 1 wherein the polymer serving as a base resin comprises recurring units having an acid labile group and recurring units having a hydroxyl group and/or lactone ring as an adhesive group.

3. A pattern forming process comprising the steps of applying the resist composition of claim 1 onto a substrate to form a coating, baking, exposing the coating to high-energy radiation, and developing the exposed coating in a developer.

4. The process of claim 3 wherein the high-energy radiation is KrF excimer laser of wavelength 248 nm, ArF excimer laser of wavelength 193 nm, electron beam or soft x-ray of wavelength 3 to 15 nm.

5. The process of claim 3 wherein the high-energy radiation is soft x-ray of wavelength 3 to 15 nm.

6. A resist composition comprising
a polymer capable of increasing alkali solubility under the action of acid, as a base resin and
a copolymer comprising recurring units derived from at least one monomer selected from the group consisting of acenaphthylene, and recurring units having at least one fluorine atom, as a polymeric additive,
said copolymer having the general formula (1):

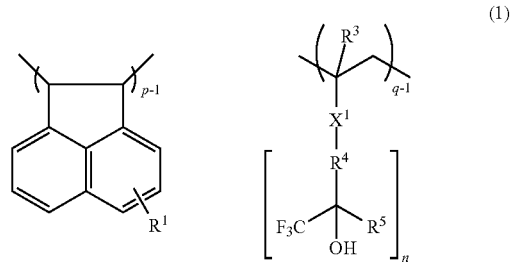

wherein $R^1$ is hydrogen, or $C_1$-$C_4$ straight or branched alkyl, alkoxy, acyloxy, hydroxyl, carboxyl, alkoxycarbonyl, or —OC(=O)R, wherein R is a $C_1$-$C_6$ straight or branched alkyl or fluoroalkyl group, $R^3$ is hydrogen or methyl, n is 1 or 2, in case of n=1, $X^1$ is a single bond, —O—, —C(=O)—O—$R^8$— or —C(=O)—NH—$R^8$—, wherein $R^8$ is a single bond or a $C_1$-$C_4$ straight or branched alkylene group which may be substituted with fluorine and which may contain an ester or ether moiety, in case of n=2, $X^1$ is —C(=O)—O—$R^9$= or —C(=O)—NH—$R^9$=, wherein $R^9$ is a trivalent group obtained by eliminating one hydrogen from a $C_1$-$C_{10}$ straight, branched or cyclic alkylene group, which may be substituted with fluorine and which may contain an ester or ether moiety, $R^4$ is a $C_1$-$C_{12}$ straight, branched or cyclic alkylene group, phenylene group, or a combination thereof, which may be substituted with fluorine and which may contain an ester or ether moiety, $R^5$ is hydrogen, fluorine, methyl, trifluoromethyl or difluoromethyl, or $R^5$ may bond with $R^4$ to form a ring which may have an ether, fluorinated alkylene or trifluoromethyl moiety, subscripts p-1 and q-1 are numbers in the range: $0<(p-1)<1.0$, $0<(q-1)<1.0$, and $0.5\leq(p-1)+(q-1)\leq1.0$.

7. A pattern forming process comprising the steps of applying the resist composition of claim 6 onto a substrate to form a coating, baking, exposing the coating to high-energy radiation, and developing the exposed coating in a developer.

8. The process of claim 7 wherein the high-energy radiation is KrF excimer laser of wavelength 248 nm, ArF excimer laser of wavelength 193 nm, electron beam or soft x-ray of wavelength 3 to 15 nm.

9. The process of claim 7 wherein the high-energy radiation is soft x-ray of wavelength 3 to 15 nm.

\* \* \* \* \*